US010285299B2

(12) United States Patent
Lee et al.

(10) Patent No.: US 10,285,299 B2
(45) Date of Patent: May 7, 2019

(54) INTERFACE CONNECTOR DEVICE INCLUDING COMPATIBLE GENDERED CONNECTOR

(71) Applicant: Samsung Electronics Co., Ltd., Gyeonggi-do (KR)

(72) Inventors: Seung-Hoon Lee, Seoul (KR); Sangmin Kim, Gyeonggi-do (KR); Daeyoung Noh, Seoul (KR); Minchang Shim, Seoul (KR); Soonwong Yang, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/631,148

(22) Filed: Jun. 23, 2017

(65) Prior Publication Data

US 2018/0035561 A1     Feb. 1, 2018

(30) Foreign Application Priority Data

Jul. 28, 2016  (KR) .................. 10-2016-0096054

(51) Int. Cl.
*H05K 7/14*        (2006.01)
*G02B 27/01*       (2006.01)
(Continued)

(52) U.S. Cl.
CPC ......... *H05K 7/1465* (2013.01); *G02B 27/017* (2013.01); *G02B 27/0176* (2013.01);
(Continued)

(58) Field of Classification Search
CPC ... H01K 7/1465; G02B 27/017; G02B 27/016
(Continued)

(56) References Cited

U.S. PATENT DOCUMENTS 6,157,291 A * 12/2000 Kuenster ............ G02B 27/0172
345/8
6,369,952 B1 * 4/2002 Rallison ............... G02B 27/017
359/630

(Continued)

FOREIGN PATENT DOCUMENTS

EP      2 990 854 A1      3/2016
KR    10-1148955 B1        5/2012
(Continued)

OTHER PUBLICATIONS

International Search Report dated Sep. 28, 2017.
(Continued)

*Primary Examiner* — Alexander Gilman
(74) *Attorney, Agent, or Firm* — Cha & Reiter, LLC.

(57) ABSTRACT

According to one exemplary embodiment of the present disclosure, there may be provided a head mount device including a housing including a device mounting portion to mount an external electronic device on an upper side of the head mount device, a holder assembly rotatably installed at a periphery of the device mounting portion and comprising a protruding terminal, and at least two gendered connector assemblies each removably attachable to the holder assembly. The at least two gendered connector assemblies each comprising an exposure terminal adapted to be electrically connected to the protruding terminal and a locker to fix each gendered connector assembly to the holder assembly, the each gendered connector assembly has a connector corresponding to a different connection profile, and one gendered connector assembly among the at least two gendered connector assemblies is removably attached to the holder assembly based on the connector of the one gendered connector assembly corresponding to a connector port of the external electronic device mounted to the device mounting (Continued)

portion. Other various exemplary embodiments are also possible.

10 Claims, 34 Drawing Sheets

(51) Int. Cl.
| | |
|---|---|
| *G06F 1/16* | (2006.01) |
| *G06F 3/01* | (2006.01) |
| *H01R 13/26* | (2006.01) |
| *H01R 13/516* | (2006.01) |
| *H04Q 1/14* | (2006.01) |
| *H01R 31/06* | (2006.01) |
| *G06T 19/00* | (2011.01) |
| *H01R 13/627* | (2006.01) |

(52) U.S. Cl.
CPC ............... *G06F 1/16* (2013.01); *G06F 3/011* (2013.01); *G06T 19/00* (2013.01); *H01R 13/26* (2013.01); *H01R 13/516* (2013.01); *H01R 31/06* (2013.01); *H04Q 1/142* (2013.01); *H01R 13/6275* (2013.01)

(58) Field of Classification Search
USPC ........................................................ 439/285
See application file for complete search history.

(56) References Cited

U.S. PATENT DOCUMENTS

| | | | | |
|---|---|---|---|---|
| 8,977,205 B2* | 3/2015 | Tricoukes | ............ | H04R 1/1008 |
| | | | | 345/8 |
| 9,696,553 B2* | 7/2017 | Lyons | ................ | G02B 27/0176 |
| 9,696,797 B2* | 7/2017 | Abdollahi | ............... | G06F 3/012 |
| 9,706,286 B1* | 7/2017 | Patel | ...................... | H04R 1/105 |
| 9,733,482 B2* | 8/2017 | West | ................. | G02B 27/0176 |
| 9,829,711 B2* | 11/2017 | Thurber | ............ | G02B 27/0101 |
| 9,839,166 B2* | 12/2017 | Kim | ................... | H05K 7/20972 |
| 9,875,406 B2* | 1/2018 | Haddick | ............ | G06K 9/00604 |
| 9,880,617 B2* | 1/2018 | Hong | ...................... | G06F 3/013 |
| 9,897,822 B2* | 2/2018 | Osterhout | ............. | G02C 5/143 |
| 2008/0280470 A1 | 11/2008 | Byrne | | |
| 2008/0293271 A1 | 11/2008 | Zhuge | | |
| 2009/0163080 A1 | 6/2009 | Peng | | |
| 2010/0079356 A1* | 4/2010 | Hoellwarth | .......... | G02B 27/017 |
| | | | | 345/8 |
| 2010/0195279 A1* | 8/2010 | Michael | ................ | G06F 1/1632 |
| | | | | 361/679.41 |
| 2012/0021653 A1* | 1/2012 | Chen | .................... | H01R 13/639 |
| | | | | 439/655 |
| 2014/0152531 A1 | 6/2014 | Murray et al. | | |
| 2014/0362445 A1* | 12/2014 | Welker | ................. | G02B 27/017 |
| | | | | 359/630 |
| 2015/0234192 A1* | 8/2015 | Lyons | ................. | G02B 27/0172 |
| | | | | 345/8 |
| 2016/0062125 A1* | 3/2016 | Baek | ................... | G02B 27/0176 |
| | | | | 361/679.01 |
| 2016/0087381 A1* | 3/2016 | Wong | ..................... | H01R 13/73 |
| | | | | 439/529 |
| 2016/0097525 A1* | 4/2016 | Chien | ................... | F21V 33/004 |
| | | | | 362/135 |
| 2016/0098891 A1* | 4/2016 | Eby | ..................... | G07F 17/3216 |
| | | | | 463/16 |
| 2016/0099596 A1* | 4/2016 | Chien | ................... | H02J 7/0052 |
| | | | | 368/10 |
| 2016/0104972 A1* | 4/2016 | Feng | .................. | H01R 13/6581 |
| | | | | 439/607.27 |

FOREIGN PATENT DOCUMENTS

| | | |
|---|---|---|
| WO | 2009/134152 A1 | 11/2009 |
| WO | 2015/183621 A1 | 12/2015 |
| WO | 2016/018205 A1 | 2/2016 |
| WO | 2016/029347 A1 | 3/2016 |

OTHER PUBLICATIONS

European Search Report dated Jan. 30, 2018.
European Search Report dated Sep. 25, 2018.
European Search Report dated Apr. 30, 2018.

\* cited by examiner

INTERFACE CONNECTOR DEVICE INCLUDING COMPATIBLE GENDERED CONNECTOR

CLAIM OF PRIORITY

This application claims the benefit under 35 U.S.C. § 119(a) of a Korean patent application filed in the Korean Intellectual Property Office on Jul. 28, 2016 and assigned Serial No. 10-2016-0096054, the entire disclosure of which is hereby incorporated by reference.

BACKGROUND

1. Field Related to the Present Disclosure

Various exemplary embodiments of the present disclosure relate to an interface connector device including a compatible gendered connector.

2. Description of the Related Art

A portable electronic device may include a display. The display may include a touch sensor. Various results of operations of the electronic device may be output to the display.

Portable electronic devices, such as mobile smartphones, may also be used to work with various peripheral devices. For example, an electronic device may work with a wearable electronic device worn on a user's body. According to one exemplary embodiment, the wearable electronic device may be a watch type wearable electronic device worn on a user's wrist that performs at least some functions of the portable electronic device, such as providing notifications and time to the user. In another embodiment, the portable device may work with a Head Mounted Device (HMD) or the like worn on the user's head and/or face to provide Virtual Reality (VR) or Augmented Reality (AR) to the user. In addition, the HMD may recognize a motion of the user and display content in response to or in association with the recognized motion.

The HMD may accommodate an external electronic device (e.g., a smart phone) in a detachable manner, and there is an effort to improve an effective electrical connection between the HMD and the mounted external electronic device.

SUMMARY

Among body-mounted devices, a Head Mount Device (hereinafter, HMD) may use a display included in the HMD, or may have a structure for mounting an external electronic device (e.g., a smart phone) so that the display of the external electronic device may be used as the display for the HMD. According to one exemplary embodiment, the external electronic device may include an interface connector port for data input/output or for charging. The HMD may have an interface connector corresponding to the interface connector port of the external electronic device. Thus, when the external electronic device is mounted to the HMD, the HMD and the external electronic device may be electrically connected.

However, recently released external electronic devices may have interface connector ports of various connection profiles instead of having a uniform connection profile. For example, although the conventional smart phones use a B-type USB connector port, recently devices have been increasingly equipped with C-type USB connector ports which have higher data transfer rates and are more convenient than B-type USB. For example, C-type USB connectors are reversible. Accordingly, the HMD having the conventional B-type USB connector cannot be connected to external electronic devices equipped with C-type USB connector ports.

According to one exemplary embodiment of the present disclosure, an interface connector device including a compatible gendered connector may be provided.

According to one exemplary embodiment of the present disclosure, an interface connector device including a compatible gendered connector, and an electronic device including the interface connection device may be provided.

According to one exemplary embodiment of the present disclosure, an interface connector device including a compatible gendered connector, and an HMD including the interface connector device may be provided.

According to one exemplary embodiment, there may be provided a head mount device including a housing including a device mounting portion to mount an external electronic device on an upper side of the head mount device, a holder assembly rotatably installed at a periphery of the device mounting portion and comprising a protruding terminal, and at least two gendered connector assemblies each removably attachable to the holder assembly. The at least two gendered connector assemblies each comprising an exposure terminal adapted to be electrically connected to the protruding terminal and a locker to fix each gendered connector assembly to the holder assembly, the each gendered connector assembly has a connector corresponding to a different connection profile, and one gendered connector assembly among the at least two gendered connector assemblies is removably attached to the holder assembly based on the connector of the one gendered connector assembly corresponding to a connector port of the external electronic device mounted to the device mounting portion.

According to one exemplary embodiment, there may be provided a head mount device including a housing including a device mounting portion to mount an external electronic device on an upper side of the head mount device, a holder assembly rotatably installed at a periphery of the device mounting portion, and including a protruding terminal and a locker, and at least two gendered connector assemblies each removably attachable to the holder assembly. The at least two gendered connector assemblies each comprising an exposure terminal adapted to be electrically connected to the protruding terminal, wherein the locker is adapted to fix each gendered connector assembly to the hold assembly, the each gendered connector assembly has a connector corresponding to a different connection profile, and one gendered connector assembly among the at least two gendered connector assemblies is removably attached to the holder assembly based on the connector of the one gendered connector assembly corresponding to a connector port of the external electronic device mounted to the device mounting portion.

According to one exemplary embodiment, there may be provided a head mount device including a housing including a device mounting portion to mount an external electronic device on an upper side of the head mount device, a holder assembly rotatably installed at a periphery of the device mounting portion and comprising a protruding terminal facing a first direction, and at least two gendered connector assemblies each removably attachable to the holder assembly in a second direction orthogonal to the first direction. The at least two gendered connector assemblies each includes an exposure terminal adapted to be electrically connected to the protruding terminal and disposed in a third direction facing the first direction, and a locker to fix each gendered connector assembly to the holder assembly. The each gendered connector assembly has a connector corresponding to a different connection profile, the each gendered connector assembly further includes a gendered housing. The locker includes a locker body received in the gendered housing, a hooking piece extended from the locker body and adapted to protrude from the gendered assembly, and a lever connected to the hooking piece, wherein when a force is applied to the lever causing a movement of the lever, the movement of the lever in turn causes a protrusion or a retraction of the hooking piece. The exposure terminal is disposed in a mounting surface of the each gendered connector assembly, and the mounting surface includes a tapered inclined surface, and one gendered connector assembly among the at least two gendered connector assemblies is removably attached to the holder assembly based on the connector of the one gendered connector assembly corresponding to a connector port of the external electronic device mounted to the device mounting portion.

According to one exemplary embodiment, there may be provided a head mount device including a housing include a device mounting portion to mount an external electronic device on an upper side of the head mount device and a holder assembly rotatably installed at a periphery of the device mounting portion and comprising at least two protruding connectors. Each protruding connector corresponding to a different connection profile and, by a rotation of the holder assembly, one protruding connector among the at least two protruding connectors is selected to be electrically connected to a connector port of the external electronic device mounted to the device mounting portion.

DETAILED DESCRIPTION

Figure 1:
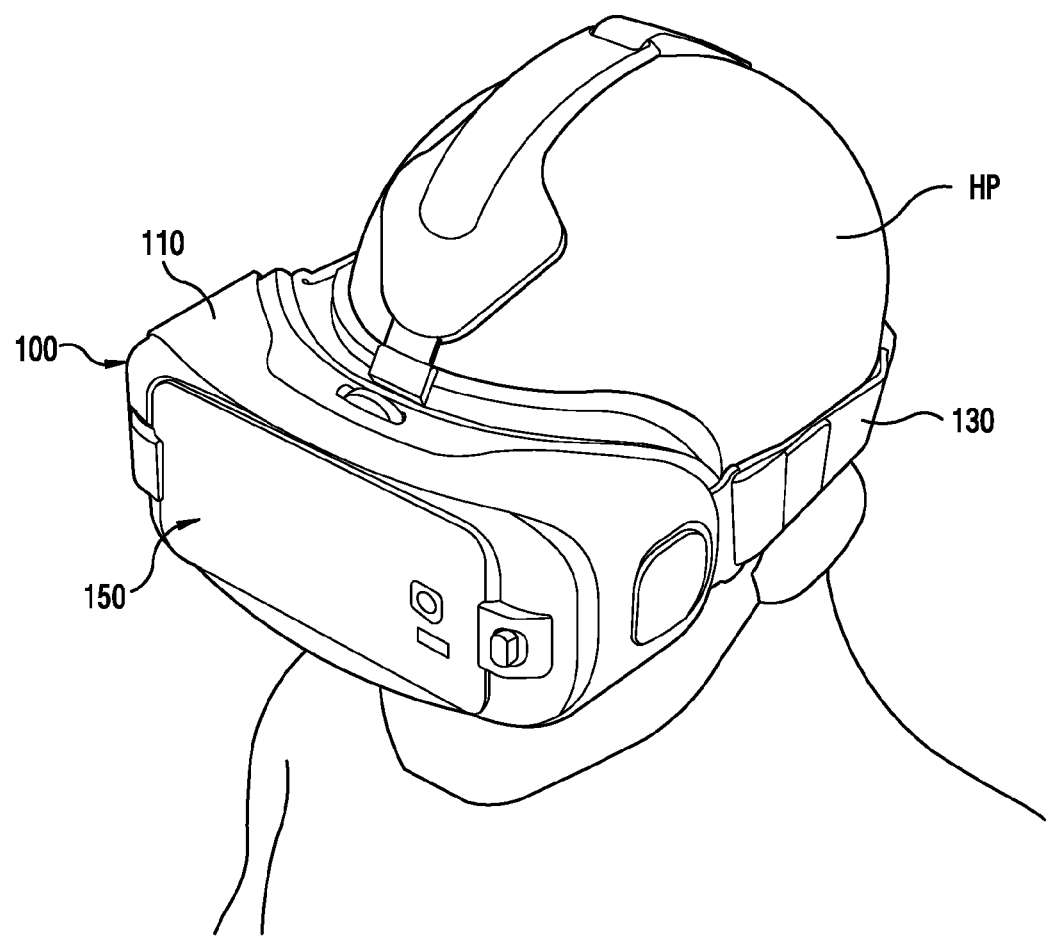
FIG. 1 illustrates a user using a Head Mounted Device (HMD) according to one exemplary embodiment of the present disclosure.

Hereinafter, various exemplary embodiments of the present disclosure are described with reference to the accompanying drawings. It should be understood, however, that it is not intended to limit the various exemplary embodiments of the present disclosure to the particular form disclosed, but, on the contrary, it is intended to cover all modifications, equivalents, and alternatives falling within the spirit and scope of the various exemplary embodiments of the present disclosure. Like reference numerals denote like components throughout the drawings. A singular expression includes a plural concept unless there is a contextually distinctive difference therebetween. In the present disclosure, an expression "A or B," "A and/or B," or the like may include all possible combinations of items enumerated together. Although expressions such as "1st," "2nd," "first," and "second" may be used to express corresponding constitutional elements, it is not intended to limit the corresponding constitutional elements. When a certain (e.g., 1st) constitutional element is mentioned as being "operatively or communicatively coupled with/to" or "connected to" a different (e.g., 2nd) constitutional element, the certain constitutional element is directly coupled with/to another constitutional element or can be coupled with/to the different constitutional element via another (e.g., 3rd) constitutional element.

An expression "configured to" used in the present document may be interchangeably used with, for example, "suitable for," "having the capacity to," "adapted to," "made to," "capable of," or "designed to" in a hardware or software manner according to a situation. In a certain situation, an expressed "a device configured to" may imply that the device is "capable of" together with other devices or components. For example, "a processor configured to perform A, B, and C" may imply a dedicated processor (e.g., an embedded processor) for performing a corresponding operation or a generic-purpose processor (e.g., Central Processing Unit (CPU) or an application processor) capable of performing corresponding operations by executing one or more software programs stored in a memory device.

An electronic device according to various exemplary embodiments of the present disclosure may include, for example, at least one of a smart phone, a tablet Personal Computer (PC), a mobile phone, a video phone, an e-book reader, a desktop PC, a laptop PC, a netbook computer, a workstation, a server, a Personal Digital Assistant (PDA), a Portable Multimedia Player (PMP), a MPEG-1 Audio Layer 3 (MP3) player, a mobile medical device, a camera, and a wearable device. The wearable device may include at least one of an accessory-type device (e.g., a watch, a ring, a bracelet, an anklet, a necklace, glasses, contact lenses, or a Head-Mounted Device (HMD)), a fabric- or clothes-integrated device (e.g., electronic clothes), a body attaching-type device (e.g., a skin pad or tattoo), or a body implantable device (e.g., an implantable circuit). According to certain exemplary embodiments, the electronic device may include, for example, at least one of a Television (TV), a Digital Video Disk (DVD) player, an audio player, a refrigerator, an air conditioner, a cleaner, an oven, a microwave oven, a washing machine, an air purifier, a set-top box, a home automation control panel, a security control panel, a TV box (e.g., Samsung HomeSync™, Apple TV™, or Google TV™), a game console (e.g., Xbox™, PlayStation™), an electronic dictionary, an electronic key, a camcorder, and an electronic picture frame.

According to other exemplary embodiments, the electronic device may include at least one of various medical devices (e.g., various portable medical measuring devices (e.g., a blood sugar measuring device, a hear rate measuring device, a blood pressure measuring device, a body temperature measuring device, etc.), Magnetic Resonance Angiography (MRA), Magnetic Resonance Imaging (MRI), Computed Tomography (CT), imaging equipment, ultrasonic instrument, etc.)), a navigation device, a Global Positioning System (GPS) receiver, an Event Data Recorder (EDR), a Flight Data Recorder (FDR), a car infotainment device, an electronic equipment for ship (e.g., a vessel navigation device, a gyro compass, etc.), avionics, a security device, a car head unit, an industrial or domestic robot, a drone, an Automatic Teller's Machine (ATM) of financial institutions, Point Of Sales (POS) of shops, and internet of things (e.g., a light bulb, various sensors, an electric or gas meter, a sprinkler device, a fire alarm, a thermostat, a streetlamp, a toaster, a fitness equipment, a hot water tank, a heater, a boiler, etc.). According to certain exemplary embodiments, the electronic device may include at least one of one part of furniture, buildings/constructions or cars, an electronic board, an electronic signature receiving device, a projector, and various measurement machines (e.g., water supply, electricity, gas, propagation measurement machine, etc.). The electronic device according to various exemplary may be flexible, or may be a combination of two or more of the aforementioned various devices. The electronic device according to an exemplary embodiment of the present document is not limited to the aforementioned devices. The term 'user' used in the present document may refer to a person who uses the electronic device or a device (e.g., an Artificial Intelligence (AI) electronic device) which uses the electronic device.

Although a body-mounted electronic device is an electronic device and a Head Mounted Device (HMD) as illustrated and described as an example thereof according to an exemplary embodiment of the present disclosure, the present disclosure is not limited thereto. For example, it is apparent that the various exemplary embodiments of the present disclosure are applicable to the various electronic devices to which a plurality of gendered connector assemblies including connectors having different connection profiles can be compatibly applied.

FIG. 1 illustrates a user using a Head Mounted Device (HMD) according to one exemplary embodiment of the present disclosure.

Referring to FIG. 1, an HMD 100 may include a housing 110 to be worn on the front side of the Head Portion (HP) of a human body (i.e. on the user's face). The HMD 100 may include at least one strap 130 connected from one end of the housing 110 to the other end. According to one exemplary embodiment, the HMD may accommodate an external electronic device 150 (e.g., a smart phone), and the user may view a variety of content via a display provided in the external electronic device 150. Alternatively, the HMD may include its own display fixed in the housing 110.

According to one exemplary embodiment, the HMD 100 may also include transparent/translucent lenses which can be mounted to the housing 110. For example, according to one exemplary embodiment, a lens assembly (not shown) may be disposed between the display and eyes of the user.

According to one exemplary embodiment, the HMD 100 may form a view port in reality or in a virtual environment, and may output augmented reality data or virtual reality data in the view port via the display provided in the HMD.

According to one exemplary embodiment, the HMD 100 may provide a see-through function for providing augmented reality or a function for virtual reality. By using the see-though function, the HMD 100 may visually provide the user with virtual information while also displaying images of the user's real environment via the display or the transparent/translucent lens. According to one exemplary embodiment, the HMD 100 may provide the user with additional information and/or images regarding objects in the user's actual environment. According to one exemplary embodiment, the HMD 100 may also provide additional information to the user by using holograms or the like without having to use the display or the lens. According to another exemplary embodiment, by using the virtual reality function, the HMD 100 may be configured such that the user can see VR content (e.g., games, movies, streaming, broadcasting, etc.) provided via the display. The HMD 100 may provide the user with a feeling of immersion by displaying images that change according to the user's head movement.

According to one exemplary embodiment of the present disclosure, the HMD 100 may include an interface connector device having a compatible gendered connector assembly for electrically connecting to the external electronic device. According to one exemplary embodiment, the HMD 100 may be connected to the external electronic device by a selected gendered connector assembly having a connector whose connection profile is compatible with that of the external electronic device mounted to the HMD.

Figure 2A:
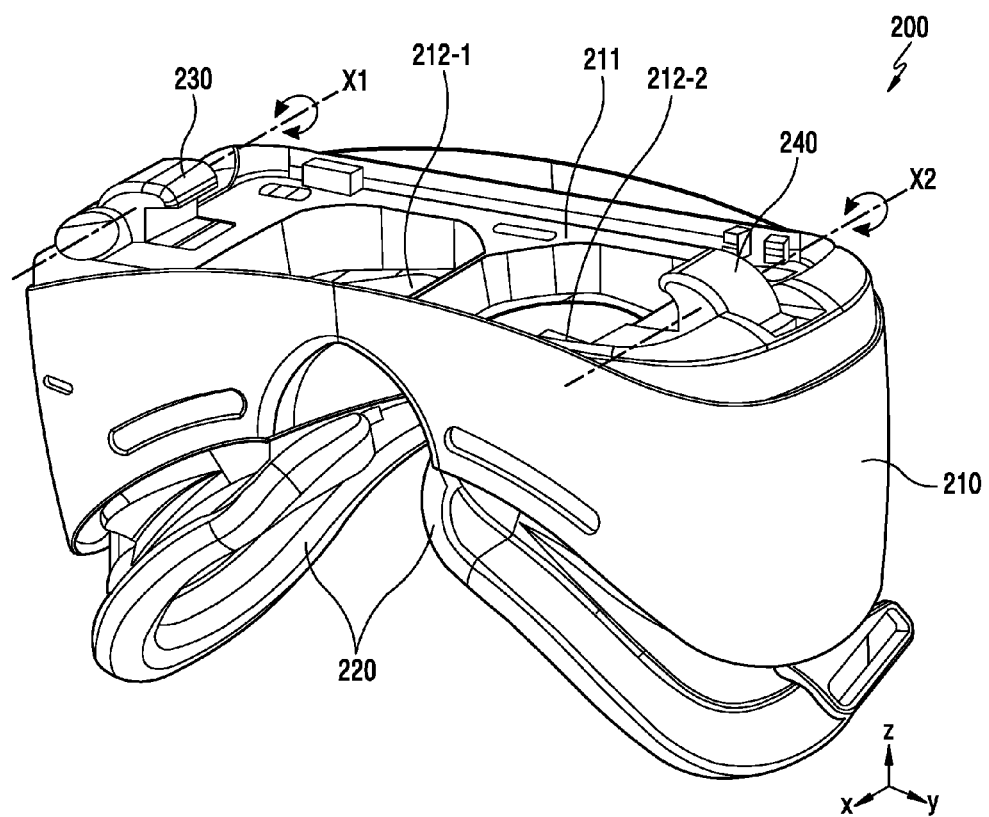
FIG. 2A and FIG. 2B illustrate the structure of an HMD according to one exemplary embodiment of the present disclosure.
Figure 2B:
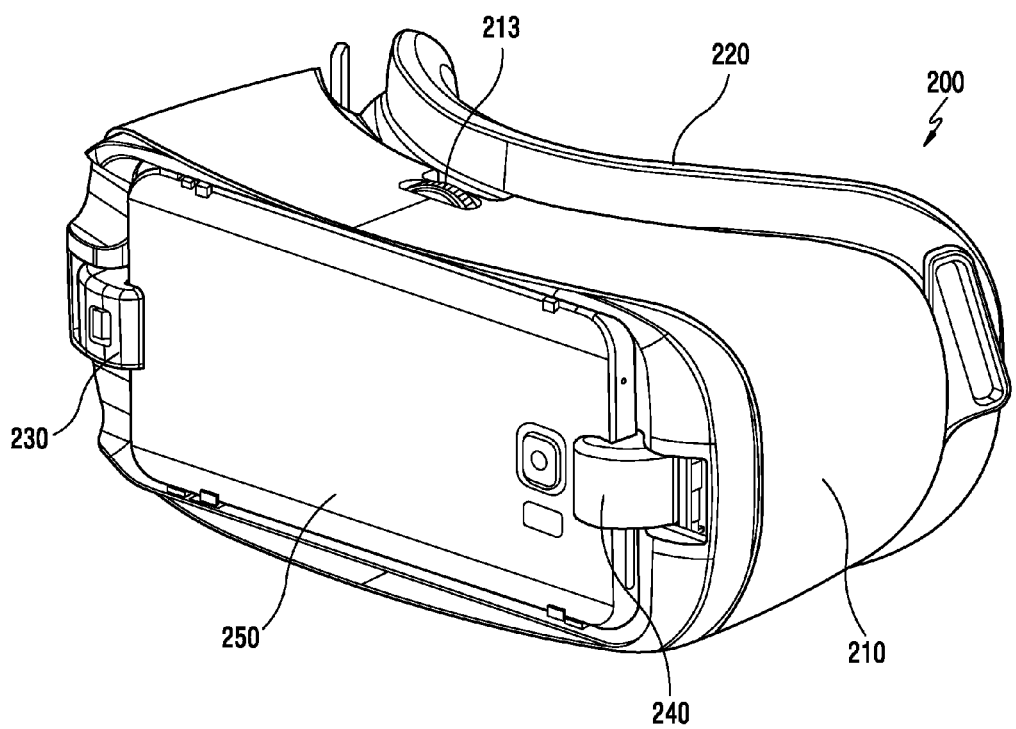

FIG. 2A and FIG. 2B illustrate the structure of an HMD according to one exemplary embodiment of the present disclosure.

An HMD 200 of FIG. 2A and FIG. 2B may be similar to the HMD 100 of FIG. 1, or may be another example of the HMD.

Referring to FIG. 2A and FIG. 2B, the HMD 200 may include a housing 210 for accommodating an external electronic device 250, and a strap (not shown) for fixing the HMD 200 to the head of the user.

According to one exemplary embodiment, the housing 210 may include a device mounting portion 211 for accommodating the external electronic device 250 (e.g., an electronic device including a display) in the front side of the HMD 200. According to one exemplary embodiment, one pair of optical lens units 212-1 and 212-2 may be disposed in the device mounting portion 211 of the housing 210. According to one exemplary embodiment, the optical lens units 212-1 and 212-2 may include optical lenses of various magnifications, and the user of the HMD 200 may view images displayed on the display of the external electronic device 250 via the optical lens units 212-1 and 212-2. According to one exemplary embodiment, a focus adjustment knob 213 may be disposed as protruding from the upper portion of the housing 210 so as to facilitate manipulation by the user, and focus of the images displayed on the display of the external electronic device 250 may be adjusted by the user via the focus adjustment knob 213. According to one exemplary embodiment, the focus adjustment knob 213 may be mechanically rotatable. However, the present disclosure is not limited thereto, and thus various adjustment mechanisms may be used.

According to one exemplary embodiment, a rear side of the housing 210 may include a body mount portion 220 for mounting the HMD 200 to the user's face. According to one exemplary embodiment, the body mount portion 220 may be made of a flexible material that adapts to different facial shapes. According to one exemplary embodiment, the body mount portion 220 may use an elastic material such as rubber, silicone, urethane, or the like, which are harmless to the human body.

According to one exemplary embodiment, although not shown, a lateral side of the housing 210 (e.g. the lateral surface on the left or right side of the housing 210) may include a touch panel to be used as an input means. According to one exemplary embodiment, the user may perform various functions such as adjusting positions of objects displayed on the display of the external electronic device 250, adjusting image size, or the like by entering inputs into the touch panel. However, the present disclosure is not limited thereto, and thus for example at least one physical manipulation button may be replaced or added in addition to the touch panel.

According to one exemplary embodiment, the device mounting portion 211 may be formed in a shape of a recess capable of accommodating the external electronic device 250. According to one exemplary embodiment, the device mounting portion 211 may accommodate the external electronic device 250 in such a manner that the display of the external electronic device 250 faces the optical lens units 212-1 and 212-2. According to one exemplary embodiment, when the external electronic device 250 is mounted to the device mounting portion 211, the device mounting portion 211 may accommodate the external electronic device 250 in various manners. For example, the rear side of the external electronic device 250 may protrude from the housing 210. Or the rear side of the external electronic device 250 may be flush with the exterior of the housing 210.

Figure 4A:
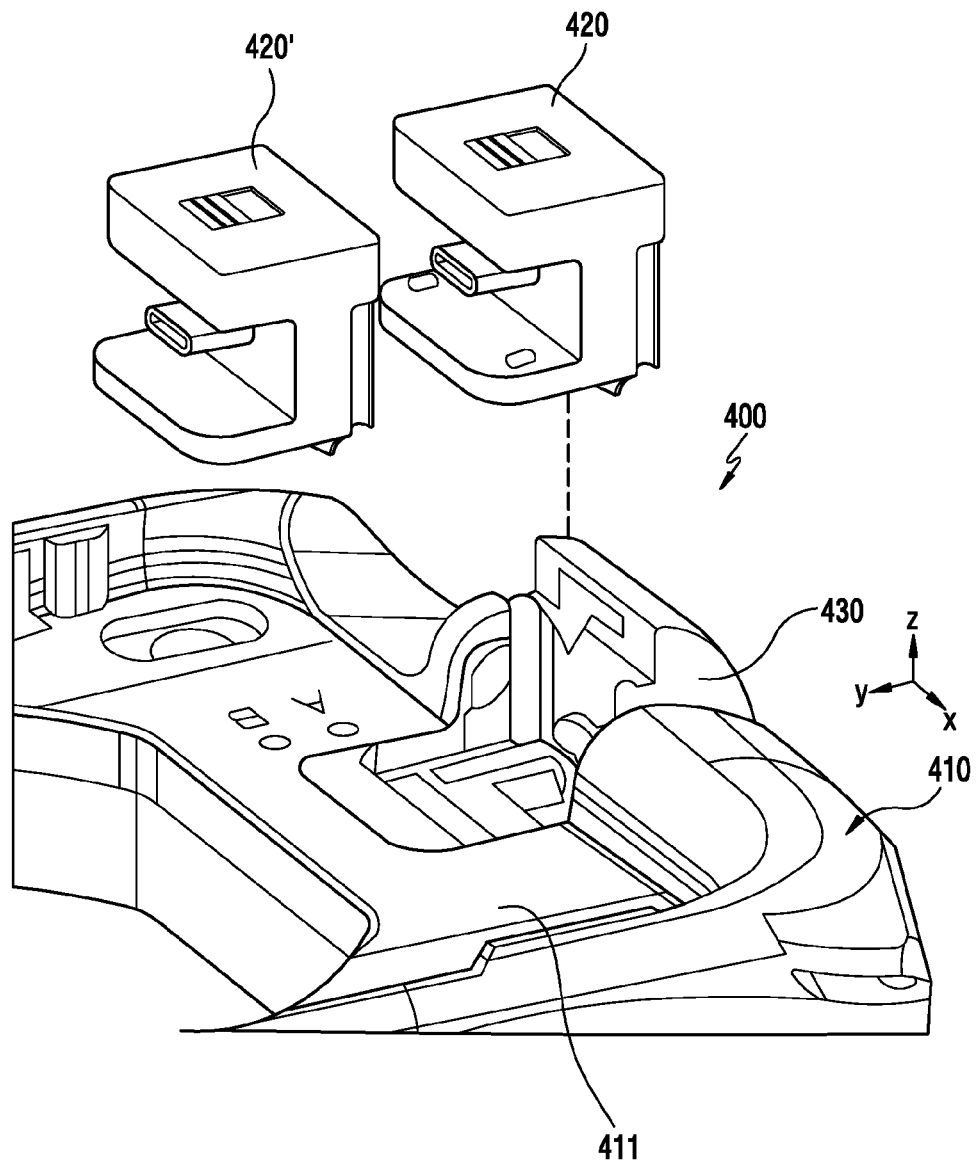
FIG. 4A and FIG. 4B illustrate an interface connector device to which a compatible gendered connector assembly can be attached in an HMD according to one exemplary embodiment of the present disclosure.

According to one exemplary embodiment, the HMD 200 may include a fixing device capable of fixing the external electronic device 250 accommodated in the device mounting portion 211. According to one exemplary embodiment, the fixing device may include an interface connector device 230 installed at one side of the device mounting portion 211 and which is rotatable about the X1 axis as a rotation axis. The fixing device may also include a support holder 240 installed at the other end of the device mounting portion 211 and which is rotatable about the X2 axis as a rotation axis. According to one exemplary embodiment, the interface connector device 230 may support one end of the external electronic device 250, and the support holder 240 may support the other end of the external electronic device 250. According to one exemplary embodiment, the interface connector device 230 may include a connector which can be inserted into an interface connector port provided in the external electronic device 250. According to one exemplary embodiment, the interface connector device 230 and the support holder 240 may respectively rotate about the X1 axis and the X2 axis, but may additionally have elements that provide an interrupt force for stopping rotation at a specific rotation angle and a restoring force for restoring to the original position before the rotation. According to one exemplary embodiment, the interface connector device 230 and the support holder 240 may be disposed not only in a rotatable manner but also in a slidable manner in a horizontal direction orthogonal to the X1 and X2 axes (e.g. a Y axis direction, as shown in FIG. 4A). According to one exemplary embodiment, a distance limiting force for limiting a sliding distance and a restoring force for restoring to an original position before sliding may also be provided when the interface connector device 230 and the support holder 240 can slide. According to one exemplary embodiment, the interface connector device 230 may simultaneously perform a connection function for facilitating an electrical connection with the external electronic device 250 and a support function for supporting one end of the external electronic device 250. According to one exemplary embodiment, a connector of the interface connector device 230 is first inserted into an interface connector port of the external electronic device 250, and thereafter the external electronic device 250 may be fixed to the device mounting portion 211 when the other end of the external electronic device 250 is supported by the support holder 240. In this case, the aforementioned rotational force, rotational angle interrupting force, distance limiting force, or restoring force may be appropriately applied.

According to one exemplary embodiment, the interface connector device 230 may include a compatible gendered connector assembly for electrically connecting to the external electronic device 250 with a compatible connection profile. According to one exemplary embodiment, a plurality of gendered connector assemblies may be inserted into the interface connector device 230, each gendered connector assembly has a connector of a different connection profile. Depending on the connection profile used by the external electronic device 250, a suitable gendered connector assembly may be used.

Figure 3:
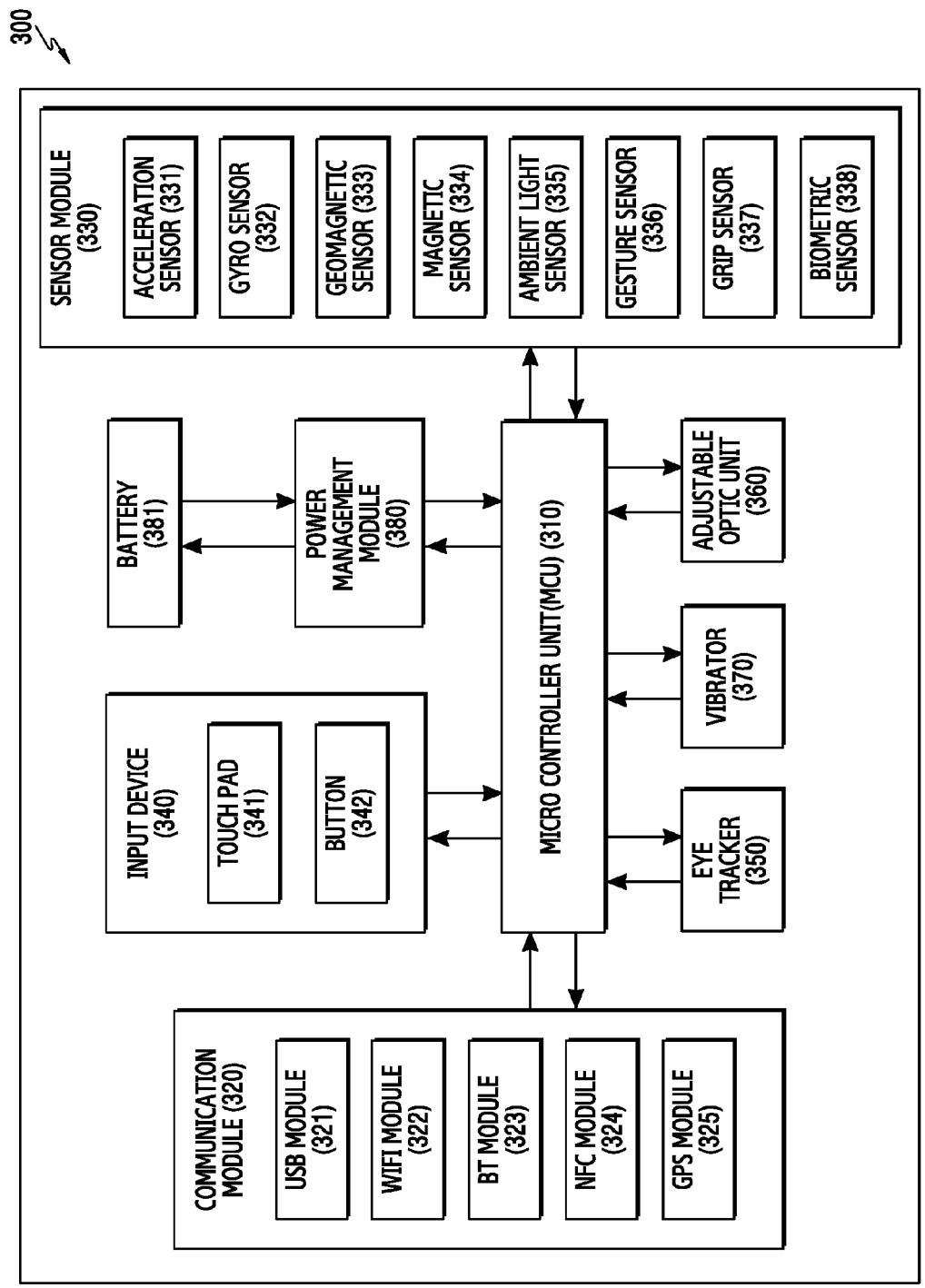
FIG. 3 is a block diagram illustrating the structure of an HMD according to one exemplary embodiment of the present disclosure.

FIG. 3 is a block diagram illustrating the structure of an HMD according to one exemplary embodiment of the present disclosure.

An HMD 300 of FIG. 3 may be similar to the HMD 100 of FIG. 1 and the HMD 200 of FIG. 2A and FIG. 2B, or may be another example of the HMD.

Referring to FIG. 3, the HMD 300 may include a Micro Controller Unit (MCU) 310, a communication unit (or a communication module) 320, a sensor unit (or a sensor module) 330, an input unit (or an input device) 340, a power supply device (a power management module 380 and a battery 381), an eye tracking unit (or an eye tracker) 350, a motor (or a vibrator) 370, and an adjustable optic unit (or a lens assembly) 360.

The MCU 310 may include, for example, a processor, and may drive an Operating System (OS) or an embedded SoftWare (S/W) program to control a plurality of hardware constitutional elements connected to the MCU 310. The MCU 310 may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc.

The communication unit 320 may perform data transmission/reception by electrically connecting a housing of the HMD 300 and an external electronic device (e.g., a smart phone) through wired and/or wireless communication. According to one exemplary embodiment, the communication unit 320 may include a USB module 321, a WiFi module 322, a BT module 323, an NFC module 324, and/or a GPS module 325. According to one exemplary embodiment, at least one (e.g., two or more) of the WiFi module 322, the WiFi module 322, the BT module 323, the NFC module 324, and the GPS module 325 may be included in one Integrated Chip (IC) or IC package. According to one exemplary embodiment, the USB module 321 may be electrically connected to compatible genders of the aforementioned interface connector device (e.g., 230 of FIG. 2E). According to one exemplary embodiment, the compatible genders may include a gendered connector assembly including a B-type USB connector or a gendered connector assembly including a C-type USB connector.

The sensor unit 330 may measure physical quantity or detect an operating state of the HMD 300, and thus may convert measured or detected information into an electric signal. The sensor unit 330 may include, for example, at least one of an acceleration sensor 331, a gyro sensor 332, a geomagnetic sensor 333, a magnetic sensor 334, an ambient light sensor (e.g., a proximity sensor) 335, a gesture sensor 336, a grip sensor 337, and a biometric sensor 338. The acceleration sensor 331, the gyro sensor 332, or the geomagnetic sensor 333 may be used to detect a head movement of a user who wears the HMD 300. The ambient light sensor 335 or the grip sensor 337 may be used to detect whether the HMD 300 is worn. According to one exemplary embodiment, at least one constitutional element of the sensor unit 330 may be included in a detachable external electronic device.

According to one exemplary embodiment, the sensor unit 330 may detect a wearing state of the user by detecting at least one of Infrared (IR) recognition, pressure recognition, or a capacitance (or permittivity) variation on the basis of the wearing state of the user. The gesture sensor 336 may detect a movement of a user's hand or finger and may accept this as an input operation of the HMD 300. Additionally or alternatively, the sensor unit 330 may recognize biometric information of the user by using a biometric sensor, for example, an e-nose sensor, an ElectroMyoGraphy (EMG) sensor, an ElectroEncephaloGram (EEG) sensor, an ElectroCardioGram (ECG) sensor, an iris sensor, or the like. The sensor unit 330 may further include a control circuit for controlling at least one sensor included therein.

The input unit 340 may include a touch pad 341 or a button 342. The touch pad 341 may recognize a touch input by using at least one of an electrostatic type, pressure-sensitive type, an infrared type, and an ultrasonic type. In addition, the touch pad 341 may further include a control circuit. In case of using the electrostatic type, for example, physical contact or proximity recognition may be possible. The touch pad 341 may further include a tactile layer. In this case, the touch pad 341 may provide a tactile response to the user. The button 342 may include, for example, a physical button, an optical key, or a keypad.

The eye tracker 350 may track a user's gaze by using at least one of Electrical OculoGraphy (EOG) sensors, coil systems, dual purkinje systems, bright pupil systems, and dark pupil systems. In addition, the eye tracker 350 may further include a micro camera for eye tracking.

The adjustable optic unit 360 may measure an Inter-Pupil Distance (IPD) of the user and adjust a distance of the lens and a position between the lens and the display so that the user can enjoy an image suitable for an eye sight of the user.

The power management module 380 may manage, for example, power of the HMD 300. According to one exemplary embodiment, the power management module 380 may include a Power Management Integrated Circuit (PMIC), a charger Integrated Circuit (IC), or a battery or fuel gauge. The PMIC may have a wired charging type and/or a wireless charging type. The wireless charging type may include, for example, a magnetic resonance type, a magnetic induction type, and an electromagnetic type, and may further include an additional circuit for wireless charging, for example, a coil loop, a resonant circuit, a rectifier, or the like. The battery gauge may measure, for example, remaining capacity of the battery 381 and a voltage, current, or temperature during charging. The battery 381 may include, for example, a rechargeable battery and/or a solar battery.

Figure 4B:
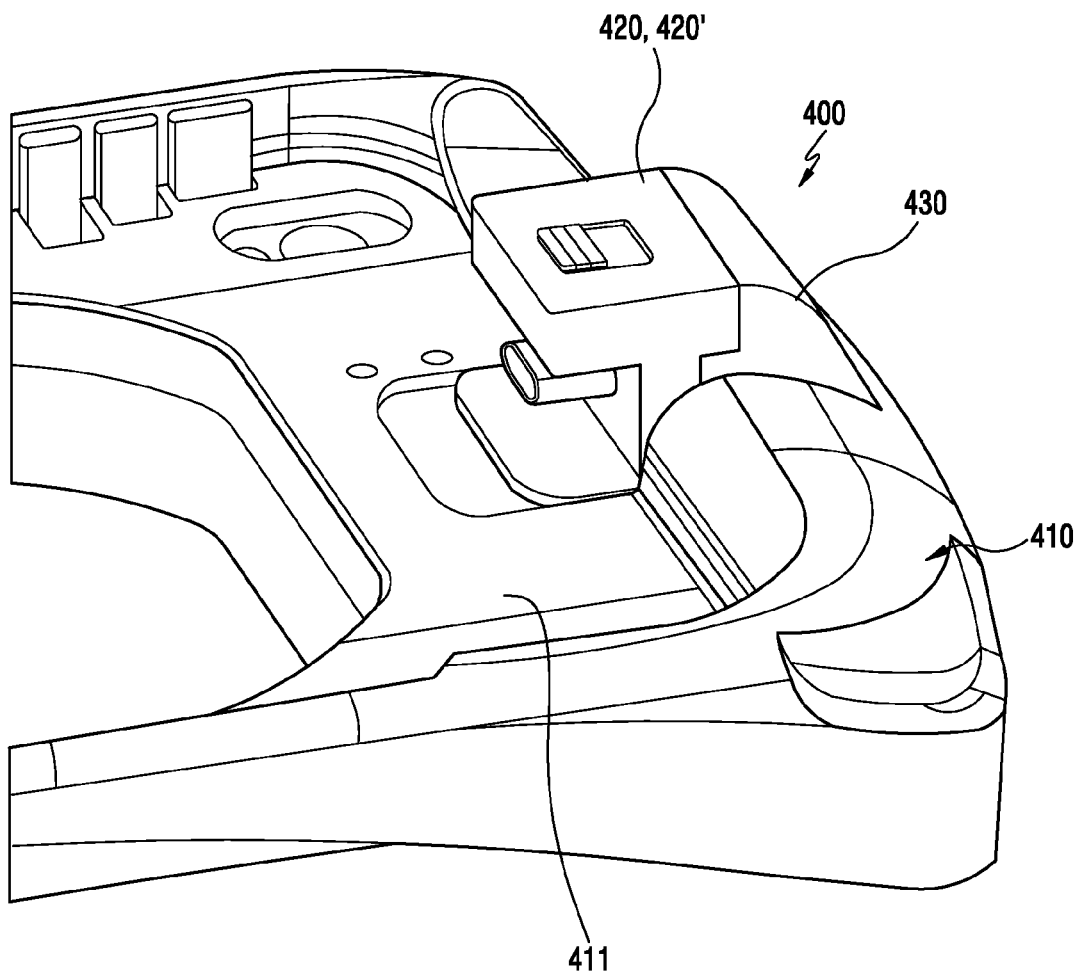

FIG. 4A and FIG. 4B illustrate an interface connector device to which a compatible gendered connector assembly can be attached in an HMD according to one exemplary embodiment of the present disclosure.

An interface connector device 400 of FIG. 4A and FIG. 4B may be similar to the interface connector device 230 of FIG. 2A and FIG. 2B, or may be another example of the interface connector device.

Referring to FIG. 4A and FIG. 4B, the interface connector device 400 may include a holder assembly 430 fixed to a housing 410 of the HMD, and at least one gendered connector assembly 420 or 420' including connectors having different connection profiles. The connector assemblies are denoted as gendered because, as shown, the included connectors are male. The gendered connector assemblies 420 and 420' are removably attachable to the holder assembly 430. According to one exemplary embodiment, the holder assembly 430 may be disposed at one end of a device mounting portion 411 of the housing 410. According to one exemplary embodiment, when assembled to the housing 410, the holder assembly 430 may rotate by a specific angle about an X axis as a rotation axis (as shown in FIG. 2A) in order to receive the external electronic device, and may provide a restoring force for restoring to the original position, where in the original position, the holder assembly 430 can be used to secure the external electronic device. According to one exemplary embodiment, in addition to the aforementioned operation, when assembled to the housing 401, the holder assembly 430 may be slide in the Y axis/−Y axis direction in order to receive the external electronic device, and may provide a restoring force for restoring to the original position after sliding to secure the external electronic device.

According to one exemplary embodiment, at least one of the gendered connector assemblies 420 and 420' may be detachable from the holder assembly 430 in a Z/−Z axis direction. When the gendered connector assemblies 420 and 420' are mounted to the holder assembly 430, an exposure terminal which is exposed to the exterior of the gendered connector assemblies 420 and 420' may be electrically connected to a protruding terminal (not shown) exposed in a corresponding outer surface of the holder assembly 430. For example, the exposure terminal and the protruding terminal may be electrically connected by being physically coupled or connected. According to one exemplary embodiment, the gendered connector assemblies 420 and 420' may include, for example, the first gendered connector assembly 420 and the second gendered connector assembly 420'. According to one exemplary embodiment, the first gendered connector assembly 420 may include a male B-type USB connector. According to one exemplary embodiment, the second gendered connector assembly 420' may include a male C-type USB connector. According to one exemplary embodiment, if an external electronic device mounted to the device mounting portion 411 of the housing 410 includes the B-type USB connector port, the first gendered connector assembly 420 may be mounted to the holder assembly 430. When an external electronic device with C-type USB needs to be inserted into the HMD instead, the first gendered connector assembly 420 may be removed from the holder assembly 430, and may be replaced with the second gendered connector assembly 420.

Figure 5A:
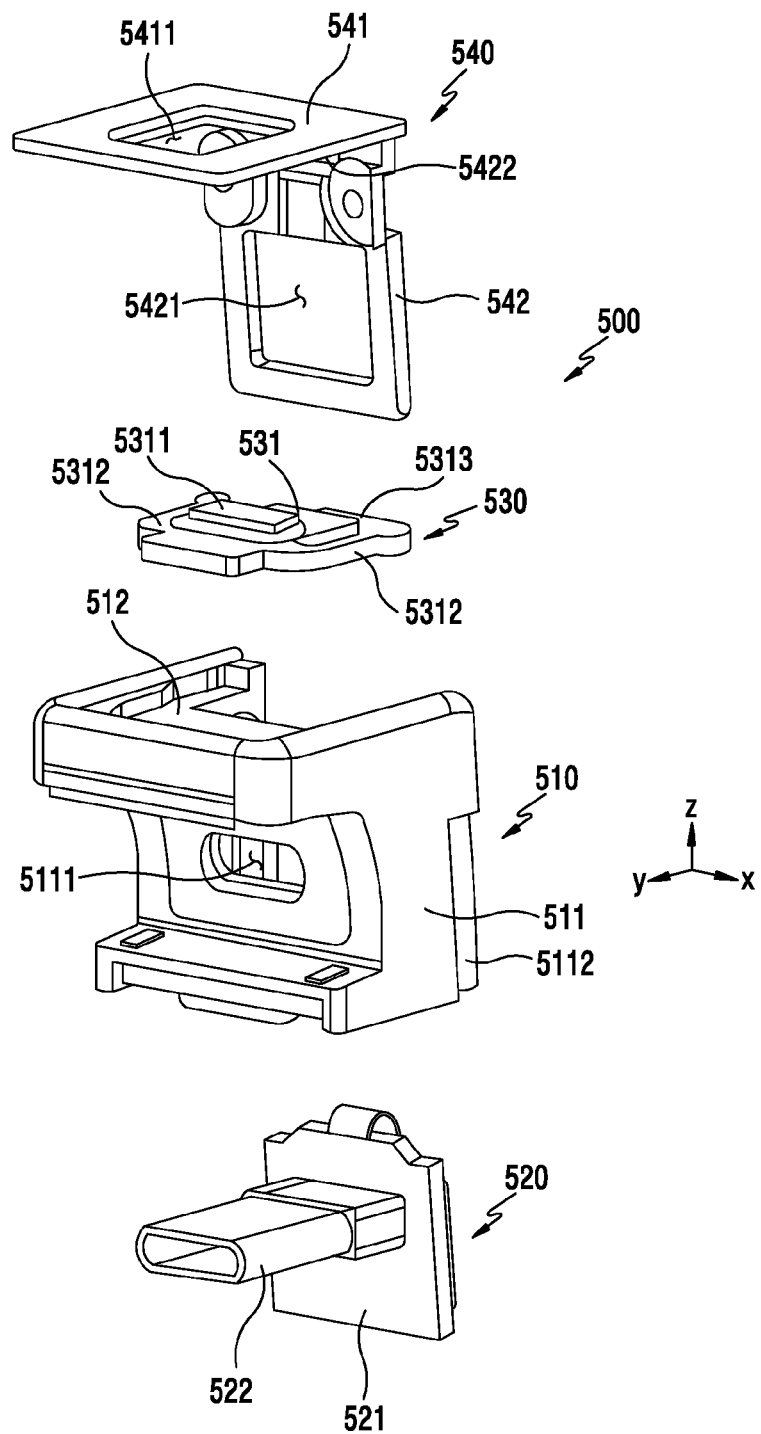
FIG. 5A is an exploded perspective view of a gendered connector assembly according to one exemplary embodiment of the present disclosure.

FIG. 5A is an exploded perspective view of a gendered connector assembly according to one exemplary embodiment of the present disclosure.

The gendered connector assembly of FIG. 5A may be similar to the gendered connector assembly 420 or 420' of FIG. 4A, or may be another example of the gendered connector assembly.

Referring to FIG. 5A, a gendered connector assembly 500 may include a gendered housing 510, a connector member 520 accommodated in the gendered housing 510, a locker 530 slidably disposed in the gendered housing 510, and a gendered cover 540 coupled to the gendered housing 510 to lock the locker 530.

According to one exemplary embodiment, the gendered housing 510 may include a gendered housing body 511 having an inner space, and a locker mounting portion 512 formed on an upper portion thereof to slidably receive the locker 530. According to one exemplary embodiment, the gendered housing body 511 may include a connector protrusion hole 5111 formed on a front side thereof to receive the connector 522 of the connector member 520 when the connector member 520 is assembled with the gendered housing body 511. According to one exemplary embodiment, left and right sides of the rear side of the gendered housing body 511 may include a pair of guide ribs 5112 formed along a mounting direction (e.g., a −Z axis direction) of the gendered connector assembly 500.

According to one exemplary embodiment, the connector member 520 may include the connector 522 installed such that, when installed in the gendered housing body 511, at least a portion of the connector 522 protrudes from the connector protrusion hole 5111 of the gendered housing body 511. In addition, the exposure terminal (523 of FIG. 7B) located at the rear of the terminal support piece 521 is also exposed. According to one exemplary embodiment, the connector 522 and exposure terminal 523 are electrically connected. According to one exemplary embodiment, the connector 522 may include a connector of a particular connection profile among various connection profiles (e.g., a B-type USB connection profile or a C-type USB connection profile).

According to one exemplary embodiment, the locker 530 may include a locker body 531, a lever 5311 protruding from an upper portion of the locker body 531, and a hooking piece 5313 extended from one side of the locker body 531 and slidably received by the gendered cover 540. According to one exemplary embodiment, the locker body 531 may include one pair of tension ribs 5312 formed at the left and right sides of the locker body 531. As shown in FIG. 5A, in one embodiment the locker body 531 may be a plate-type locker body. According to one exemplary embodiment, when the locker 530 is inserted into the gendered housing body 511, the tension ribs 5312 provides a constant force locking the locker 530 in place due to the deformation of the tension ribs 5312 caused by the gendered housing body 511.

According to one exemplary embodiment, the gendered cover 540 may include a first plate 541 adapted to be fixed to an upper portion of the gendered housing body 511 and a second plate 542 extending from the first plate 541 at a specific angle. The second plate 542 is adapted to be fixed to a rear side of the gendered housing body 511. According to one exemplary embodiment, the first plate 541 may include a lever protrusion hole 5411 in the shape of the lever 5311 of the locker 530. The lever protrusion hole 5411 receives the lever 5311. According to one exemplary embodiment, the lever protrusion hole 5411 may not only guide a sliding motion of the locker 530 but also prevent detachment of the locker 530 from the gendered housing body 511. According to one exemplary embodiment, the second plate 542 may keep the terminal support piece 521 in place in the gendered housing body 511. According to one exemplary embodiment, the second plate 542 may include a terminal exposure hole 5421 for exposing the exposure terminal 523 of the terminal support piece 521. According to one exemplary embodiment, the first plate 541 may include a hooking piece protrusion hole 5422 for receiving a hooking groove (e.g., 634 of FIG. 6) of a holder assembly (e.g., 600 of FIG. 6) to be described later, after the hooking piece 5313 of the locker 530 passes through the upper portion of the terminal exposure hole 5421.

According to one exemplary embodiment, the gendered connector assembly 500 may be assembled in such a manner that the connector 522 protrudes through the connector protrusion hole 5111. Further, the locker 530 is mounted to the locker mounting portion 512, and thereafter the gendered cover 540 is assembled to the gendered housing 510. In this case, the gendered housing 510 and the gendered cover 540 may be assembled by at least one screw. However, the present disclosure is not limited thereto, and thus the gendered housing 510 and the gendered cover 540 may be assembled by processes such as ultrasonic welding, taping, bonding, or the like.

Figure 5B:
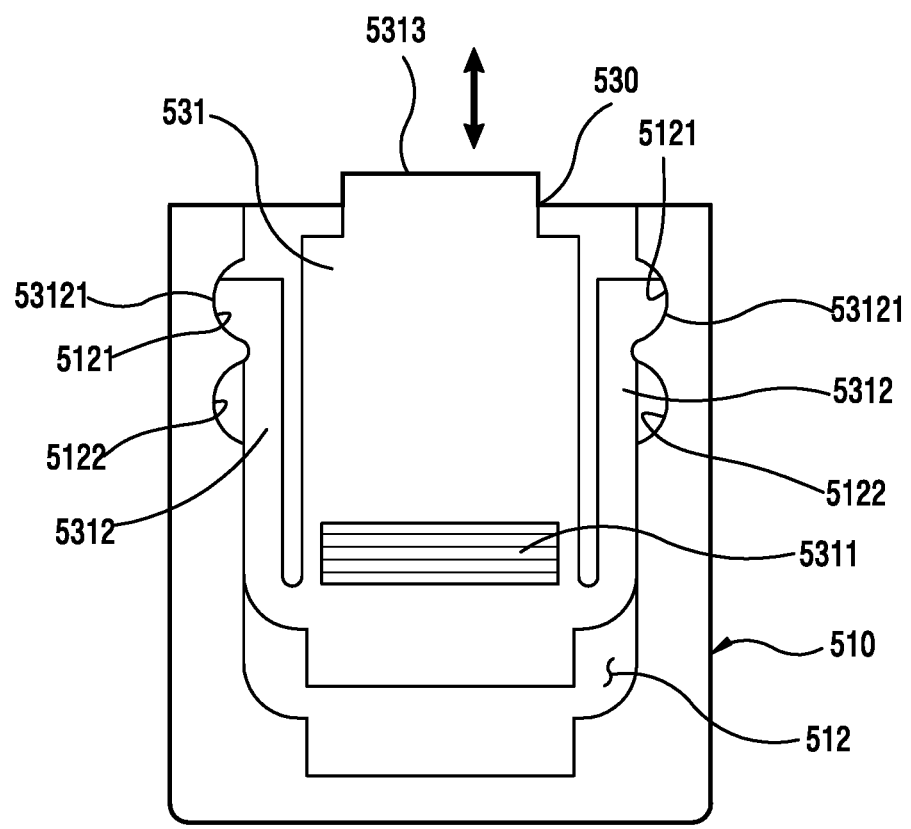
FIG. 5B illustrates when a locker is assembled in the gendered housing body of FIG. 5A according to one exemplary embodiment of the present disclosure.

FIG. 5B illustrates when a locker is assembled in the gendered housing body of FIG. 5A according to one exemplary embodiment of the present disclosure.

Referring to FIG. 5B, the locker 530 may be mounted to the locker mounting portion 512 of the gendered housing 510. According to one exemplary embodiment, the diverging tension rib 5312 may be formed at both sides of the locker body 531, and hooking protrusions 53121 may be formed at the ends of the tension rib 5312. According to one exemplary embodiment, the locker body 531 may be formed with the hooking piece 5313 which extends farther than the edge of the locker mounting portion 512. According to one exemplary embodiment, two pair of hooking grooves 5121 and 5122 may be formed at ends of the locker mounting portion 512 to receive the hooking protrusions 53121. According to one exemplary embodiment, the two pair of the hooking grooves 5121 and 5122 may include the first pair of hooking groove 5121 formed at a position corresponding to the hooking protrusion 53121 of the tension rib 5312 when the gendered connector assembly 500 is mounted to a holder assembly (e.g., 600 of FIG. 6) by the locker 530 through a manipulation of the lever 5311, and the second pair of hooking groove 5122 is formed at a position corresponding to the hooking protrusion 53121 of the tension rib 5312 when the gendered connector assembly 500 is released from the holder assembly (e.g., 600 of FIG. 6) by the locker 530 through a manipulation of the lever 5311. According to one exemplary embodiment, the locker 530 can be prevented from randomly sliding due to an elastic force of the tension rib 5312 when received in the hooking grooves 5121 and 5122.

Figure 6:
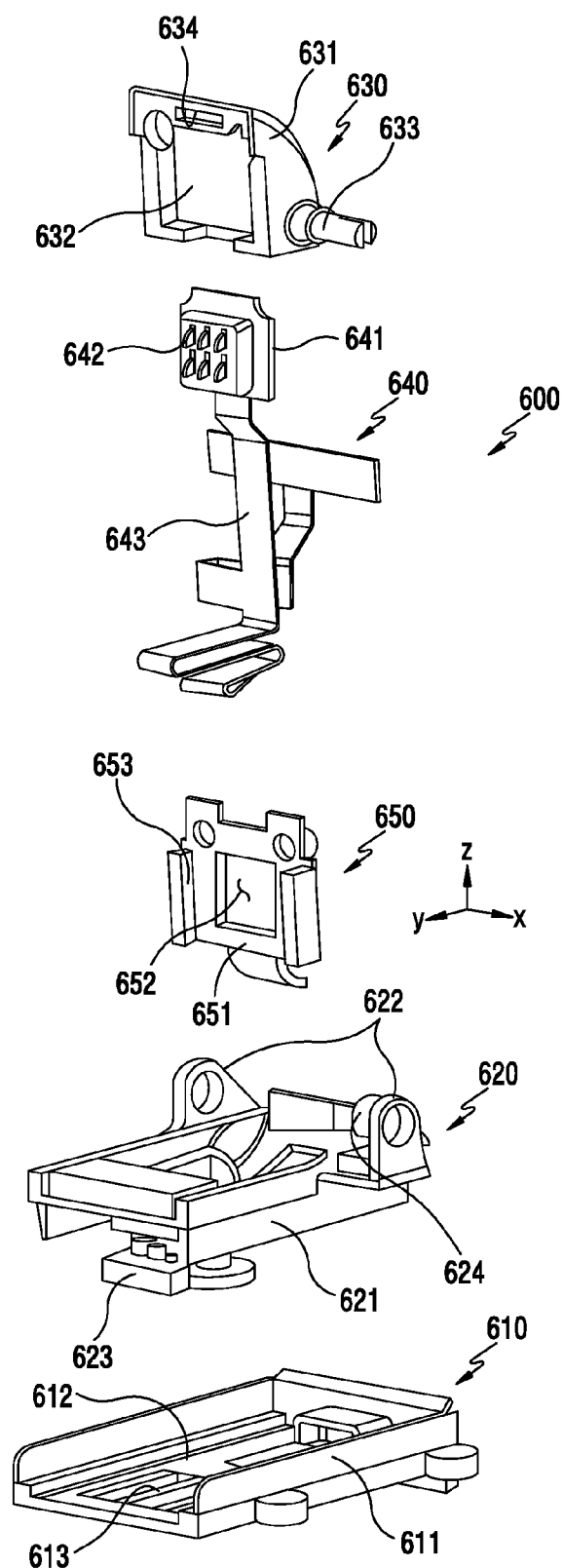
FIG. 6 is an exploded perspective view of a holder assembly to which the gendered connector assembly of FIG. 5A is coupled according to one exemplary embodiment of the present disclosure.

FIG. 6 is an exploded perspective view of a holder assembly to which the gendered connector assembly of FIG. 5A is coupled according to one exemplary embodiment of the present disclosure.

A holder assembly 600 of FIG. 6 may be similar to the holder assembly 430 of FIG. 4A, or may be another example of the holder assembly 430.

Referring to FIG. 6, the holder assembly 600 may include a support bracket 610, a holder bracket 620 slidably fixed to an upper portion of the support bracket 610, a holder housing 630 rotatably fixed to the holder bracket, a terminal unit 640 to be disposed in the holder housing 630, and a holder cover 650 coupled to the holder housing 630.

According to one exemplary embodiment, the support bracket 610 may include a bracket mounting portion 612 at an upper portion of a support bracket body 611. According to one exemplary embodiment, a guide rail 613 may be formed on the bracket mounting portion 612. According to one exemplary embodiment, the guide rail 613 may support a slider 623 of the holder bracket 620 so that the holder bracket 620 can be guided to slide in the Y axis/−Y axis direction. According to one exemplary embodiment, the support bracket 610 may be fixed to a housing (410 of FIG. 4A) of an HMD.

According to various exemplary embodiments, the holder bracket 620 may include a holder bracket body 621 and the slider 623 disposed to a lower portion of the holder bracket body 621 to cooperate with the guide rail 613 of the support bracket 610. According to one exemplary embodiment, one pair of hinge arms 622 spaced apart at a specific interval may be formed on an upper portion of the holder bracket body 621. The one pair of the hinge arms 622 may be mounted in such a manner that a hinge shaft 633 protrusively formed at both sides of the holder housing 630 passes therethrough, so that the holder housing 630 rotates about the hinge shaft 633 in the X direction. According to one exemplary embodiment, a spring 624 may be disposed between the hinge arm 622 and the hinge shaft 633 to provide a restoring force for returning the holder housing 630 to its original position. According to one exemplary embodiment, the spring 624 may be a coil-type torsion spring. According to one exemplary embodiment, the holder bracket 620 may be slidably disposed to an upper portion of the support bracket 610 (e.g., in a Y axis), so that a sliding distance is limited while the restoring force for restoring to the original position can be provided.

According to one exemplary embodiment, the holder housing 630 may include a support piece mounting portion 632 adapted to receive the terminal support piece 641 of the terminal unit 640, a hooking groove 634 disposed in an upper portion of the support piece mounting portion 632, and the hinge shaft 633 protruding from left and right sides of the holder housing body 631. According to one exemplary embodiment, the hooking groove 634 may accommodate a hooking piece (5313 in FIG. 5A) of the locker 530 protruding from the aforementioned gendered connector assembly 500.

According to one exemplary embodiment, the terminal unit 640 may be provided with a plurality of protruding terminals 642 on one side of the terminal support piece 641, and a Flexible Printed Circuit (FPC) 643 having a specific length extending from the terminal support piece 641. According to one exemplary embodiment, the FPC 643 may be electrically connected to the protruding terminal 642. According to one exemplary embodiment, the FPC 643 may be electrically connected to a Printed Circuit Board (PCB) disposed inside a housing (410 of FIG. 4A) of the HMD by passing through the holder bracket 620 and the support bracket 610.

According to one exemplary embodiment, the holder cover 650 may include a cover body 651. According to one exemplary embodiment, the cover body 651 may be plate-type. According to one exemplary embodiment, the cover body 651 may hold the terminal support piece 641 in place so that the terminal support piece 641 does not detach from the holder housing 630 after the terminal support piece 641 is mounted to the support piece mounting portion 632 of the holder housing 630. According to one exemplary embodiment, the cover body 651 may include a terminal exposure hole 652 for exposing the protruding terminal 642 when the holder cover 650 is assembled to the holder housing 630. According to one exemplary embodiment, guide slits 653 formed on left and right sides of the cover body 651 are used to guide the guide rib 5112 formed on the gendered housing 510 of the aforementioned gendered connector assembly 500.

According to one exemplary embodiment, the holder assembly 600 may be assembled by using the holder cover 650 after disposing the terminal support piece 641 of the terminal unit 640 to the support piece mounting portion 632 of the holder housing 630. In this case, the protruding terminal 642 of the terminal unit 640 may be exposed from the holder housing 630. According to one exemplary embodiment, the holder housing 630 in which the terminal unit 640 and the holder cover 650 are assembled may be rotatably assembled to the holder bracket 620 (e.g., rotatable about an X axis as a rotation axis). According to one exemplary embodiment, the holder housing 630 and the holder cover 650 may be assembled by at least one screw. However, the present disclosure is not limited thereto, and thus the holder housing 630 and the holder cover 650 may be assembled by processes such as ultrasonic welding, taping, or bonding.

Figure 7A:
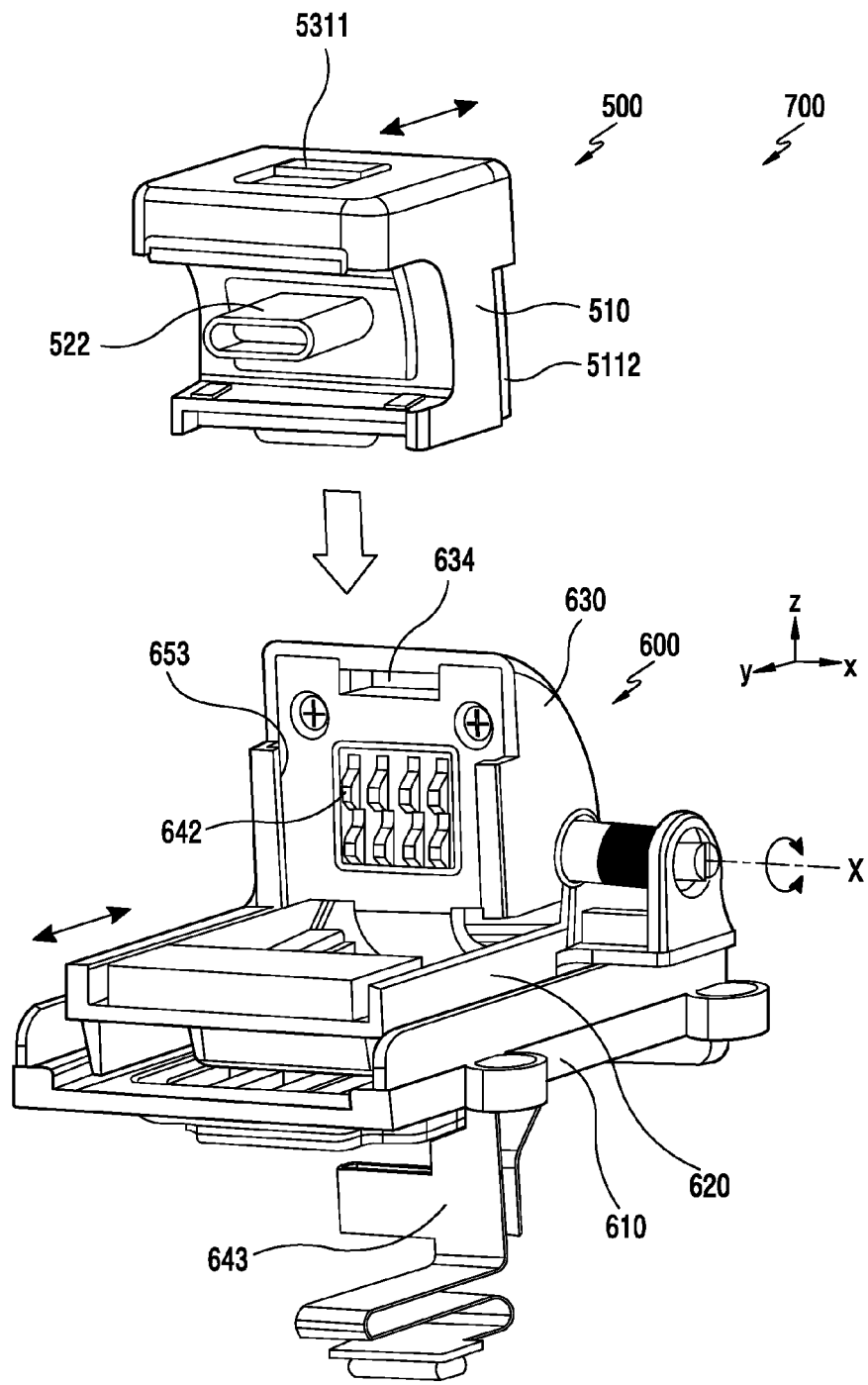
FIG. 7A and FIG. 7B illustrate when a gendered connector assembly is coupled to a holder assembly according to one exemplary embodiment of the present disclosure.
Figure 7B:
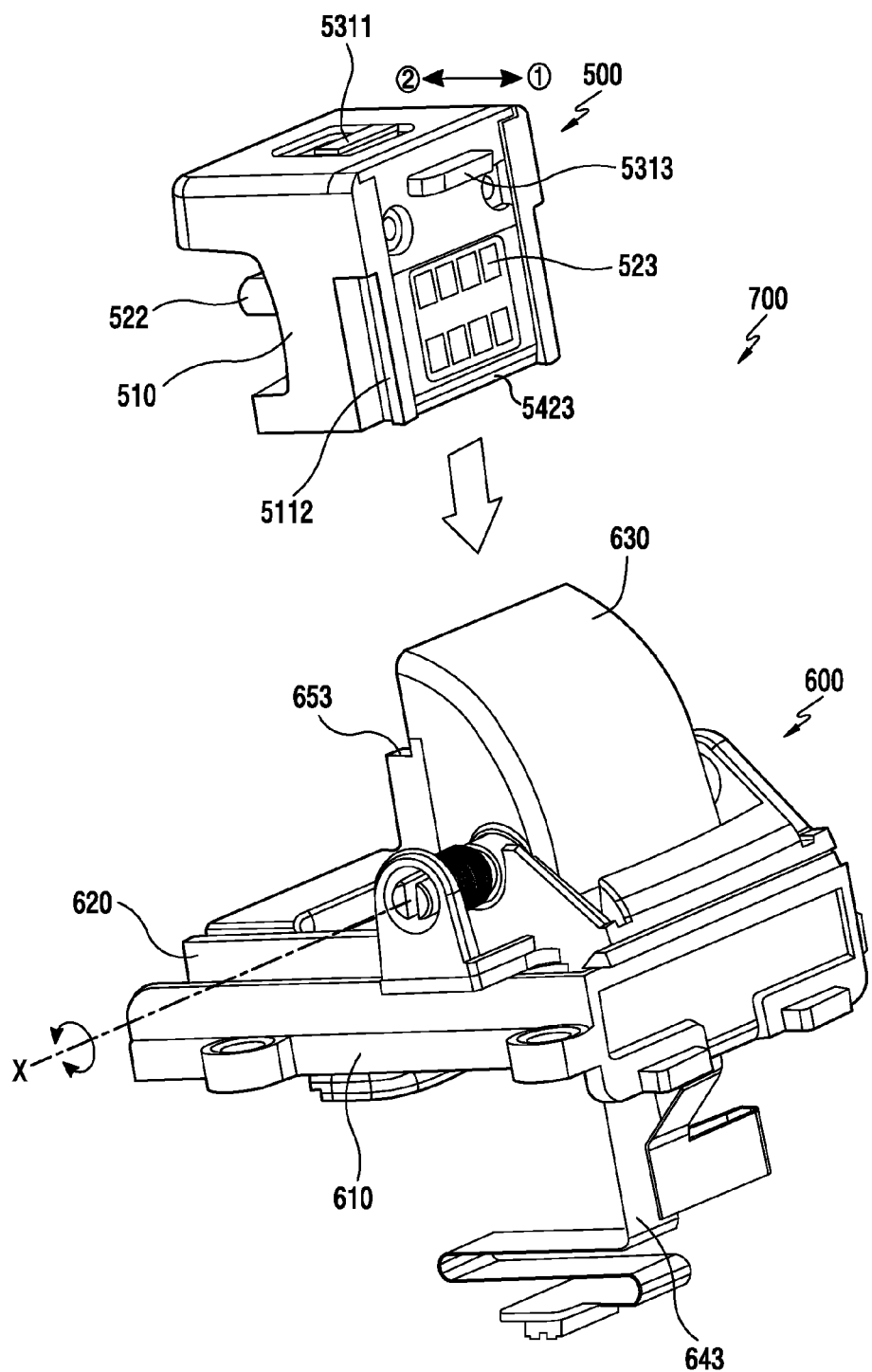
Figure 8:
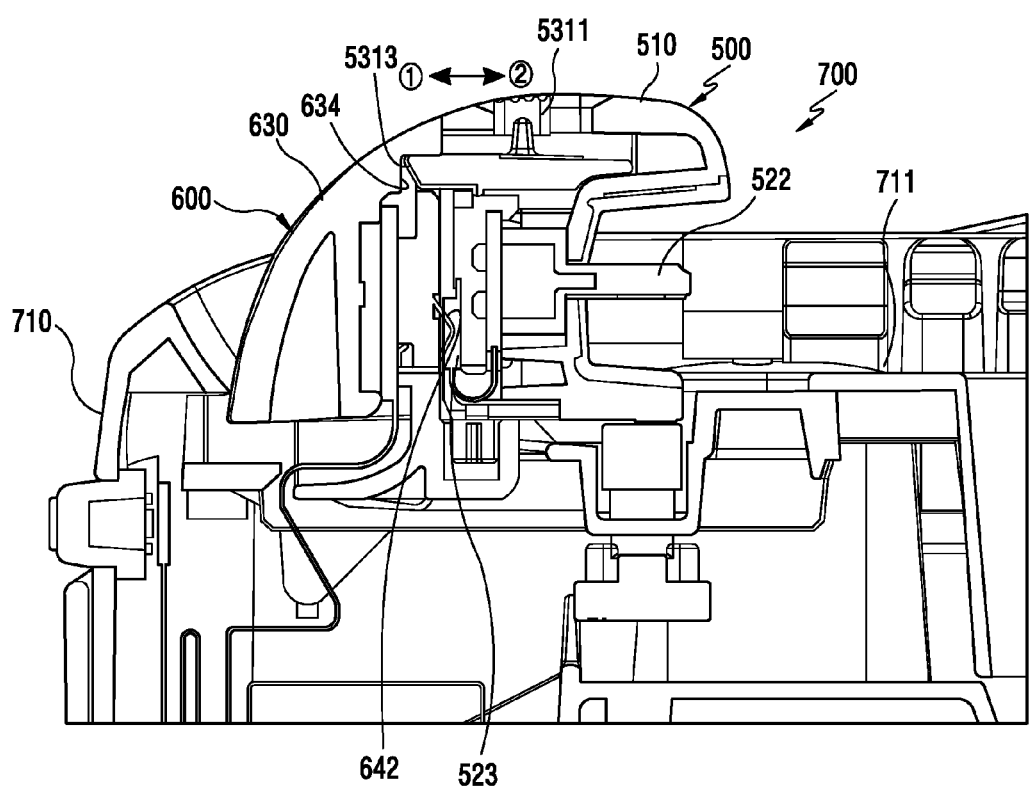
FIG. 8 is a cross-sectional view illustrating when a gendered connector assembly is coupled to a holder assembly according to one exemplary embodiment of the present disclosure.

FIG. 7A and FIG. 7B illustrate when a gendered connector assembly is coupled to a holder assembly according to one exemplary embodiment of the present disclosure. FIG. 8 is a cross-sectional view illustrating when a gendered connector assembly is coupled to a holder assembly according to one exemplary embodiment of the present disclosure.

An interface connector device 700 of FIG. 7A to FIG. 8 may be similar to the interface connector device 230 of FIG. 3A and FIG. 2B or the interface connector device 400 of FIG. 4A and FIG. 4B, or may be another example of the interface connector device.

Referring to FIG. 7A to FIG. 8, the interface connector device 700 may include the holder assembly 600 fixed around a device mounting portion 711 of a housing 710 of an HMD, and the gendered connector assembly 500 removably attached to the holder assembly 600. According to one exemplary embodiment, the holder bracket 620 of the holder assembly 600 may be slidably disposed along an Y axis/−Y axis on the support bracket 610. According to one exemplary embodiment, the holder housing 630 may be rotatable about the X axis as a rotation axis in the holder bracket 620. According to one exemplary embodiment, the Flexible Printed Circuit (FPC) 643 electrically connected to the protruding terminals 642 of the holder assembly 600 may be inserted into a housing (410 of FIG. 4A) of an HMD (400 of FIG. 4A) by passing through the holder bracket 620 and the support bracket 610. According to one exemplary embodiment, the inserted FPC 643 may be electrically connected to one or more electronic components (not shown) disposed inside the housing (410 of FIG. 4A).

According to one exemplary embodiment, the gendered connector assembly 500 including the connector 522 of a particular connection profile may be mounted to the holder assembly 600 in a −Z axis direction. In this case, one pair of the guide ribs 5112 formed at the rear side of the gendered housing 510 in the Z-direction may be mounted along the −Z axis direction by being guided by one pair of the guide slits 653 formed on the holder assembly 600. According to one exemplary embodiment, when the gendered connector assembly 500 is fully mounted to the holder assembly 600, the exposure terminal 523 exposed to a mounting surface of the gendered connector assembly 500 may be electrically connected to the protruding terminal 642. According to one exemplary embodiment, the protruding terminal 642 may include a known C-clip or a pogo pin. According to one exemplary embodiment, a tapered inclined surface 5423 may be formed at a lower end of the mounting surface including the exposure terminal 523 of the gendered housing 510. According to one exemplary embodiment, the inclined surface 5423 is a portion of the gendered connector assembly 500 which is first to come into contact with the protruding terminal 642. The inclined surface 5423 may facilitate sliding of the gendered connector assembly 500 into the holder assembly 600, and therefore breakage or abrasion of the gendered connector assembly 500, which is caused by the protruding terminal 642, may be alleviated.

According to one exemplary embodiment, when the lever 5311 exposed to the upper side of the gendered housing 510 is slid in one direction (e.g., a direction ①) when the gendered connector assembly 500 is received in the holder assembly 600, the hooking piece 5313 of the locker 530 protrudes from the gendered connector assembly 500 and thus is hooked to the hooking groove 634 of the holder assembly 600, so that the gendered connector assembly 500 can be locked in the holder assembly 600. On the contrary, when the lever 5311 is slid in the other direction (e.g., a direction ②), the hooking piece 5313 of the locker 530 retracts from the hooking groove 634 of the holder assembly 600, so that the gendered connector assembly 500 can be separated from the holder assembly 600.

Figure 9:
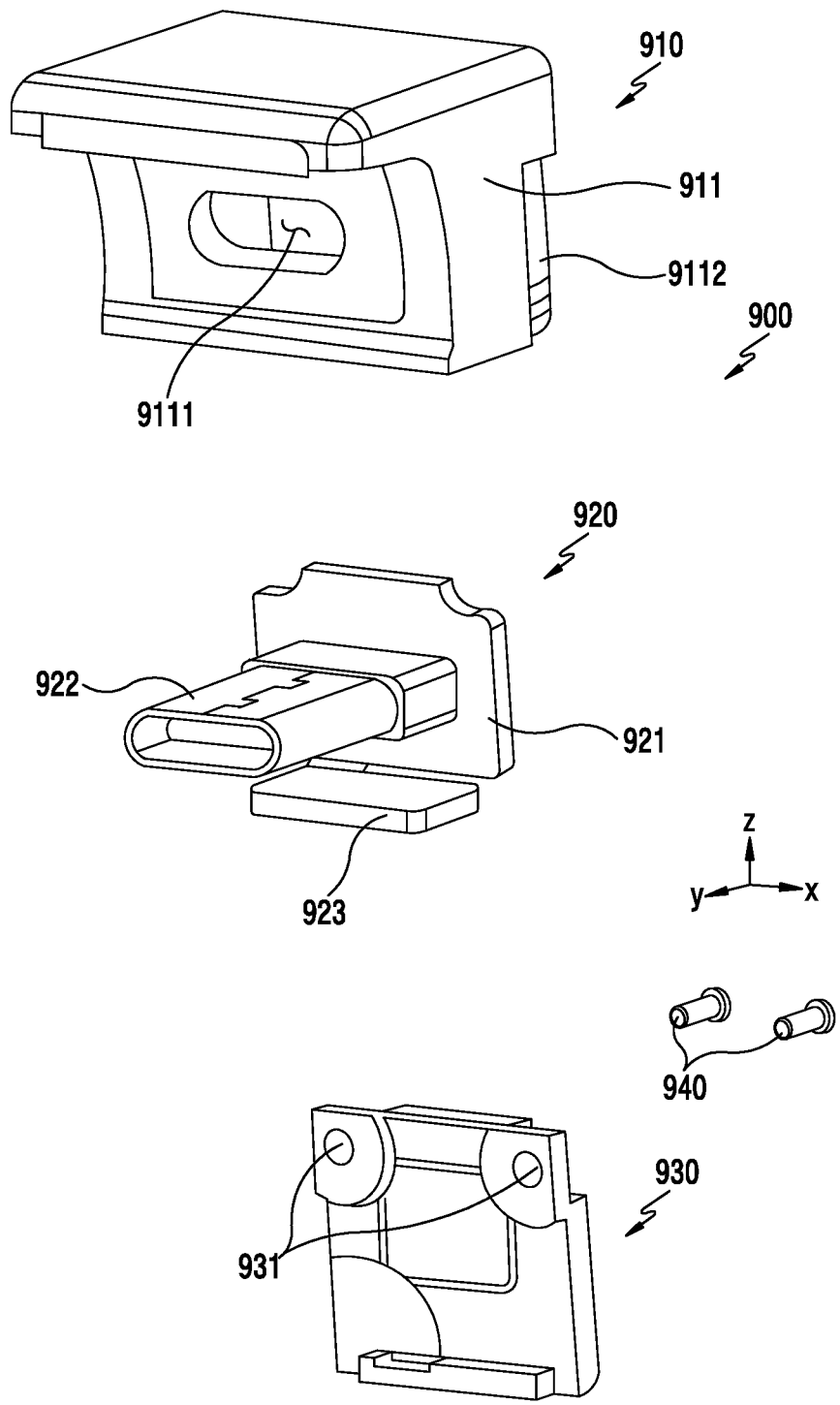
FIG. 9 is an exploded perspective view of a gendered connector assembly according to another exemplary embodiment of the present disclosure.

FIG. 9 is an exploded perspective view of a gendered connector assembly according to another exemplary embodiment of the present disclosure.

Referring to FIG. 9, a gendered connector assembly 900 may include a gendered housing 910, a connector member 920 accommodated inside the gendered housing 910, and a gendered cover 930 coupled to the gendered housing 910 to keep the connector member 920 in place.

According to one exemplary embodiment, the gendered housing 910 may include a gendered housing body 911 for receiving the connector member 920. According to one exemplary embodiment, the gendered housing body 911 may include a connector protrusion hole 9111 formed on a front side to receive a connector 922 of the connector member 920. According to one exemplary embodiment, left and right sides of a rear side of the gendered housing body 911 may include one pair of guide ribs 9112 formed along a mounting direction (e.g.,—the Z axis direction) of the gendered connector assembly 900.

According to one exemplary embodiment, the connector member 920 may include the connector 922 installed on a front side of the connector support piece 921, such that one portion thereof can protrude through the connector protrusion hole 9111 of the gendered housing body 911. According to one exemplary embodiment, the connector member 920 may include a terminal member 923 disposed in a lower portion of the connector support piece 921. According to one exemplary embodiment, the connector 922 may be electrically connected to the terminal member 923 by means of an FPC (not shown). According to one exemplary embodiment, the terminal member 923 may include an exposure terminal exposed on the underside. According to one exemplary embodiment, the terminal member 923 may be electrically connected to the connector 922 via the FPC and/or the connector support piece 921. According to one exemplary embodiment, the connector 922 may be a connector of a particular connection profile (e.g., a B-type USB connection profile or a C-type USB connection profile).

According to one exemplary embodiment, the gendered connector assembly 900 may be installed inside the gendered housing body 911 so that the connector 922 can be projected through the connector protrusion hole 9111. Assembly may be complete when the gendered cover 930 is assembled to the rear side of the gendered housing 910. In this case, the gendered housing 910 and the gendered cover 930, which includes screw through-holes 931, may be assembled by screws 940. However, the present disclosure is not limited thereto, and thus the gendered housing 910 and the gendered cover 930 may be assembled by processes such as ultrasonic welding, taping, bonding, or the like.

Figure 10:
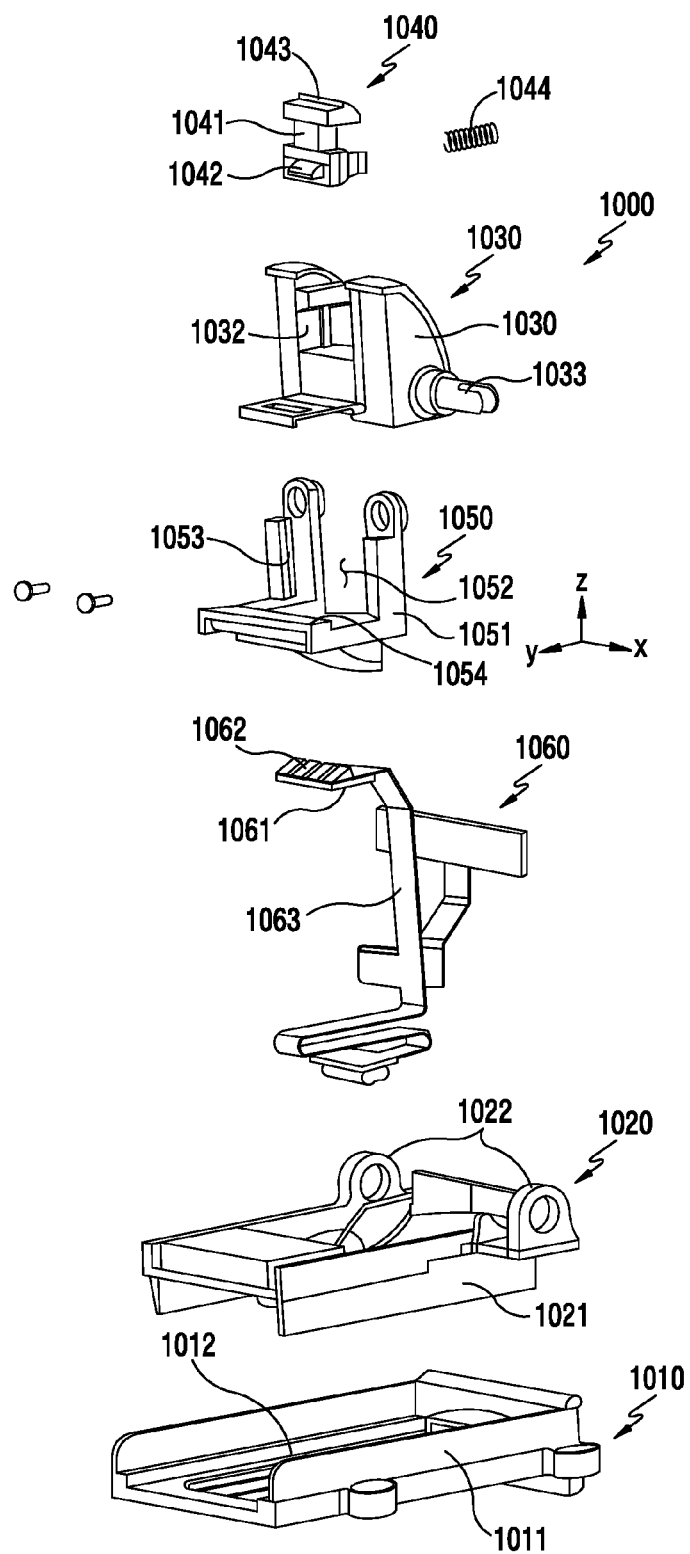
FIG. 10 is an exploded perspective view of a holder assembly to which the gendered connector assembly of FIG. 9 is coupled according to another exemplary embodiment of the present disclosure.

FIG. 10 is an exploded perspective view of a holder assembly to which the gendered connector assembly of FIG. 9 is coupled according to another exemplary embodiment of the present disclosure.

Referring to FIG. 10, a holder assembly 1000 may include a support bracket 1010, a holder bracket 1020 slidably fixed to an upper portion of the support bracket 1010, a holder housing 1030 rotatably fixed to the holder bracket 1020 at a specific angle, a locker 1040 disposed in the holder housing 1030 and having a hooking piece 1042, a terminal unit 1060 disposed inside the holder housing 1030, and a holder cover 1050 coupled to the holder housing 1030 to keep the locker 1040 in place.

According to one exemplary embodiment, the support bracket 1010 may include a bracket mounting portion 1012 at an upper portion of a support bracket body 1011. According to one exemplary embodiment, as described above, a guide rail may be formed on the bracket mounting portion 1012. According to one exemplary embodiment, the holder bracket 1020 may be guided to slide in a Y axis/−Y axis direction into the upper portion of the support bracket 1010. According to one exemplary embodiment, the support bracket 1010 may be fixed to a housing of an HMD.

According to one exemplary embodiment, the holder bracket 1020 may include a holder bracket body 1021. According to one exemplary embodiment, a lower portion of the holder bracket 1020 may include a slider disposed to be guided by the guide rail of the support bracket 1010. According to one exemplary embodiment, one pair of hinge arms 1022 spaced apart at a specific interval may be formed on an upper portion of the holder bracket body 1021, so that a hinge shaft 1033 protrusively formed at both sides of the holder housing 1030 passes therethrough. Thereafter, the holder housing 1030 may rotate about the hinge shaft 1033. According to one exemplary embodiment, a spring (e.g., a torsion spring) may be disposed between the hinge arm 1022 and the hinge shaft 1033, so as to provide a restoring force for restoring the holder housing 1030 to its original position after it has been rotated. According to one exemplary embodiment, the holder bracket 1020 may be slidably disposed to an upper portion of the support bracket 1010, so that a sliding distance is limited while the restoring force for restoring to the original position can be provided.

According to one exemplary embodiment, the holder housing 1030 may include a locker mounting portion 1032 formed to slidably receive the locker 1040 in a Y axis/−Y axis direction. According to one exemplary embodiment, the holder housing 1030 may include one pair of the hinge shafts 1033 protrusively formed at both sides of the holder housing body 1031 that pass through the one pair of hinge arms 1022 of the holder bracket 1020.

According to one exemplary embodiment, the locker 1040 may include a locker body 1041, the hooking piece 1042 formed on a lower side of the locker body 1041 and protruding from the holder assembly 1000 (e.g., in a Y axis direction), and a lever 1043 formed on an upper side of the locker body 1041 and protruding from the holder assembly 1000 (e.g., in a Z axis direction). According to one exemplary embodiment, the locker 1040 may include a spring 1044 (e.g., a compression-type coil spring) pressing the locker 1040 in a Y axis direction to provide a restoring force so that the hooking piece 1042 of the locker 1040 extends from the holder assembly 1000.

According to one exemplary embodiment, the terminal unit 1060 may be provided with a plurality of protruding terminals 1062 on one side of a terminal support piece 1061, and a Flexible Printed Circuit (FPC) 1063 having a specific length extending from the terminal support piece 1061. According to one exemplary embodiment, the FPC 1063 may be electrically connected to the protruding terminal 1062. According to one exemplary embodiment, the FPC 1063 may be electrically connected to a Printed Circuit Board (PCB) disposed inside a housing of the HMD by passing through the holder bracket 1020 and the support bracket 1010.

According to one exemplary embodiment, the holder cover 1050 may include a cover body 1051. According to one exemplary embodiment, the cover body 1051 may include a locker exposure hole 1052 for guiding the sliding of the locker 1040 and for keeping the locker 1040 in place. According to one exemplary embodiment, the cover body 1051 may include a guide slit 1053 formed at both sides of the locker exposure hole 1052 to guide the guide rib 9112 formed on the gendered housing 910. According to one exemplary embodiment, the lower side of the locker exposure hole 1052 may include a terminal exposure hole 1054 to expose the protruding terminal 1062 in the Z axis.

According to one exemplary embodiment, the holder assembly 1000 may be configured in such a manner that the holder cover 1050 is assembled to the holder housing 1030, so that the terminal support piece 1061 is exposed through the terminal exposure hole 1054. The holder assembly 1000 is also configured such that the spring 1044 and the locker 1040 are mounted in sequence to the locker mounting portion 1032. According to one exemplary embodiment, the protruding terminal 1062 exposed through the terminal exposure hole 1054 may be protruding in an upward direction (a Z axis direction) from a lower side of the holder housing 1030. According to one exemplary embodiment, the locker 1040 may be installed such that the hooking piece 1042 protrudes from the holder assembly 1000 in a Y axis direction. In this case, the locker 1040 may be provided with a restoring force to be slid in the Y axis direction by the spring 1044. According to one exemplary embodiment, the locking piece 1042 of the locker 1040 may be slid in the −Y axis direction by a force applied by the gendered connector assembly 900 so that the gendered connector assembly 900 is inserted into the holder assembly 1000. However, when properly seated, there is no force applied by the gendered connector assembly 900, and the hooking piece 1042 may protrude again by the restoring force of the spring 1044. The hooking piece 1042 is then received by the hooking groove 932 (shown in FIG. 11A), thereby locking the gendered connector assembly 900 in place.

According to one exemplary embodiment, the holder housing 1030 and the holder cover 1050 may be assembled by at least one screw. However, the present disclosure is not limited thereto, and thus the holder housing 1030 and the holder cover 1050 may be assembled by processes such as ultrasonic welding, taping, or bonding.

Figure 11A:
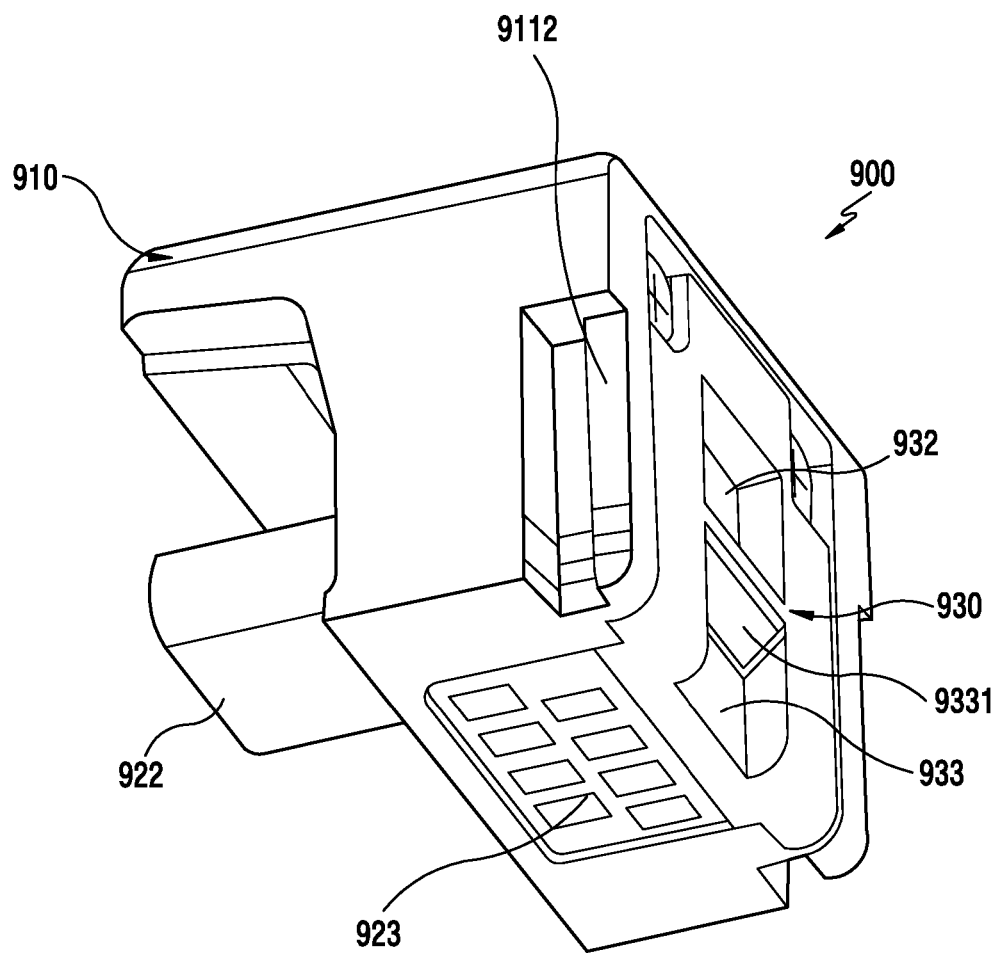
FIG. 11A, FIG. 11B and FIG. 11C illustrate when a gendered connector assembly is coupled to a holder assembly according to another exemplary embodiment of the present disclosure.
Figure 11B:
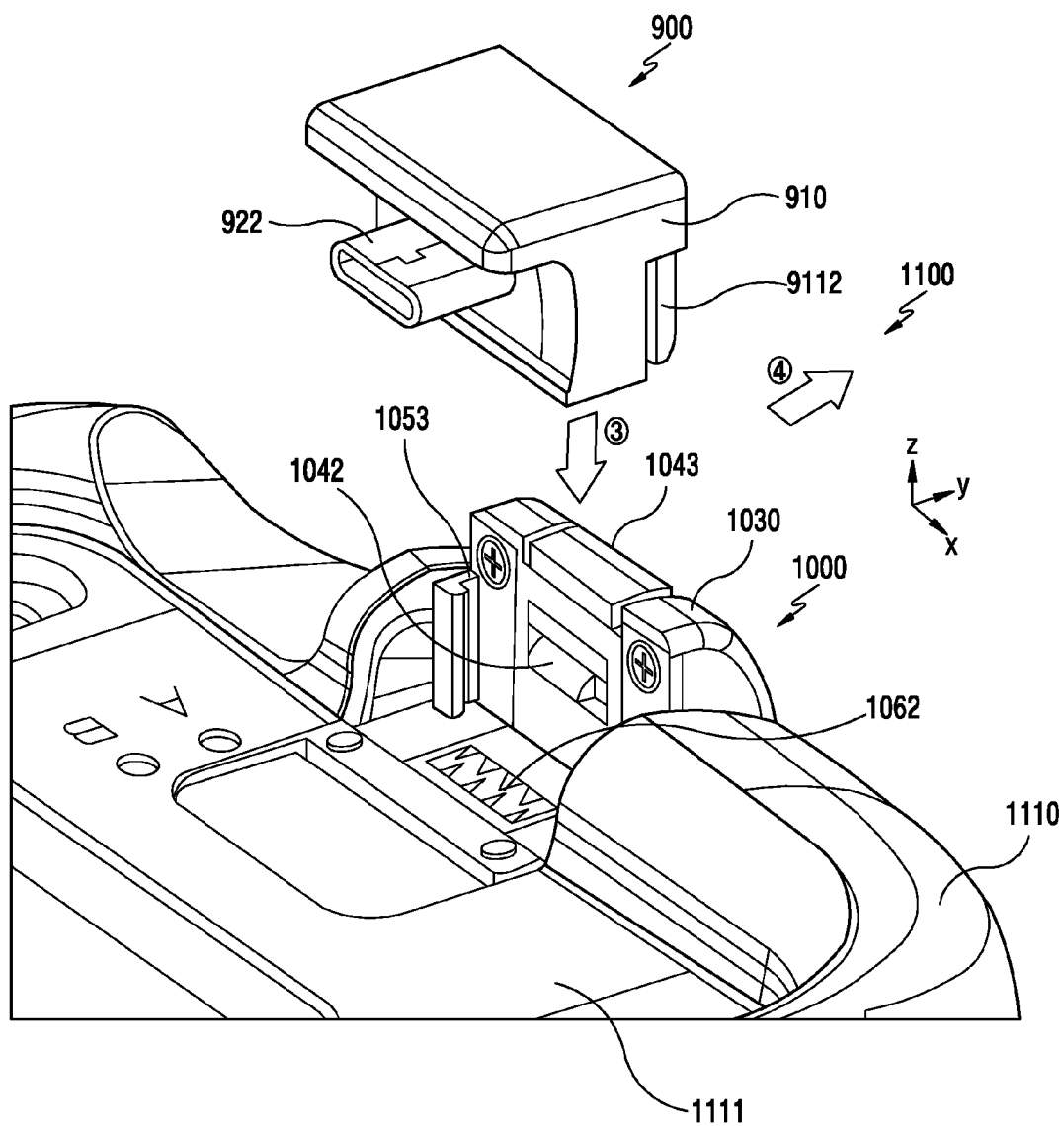
Figure 11C:
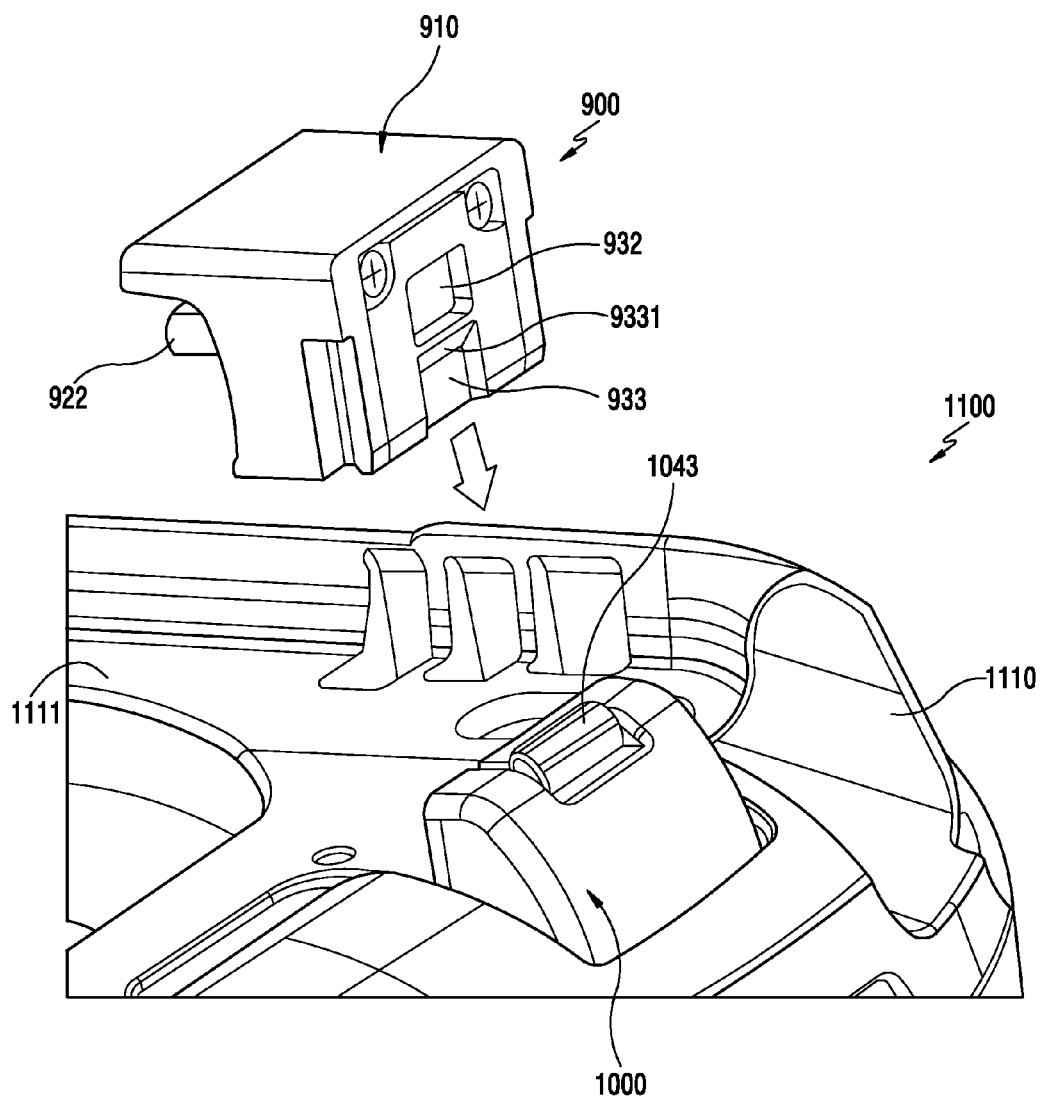
Figure 12:
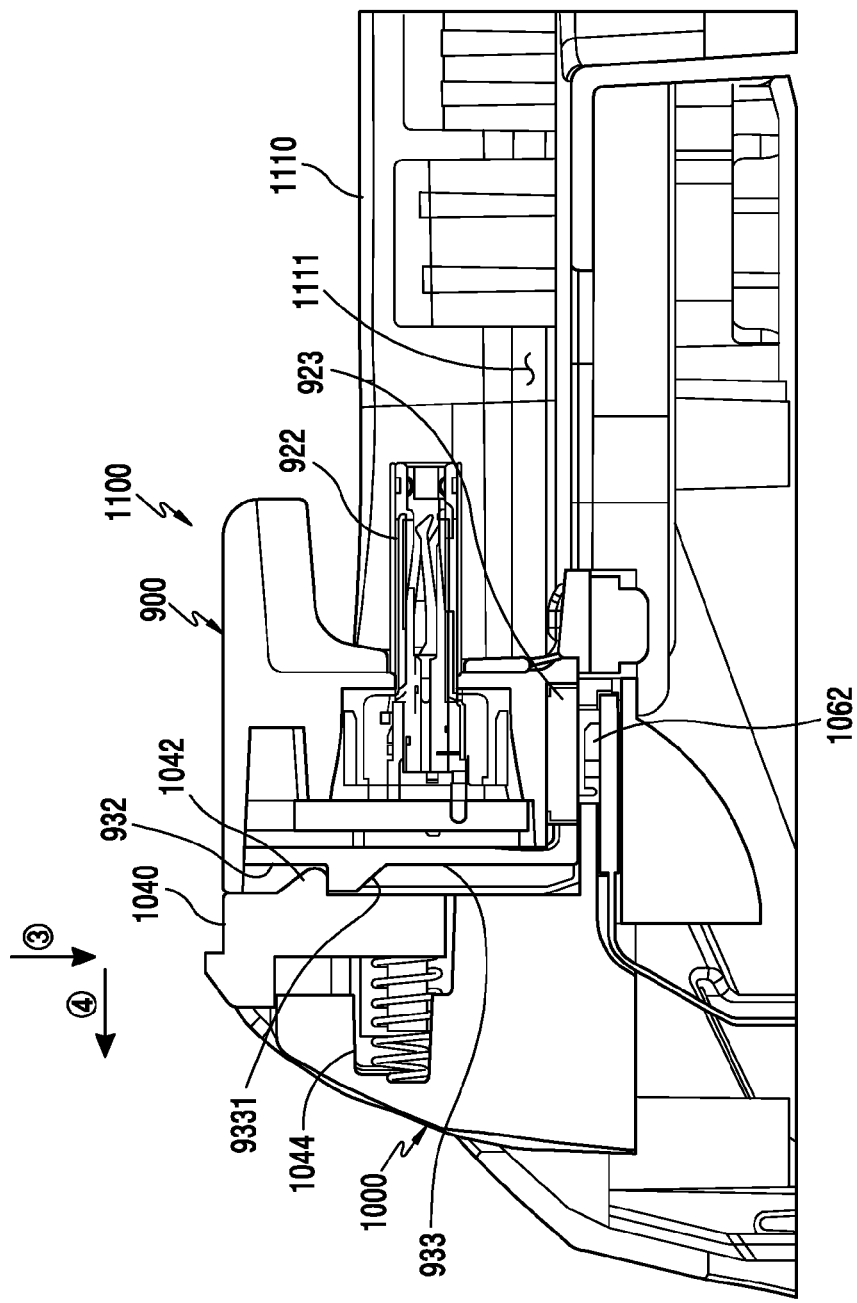
FIG. 12 is a cross-sectional view illustrating a when a gendered connector assembly is coupled to a holder assembly according to another exemplary embodiment of the present disclosure.

FIG. 11A to FIG. 11C illustrate when a gendered connector assembly is coupled to a holder assembly according to another exemplary embodiment of the present disclosure. FIG. 12 is a cross-sectional view illustrating when a gendered connector assembly is coupled to a holder assembly according to another exemplary embodiment of the present disclosure.

The interface connector device illustrated in FIG. 4A to FIG. 8 may include a locker configured in the gendered connector assembly that can be manually slid to a locking or releasing position via a manipulation of the lever 5311. The interface connector device 1100 in the exemplary embodiment of the present disclosure may include the locker 1040 configured in the holder assembly 1000. The locker 1040 may automatically lock the gendered connector assembly 900 upon mounting of the gendered connector assembly 900, and may be capable of detaching the gendered connector assembly 900 from the holder assembly 1000 by a manual manipulation of the lever 1043.

Referring to FIG. 11A to FIG. 12, an interface connector device 1100 may include the holder assembly 1000 fixed around a device mounting portion 1111 of a housing 1110 of an HMD, and the gendered connector assembly 900 removably attachable to the holder assembly 1000. According to one exemplary embodiment, the holder housing 1030 may be rotatable about the X axis as a rotation axis.

According to one exemplary embodiment, the gendered connector assembly 900 including the connector 922 may be mounted to the holder assembly 1000 in a −Z axis direction, as shown by the direction ③ in FIG. 11B. In this case, one pair of the guide ribs 9112 formed at the rear of the gendered housing 910 in the Z-direction may be mounted with the one pair of the guide slits 1053 formed on the holder assembly 1000.

According to one exemplary embodiment, a rear side of the gendered connector assembly 900 may include a guide surface 933 formed in the Z axis direction to guide the hooking piece 1042 into the hooking groove 932. According to one exemplary embodiment, an inclined surface 9331 may be formed between the guide surface 933 and the hooking groove 932 to smoothly guide the hooking piece 1042 into the hooking groove 932. According to one exemplary embodiment, the guide surface 933, inclined surface 9331, and hooking groove 932 formed on the gendered cover 930 of the gendered housing 910.

According to one exemplary embodiment, when the gendered connector assembly 900 is mounted to the holder assembly 1000 in the −Z axis direction (e.g., the direction ③ of FIG. 11B and FIG. 12), the hooking piece 1042 protruding from the holder assembly 1000 may be received by the hooking groove 932 under the guidance of the guide surface 933 and the inclined surface 9331. In this case, when moving in contact with the inclined surface 9331, the inclined surface 9331 exerts a force on the hooking piece 1042, which in turn may exert a pressing force on the spring 1044. Accordingly, the hooking piece 1042 may be recessed in the Y axis direction (e.g., a direction ④ of FIG. 11B and FIG. 12). Thereafter, when the hooking piece 1042 is received by the hooking groove 932, the force exerted by the inclined surface 9331 ceases and the spring 1044 provides a restoring force to the hooking piece 1042 so that the hooking piece 1042 once again protrudes. Due to the restoring force, the hooking piece 1042 can be persistently received by the hooking groove 932, thereby preventing the gendered connector assembly 900 from detaching from the holder assembly 1000.

According to one exemplary embodiment, when the gendered connector assembly 900 is mounted to the holder assembly 1000, the terminal member 923 exposed to the underside of the gendered connector assembly 900 may be exposed to the holder assembly 1000 and may be electrically connected to the protruding terminal 1062. According to one exemplary embodiment, the protruding terminal 1062 may include a known C-clip or a pogo pin.

According to one exemplary embodiment, when the gendered connector assembly 900 is mounted to the holder assembly 1000, and when the lever 1043 exposed to the upper side of the holder housing 1030 is slid in the Y axis direction (e.g., the direction ④ of FIG. 11B and FIG. 12), the gendered connector assembly 900 may be separated from the holder assembly 1000 in the Z axis direction, because the lever 1043 may cause the hooking piece 1042 to retract. According to one exemplary embodiment, when the hooking piece 1042 is retracted, the protruding terminal 1062 may provide an elastic force to push the gendered connector assembly 900 in the Z axis direction, thereby inducing a separation of the gendered connector assembly 900.

Figure 13:
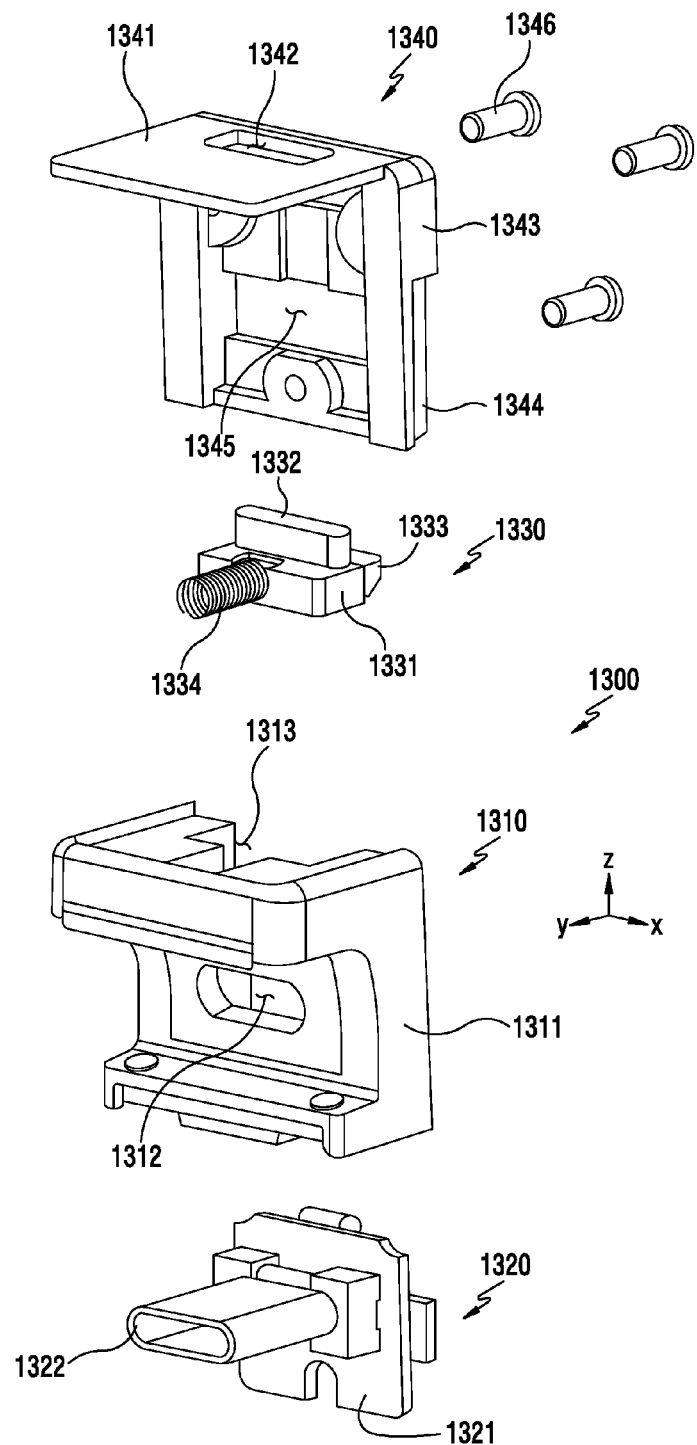
FIG. 13 is an exploded perspective view of a gendered connector assembly according to yet another exemplary embodiment of the present disclosure.

FIG. 13 is an exploded perspective view of a gendered connector assembly according to yet another exemplary embodiment of the present disclosure.

Referring to FIG. 13, a gendered connector assembly 1300 may include a gendered housing 1310, a connector member 1320 accommodated in the gendered housing 1310, a locker 1330 slidably disposed in the gendered housing 1310, and a gendered cover 1340 coupled to the gendered housing 1310 to keep the locker 1330 in place.

According to one exemplary embodiment, the gendered housing 1310 may include a gendered housing body 1311 having an inner space, and a locker mounting portion 1313 formed on an upper portion of the gendered housing body 1311 for slidably receiving the locker 1330. According to one exemplary embodiment, the gendered housing body 1311 may include a connector protrusion hole 1312 formed on the front side such that a connector 1322 of the connector member 1320 protrudes through the protrusion hole 1312.

According to one exemplary embodiment, the connector member 1320 may include the connector 1322, one portion thereof protrudes through the connector protrusion hole 1312 from the front side of a terminal support piece 1321. The connector member 1320 may also include and an exposure terminal (1323 of FIG. 15B) exposed to the rear side of a terminal support piece 1321. According to one exemplary embodiment, the exposure terminal 1323 may be electrically connected to the connector 1322. According to one exemplary embodiment, the connector 1322 may include a connector of a particular connection profile (e.g., a B-type USB connection profile or a C-type USB connection profile).

According to one exemplary embodiment, the locker 1330 may include a locker body 1331 and a lever 1332 protruding from an upper portion of the locker body 1331 and adapted to be received by the lever protrusion hole 1342 of the gendered cover 1340. The locker 1330 may also include a hooking piece 1333 extended to one side of the locker body 1331 and at least partially protruding from the gendered cover 1340, and a spring 1334 supported by a locker mounting portion 1313 to provide a force for maintaining the protrusion of the hooking piece 1333.

According to one exemplary embodiment, the gendered cover 1340 may include a first plate 1341 adapted to be fixed to the upper portion of the gendered housing body 1311 and a second plate 1343 extending from the first plate 1341 at a specific angle and adapted to be fixed to the rear side of the gendered housing body 1311. According to one exemplary embodiment, the first plate 1341 may include a lever protrusion hole 1342 for receiving the lever 1332. According to one exemplary embodiment, the lever protrusion hole 1342 may not only guide a sliding motion of the locker 1330 but also keep the locker 1330 from detaching from the gendered housing body 1311. According to one exemplary embodiment, the second plate 1343 may be installed to keep the terminal support piece 1321 disposed in the gendered housing body 1311 in place. According to one exemplary embodiment, the second plate 1343 may include a terminal exposure hole 1345 for exposing a terminal 1323 formed on the rear side of the terminal support piece 1321. According to one exemplary embodiment, the second plate 1343 may include a hooking piece protrusion hole through which the hooking piece 1333 of the locker 1330 passes through and protrudes. According to one exemplary embodiment, left and right sides of the second plate 1343 may include one pair of guide ribs 1344 formed along a mounting direction (−Z axis direction) of the gendered connector assembly 1300.

According to one exemplary embodiment, the gendered connector assembly 1300 may be assembled in such a manner that the connector 1322 of the connector member 1320 protrudes through the connector protrusion hole 1312, and the locker 1330 is disposed to the locker mounting portion 1313 on an upper portion thereof and is pressed in the −Y axis direction via the spring 1334. Thereafter, the gendered cover 1340 is assembled to the gendered housing 1310. In this case, the gendered housing 1310 and the gendered cover 1340 may be assembled by screws 1346. However, the present disclosure is not limited thereto, and thus the gendered housing 1310 and the gendered cover 1340 may be assembled by processes such as ultrasonic welding, taping, bonding, or the like.

Figure 14:
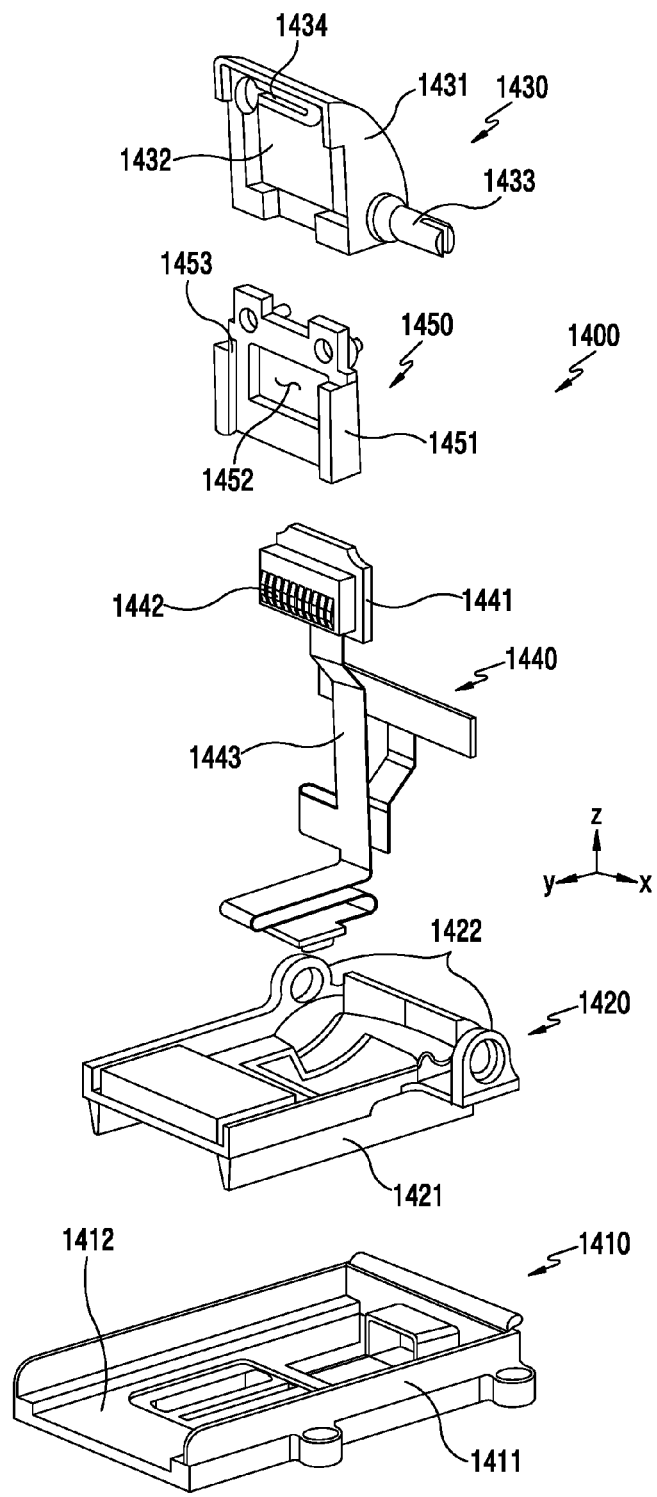
FIG. 14 is an exploded perspective view of a holder assembly to which the gendered connector assembly of FIG. 13 is coupled according to yet another exemplary embodiment of the present disclosure.

FIG. 14 is an exploded perspective view of a holder assembly to which the gendered connector assembly of FIG. 13 is coupled according to yet another exemplary embodiment of the present disclosure.

Referring to FIG. 14, a holder assembly 1400 may include a support bracket 1410, a holder bracket 1420 slidably fixed to an upper portion of the support bracket 1410, a holder housing 1430 rotatably fixed to the holder bracket 1420 at a specific angle, a terminal unit 1440 disposed in the holder housing 1430, and a holder cover 1450 coupled to the holder housing 1430 to contain the terminal unit 1440.

According to one exemplary embodiment, the support bracket 1410 may include a bracket mounting portion 1412 at an upper portion of a support bracket body 1411. According to one exemplary embodiment, as described above, a guide rail may be formed on the bracket mounting portion 1412. According to one exemplary embodiment, the holder bracket 1420 may be guided to slide into the support bracket 1410 in a Y axis/−Y axis direction. According to one exemplary embodiment, the support bracket 1410 may be fixed to a housing of an HMD. According to one exemplary embodiment, the holder bracket 1420 may include a holder bracket body 1421. According to one exemplary embodiment, a lower portion of the holder bracket 1420 may include a slider adapted to be guided by a guide rail of the support bracket 1410. According to one exemplary embodiment, one pair of hinge arms 1422 spaced apart at a specific interval may be formed on an upper portion of the holder bracket body 1421, where the one pair of the hinge arms 1422 is for receiving a hinge shaft 1433 protrusively formed at both side of the holder housing 1430. Thereafter, the hinge shaft 1433 may guide the holder housing 1430 to rotate about the hinge shaft 1433. According to one exemplary embodiment, a spring (e.g., a torsion spring) may be disposed between the hinge arm 1422 and the hinge shaft 1433, so that the holder housing 1430 rotates while a restoring force for restoring to an original position can be provided. According to one exemplary embodiment, the holder bracket 1420 may be slidably disposed to the upper portion of the support bracket 1410, so that a sliding distance is limited while the restoring force for restoring to the original position can be provided.

According to one exemplary embodiment, the holder housing 1430 may include a support piece mounting portion 1432 at a front side of a holder housing body 1431. The support piece mounting portion 1432 may be adapted to receive a terminal support piece 1441 of the terminal unit 1440. The holder housing 1430 may also include a hooking groove 1434 disposed at the upper portion of the holder housing body 1431, and the hinge shaft 1433 protruding from left and right sides of the holder housing body 1431 to be rotatably fixed to the hinge arms 1422 of the holder bracket 1420. According to one exemplary embodiment, the hooking groove 1434 may accommodate the hooking piece 1333 of the locker 1330 protruding from the aforementioned gendered connector assembly 1300.

According to one exemplary embodiment, the terminal unit 1440 may be provided with a plurality of protruding terminals 1442 on one side of the terminal support piece 1441, and a Flexible Printed Circuit (FPC) 1443 having a specific length extending from the terminal support piece 1441. According to one exemplary embodiment, the FPC 1443 may be electrically connected to the protruding terminal 1442. According to one exemplary embodiment, the FPC 1443 may be electrically connected to a Printed Circuit Board (PCB) disposed inside a housing of the HMD by passing through the holder bracket 1420 and the support bracket 1410.

According to one exemplary embodiment, the holder cover 1450 may include a plate-type cover body 1451. According to one exemplary embodiment, the cover body 1451 may stop the terminal support piece 1441 from detaching from the holder housing 1430 after the cover body 1451 is mounted to the support piece mounting portion 1432. According to one exemplary embodiment, the cover body 1451 may include a terminal exposure hole 1452 for exposing the protruding terminal 1442 when the holder cover 1450 is assembled to the holder housing 1430. According to one exemplary embodiment, guide slits 1453 are formed on left and right sides of the outer surface of the cover body 1451 to guide the guide rib 1344 formed on the gendered cover 1340 of aforementioned gendered connector assembly 1300.

According to one exemplary embodiment, the holder assembly 1400 may be assembled by using the holder cover 1450 after assembling the terminal support piece 1441 with the support piece mounting portion 1432. In this case, the protruding terminal 1442 may be exposed to the exterior in the holder housing 1430. According to one exemplary embodiment, the holder housing 1430 in which the terminal unit 1440 and the holder cover 1450 are assembled may be rotatably assembled to the holder bracket 1420. According to one exemplary embodiment, the holder housing 1430 and the holder cover 1450 may be assembled by at least one screw. However, the present disclosure is not limited thereto, and thus the holder housing 1430 and the holder cover 1450 may be assembled by processes such as ultrasonic welding, taping, or bonding.

Figure 15A:
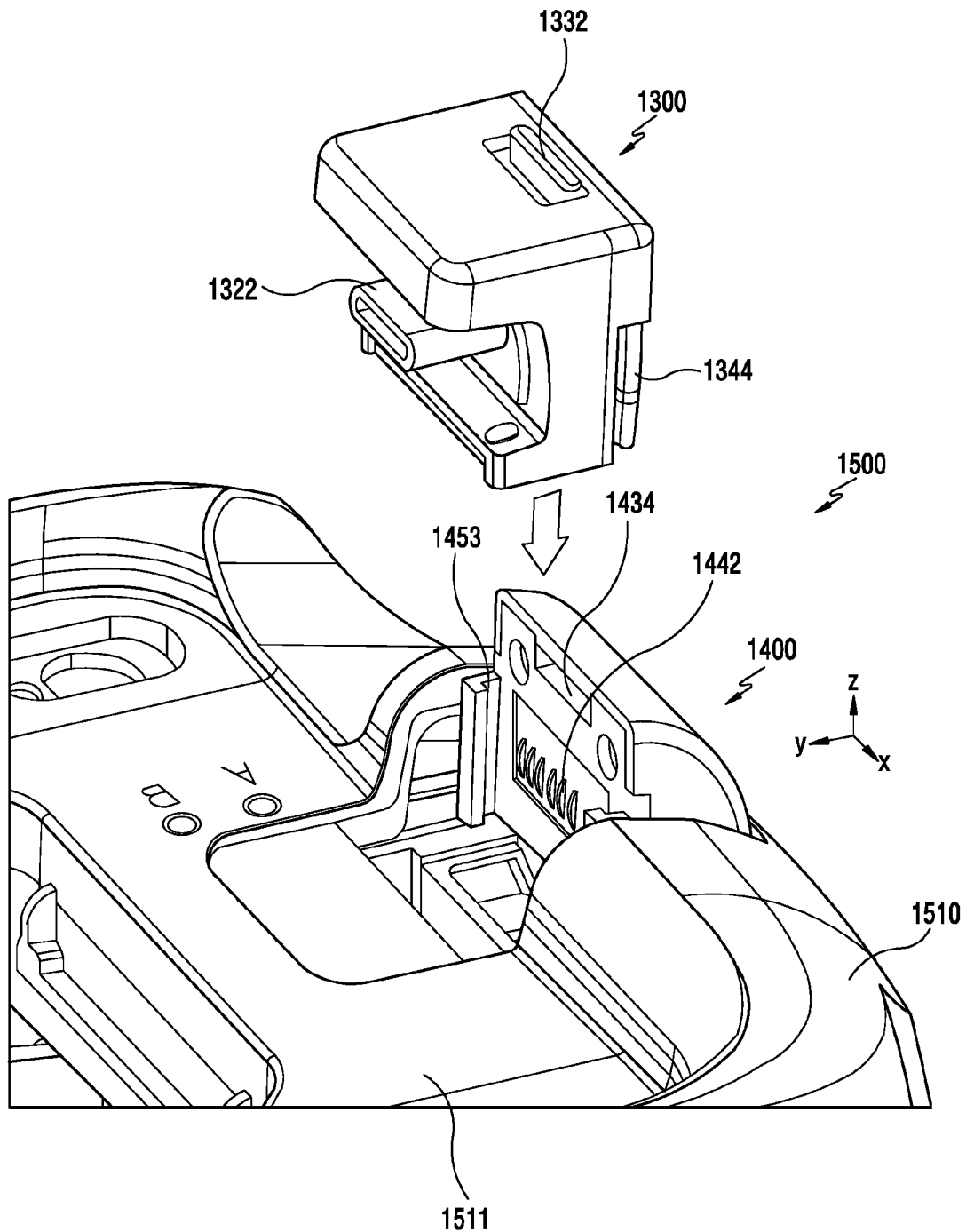
FIG. 15A and FIG. 15B illustrate when a gendered connector assembly is coupled to a holder assembly according to yet another exemplary embodiment of the present disclosure.
Figure 15B:
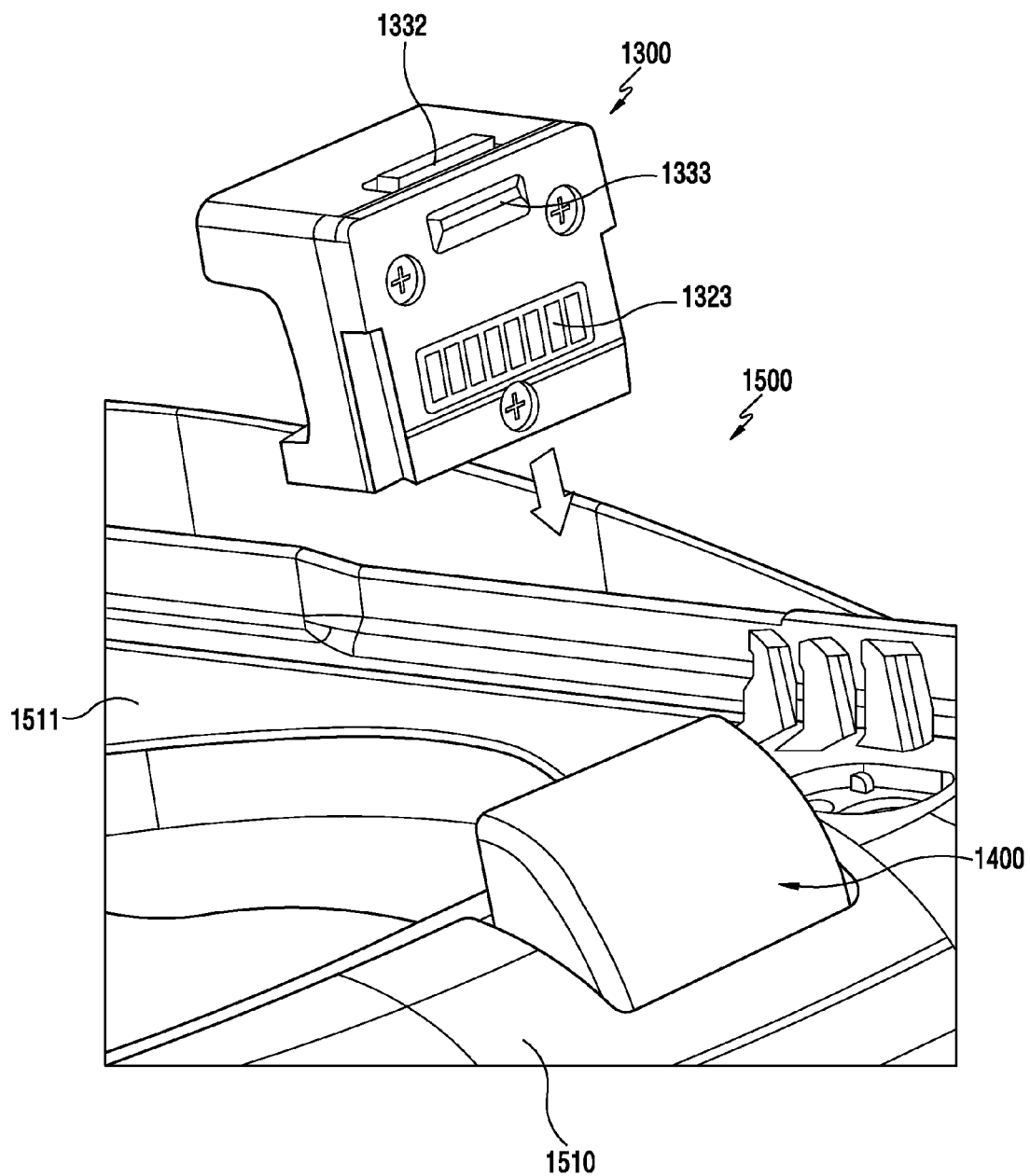
Figure 16:
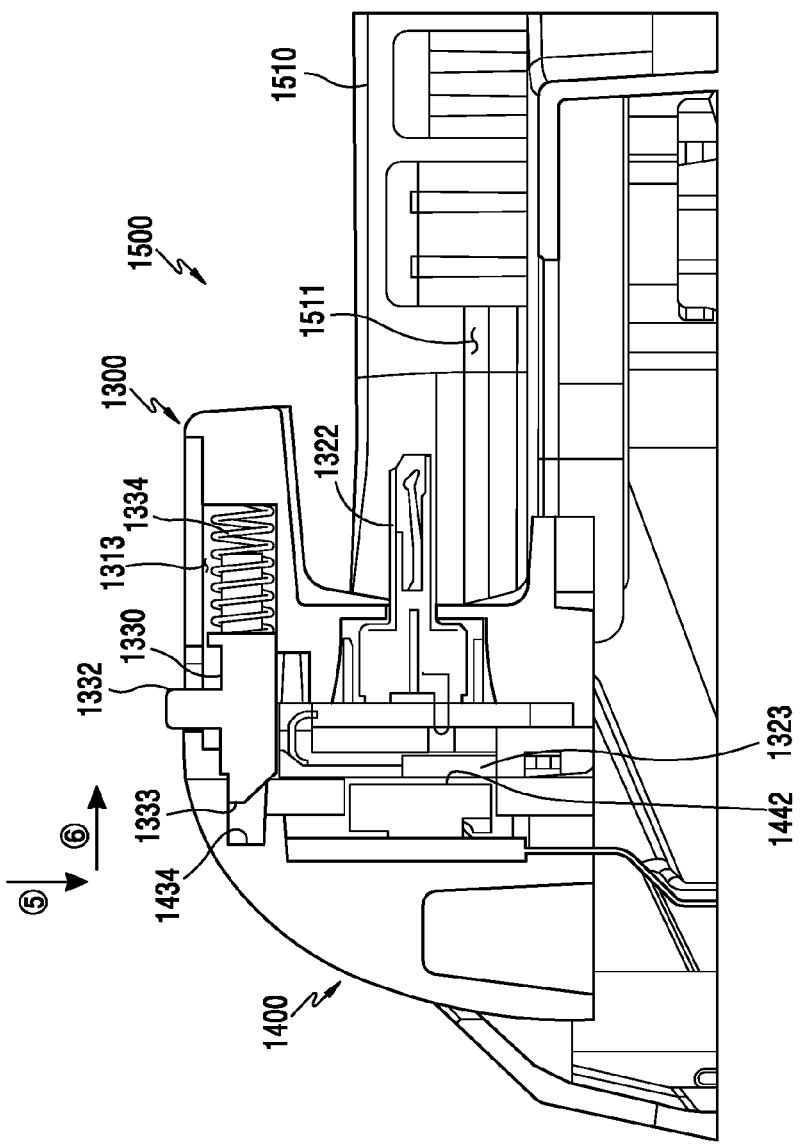
FIG. 16 is a cross-sectional view illustrating when a gendered connector assembly is coupled to a holder assembly according to yet another exemplary embodiment of the present disclosure.

FIG. 15A and FIG. 15B illustrate when a gendered connector assembly is coupled to a holder assembly according to yet another exemplary embodiment of the present disclosure. FIG. 16 is a cross-sectional view illustrating when a gendered connector assembly is coupled to a holder assembly according to yet another exemplary embodiment of the present disclosure.

Referring to FIG. 15A to FIG. 16, an interface connector device 1500 may include the holder assembly 1400 fixed around a device mounting portion 1511 of a housing 1510 of an HMD, and the gendered connector assembly 1300 removably attached to the holder assembly 1400. According to one exemplary embodiment, the holder bracket 1420 of the holder assembly 1400 may be slidably disposed along an Y axis/−Y axis on the support bracket 1410 fixed to the housing 1510. According to one exemplary embodiment, the holder housing 1430 may be rotatable about the X axis as a rotation axis in the holder bracket 1420.

According to one exemplary embodiment, the gendered connector assembly 1300 including the connector 1322 may be mounted to the holder assembly 1400 in a −Z axis direction. In this case, one pair of the guide ribs 1344 formed at the rear of the gendered housing 1310 may be guided by one pair of the guide slits 1453 formed on the holder assembly 1400 to facilitate the mounting of the gendered connector assembly 1300 to the holder assembly 1400.

According to one exemplary embodiment, when the gendered connector assembly 1300 is mounted to the holder assembly 1400 in the −Z axis direction (e.g., the direction ⑤ of FIG. 16), the hooking piece 1333 protruding from the gendered connector assembly 1300 may be received by the hooking groove 1434 along the mounting surface of the holder assembly 1400 (e.g., the contact surface with respect to the gendered connector assembly). In this case, when moving in contact with the mounting surface of the holder assembly 1400, the mounting surface of the holder assembly 1400 exerts a force on the hooking piece 1333, which in turn may exert a pressing force on the spring 1334. Accordingly, the hooking piece 1333 may be recessed in the Y axis direction (e.g., a direction ⑥ of FIG. 16). Thereafter, when the hooking piece 1333 is received by the hooking groove 1434, the force exerted by the mounting surface of the holder assembly 1400 ceases and the spring 1334 provides a restoring force to the hooking piece 1333 so that the hooking piece 1333 once again protrude. Due to the restoring force, the hooking piece 1333 can be persistently received by the hooking groove 1434, thereby preventing the gendered connector assembly 1300 from detaching from the holder assembly 1400.

According to one exemplary embodiment, when the gendered connector assembly 1300 is mounted to the holder assembly 1400, the exposure terminal 1323 may be exposed to the holder assembly 1400 and may be electrically connected to the protruding terminal 1442. According to one exemplary embodiment, the protruding terminal 1442 may include a known C-clip or a pogo pin.

According to one exemplary embodiment, when the lever 1332 is slid in the Y axis direction (e.g., the direction ⑥ of FIG. 16) after completion of the assembly, the gendered connector assembly 1300 may be induced to be separated from the holder assembly 1400 in the Z axis direction because the lever 1332 may cause the hooking piece 1042 to retract. According to one exemplary embodiment, the locker 1330 may be restored to its original position by a restoring force of the spring 1334 when external pressure for sliding in the lever 1332 is removed.

Figure 17:
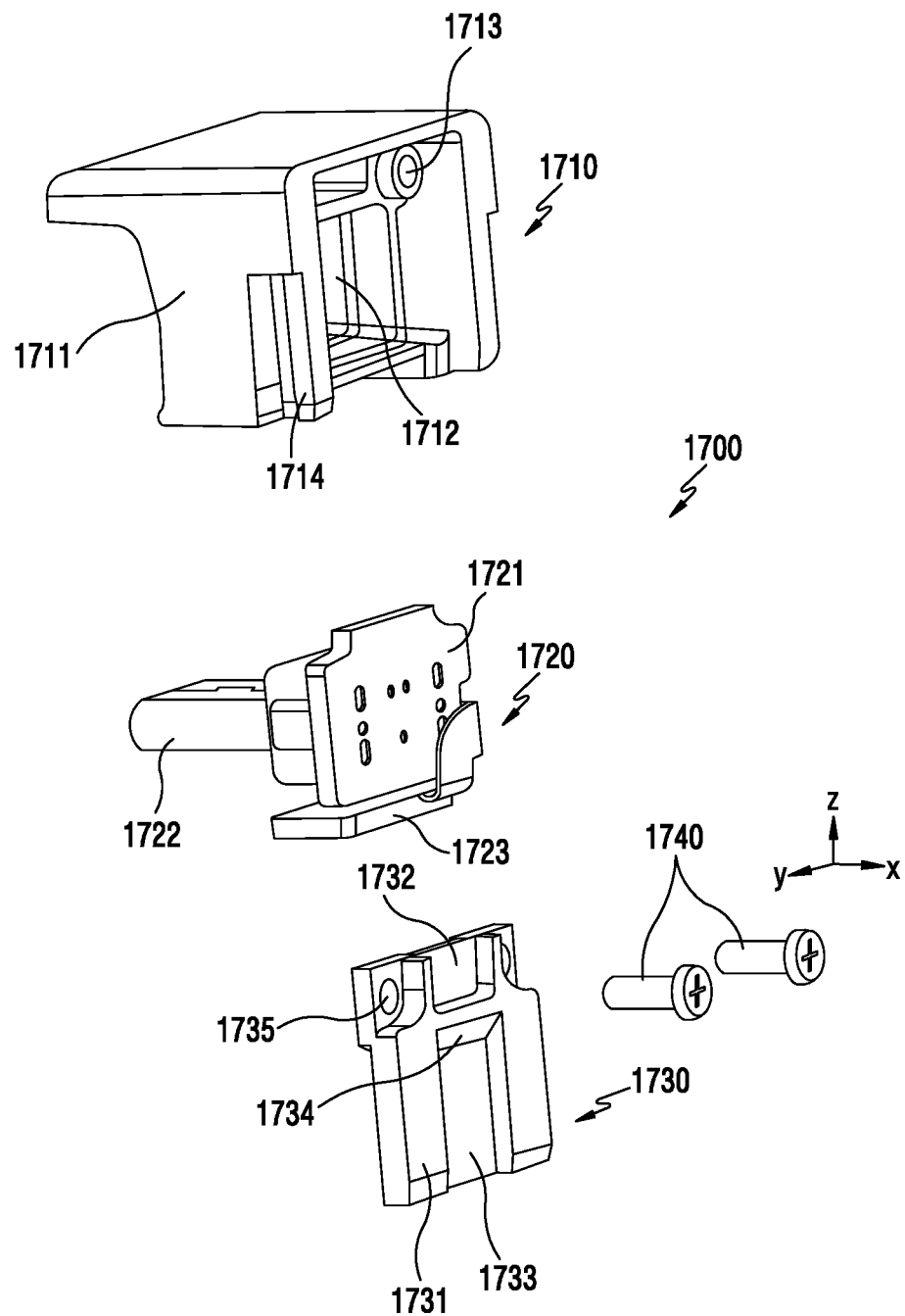
FIG. 17 is an exploded perspective view of a gendered connector assembly according to yet another exemplary embodiment of the present disclosure.

FIG. 17 is an exploded perspective view of a gendered connector assembly according to yet another exemplary embodiment of the present disclosure.

Referring to FIG. 17, a gendered connector assembly 1700 may include a gendered housing 1710, a connector member 1720 accommodated in the gendered housing 1710, and a gendered cover 1730 coupled to the gendered housing 1710 to keep the connector member 1720 in place.

According to one exemplary embodiment, the gendered housing 1710 may include a gendered housing body 1711 having an inner space. According to one exemplary embodiment, the gendered housing body 1711 may include a connector protrusion hole 1712 formed on the front to receive a connector 1722 of the connector member 1720. According to one exemplary embodiment, left and right sides of the rear side of the gendered housing body 1711 may include one pair of guide ribs 1714 formed along a mounting direction (e.g., a Z axis direction) of the gendered connector assembly 1700.

According to one exemplary embodiment, the connector member 1720 may include the connector 1722 installed on the front side of a connector support piece 1721, such that one portion thereof can protrude through the connector protrusion hole 1712 of the gendered housing body 1711. According to one exemplary embodiment, the connector member 1720 may include a terminal member 1723 disposed in a lower portion of the connector support piece 1721. According to one exemplary embodiment, the connector support piece 1721 may be electrically connected to the terminal member 1723 by means of an FPC. According to one exemplary embodiment, the terminal member 1723 may include an exposure terminal exposed on the underside. According to one exemplary embodiment, the terminal member 1723 may be electrically connected to the connector 1722 via the FPC and/or the connector support piece 1721. According to one exemplary embodiment, the connector 1722 may be a connector of a particular connection profile (e.g., a B-type USB connection profile or a C-type USB connection profile).

According to one exemplary embodiment, the gendered cover 1730 may have a guide surface 1733 formed in the Z axis direction to guide a hooking piece (1843 of FIG. 18) of a locker (1840 of FIG. 18) protruding from a holder assembly (1800 of FIG. 18) on an exposed surface of the plate type cover body 1731. The gendered cover 1730 also may include a hooking groove 1732 formed to receive the hooking piece 1843 guided by the guide surface 1733. According to one exemplary embodiment, an inclined surface 1734 may be formed between the guide surface 1733 and the hooking groove 1732 to smoothly guide the hooking piece 1843 to the hooking groove 1732. According to one exemplary embodiment, the guide surface 1733, inclined surface 1734, and hooking groove 1732 may be formed continuously. According to one exemplary embodiment, the guide surface 1733, the inclined surface 1734, and the hooking groove 1732 may be formed on the outer surface of the gendered housing 1710.

According to one exemplary embodiment, the connector member 1720 may be installed inside the gendered housing body 1711 of the gendered housing 1710 so that the connector 1722 of the connector member 1720 can be projected through the connector protrusion hole 17111. Thereafter, assembly may be completed by assembling the gendered cover 1730 to the gendered housing 1710 at the rear side of the gendered housing 1710. In this case, the gendered housing 1710 and the gendered cover 1730 including screw through-holes 1735 may be assembled by screws 1740. However, the present disclosure is not limited thereto, and thus the gendered housing 1710 and the gendered cover 1730 may be assembled by processes such as ultrasonic welding, taping, bonding, or the like.

Figure 18:
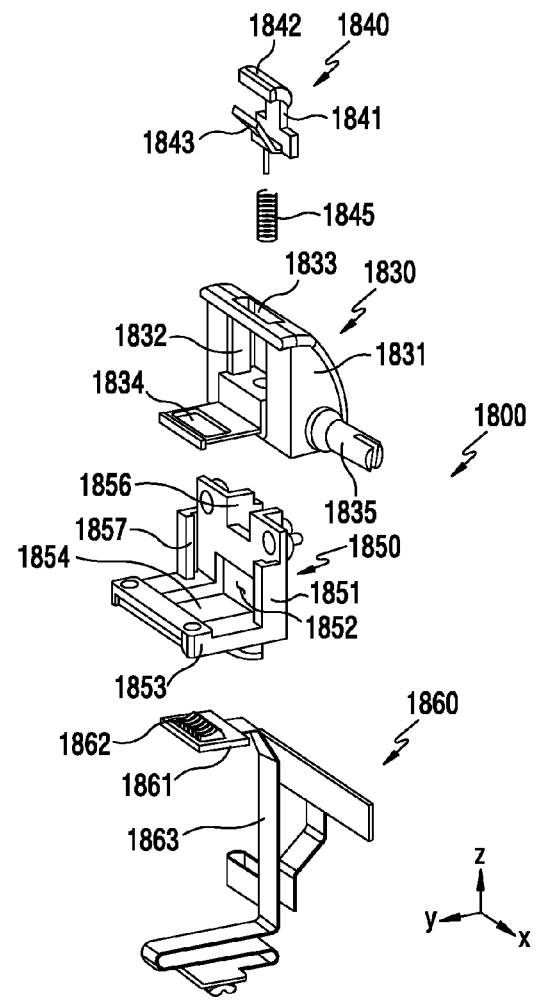
FIG. 18 is an exploded perspective view of a holder assembly to which the gendered connector assembly of FIG. 17 is coupled according to yet another exemplary embodiment of the present disclosure.
Figure 18:
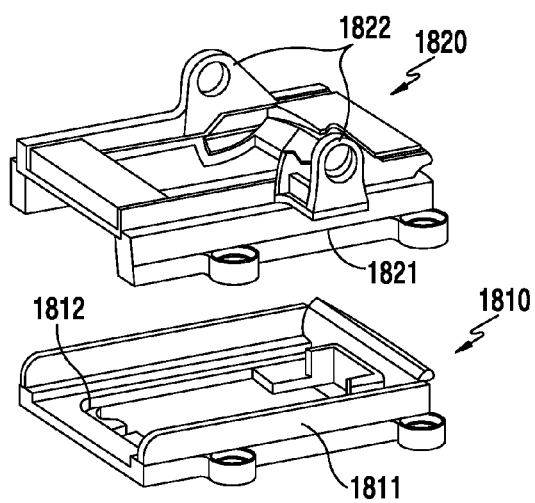

FIG. 18 is an exploded perspective view of a holder assembly to which the gendered connector assembly of FIG. 17 is coupled according to yet another exemplary embodiment of the present disclosure.

Referring to FIG. 18, a holder assembly 1800 may include a support bracket 1810, a holder bracket 1820 slidably fixed to an upper portion of the support bracket 1810, a holder housing 1830 rotatably fixed to the holder bracket 1820 at a specific angle, a locker 1840 disposed to the holder housing 1830 having a hooking piece 1843 protruding from the holder housing 1830, a terminal unit 1860 disposed inside the holder housing 1830, and a holder cover 1850 coupled to the holder housing 1830 to keep the locker 1840 in place.

According to one exemplary embodiment, a support bracket 1810 may include a bracket mounting portion 1812 at an upper portion of a support bracket body 1811. According to one exemplary embodiment, as described above, a guide rail may be formed on the bracket mounting portion 1812. According to one exemplary embodiment, the holder bracket 1820 may be guided to slide in the Y axis/−Y axis direction into the upper portion of the support bracket 1810. According to one exemplary embodiment, the support bracket 1810 may be fixed to a housing of an HMD.

According to one exemplary embodiment, the holder bracket 1820 may include a holder bracket body 1821. According to one exemplary embodiment, a lower portion of the holder bracket 1820 may include a slider disposed to be guided by the guide rail of the support bracket 1810. According to one exemplary embodiment, one pair of hinge arms 1822 spaced apart at a specific interval may be formed on the upper portion of the holder bracket body 1821, and one pair of the hinge arms 1822 may receive a hinge shaft 1835 protrusively formed at both sides of the holder housing 1830, so that the holder housing 1830 may rotate about the hinge shaft 1835 in the X-direction. According to one exemplary embodiment, a spring (e.g., a torsion spring) may be disposed between the hinge arm 1822 and the hinge shaft 1835, so that the holder housing 1830 rotates while a restoring force for restoring to an original position can be provided. According to one exemplary embodiment, the holder bracket 1820 may be slidably disposed to an upper portion of the support bracket 1810, so that a sliding distance is limited while the restoring force for restoring to the original position can be provided.

According to one exemplary embodiment, the holder housing 1830 may include a locker mounting portion 1832 formed to receive the locker 1840 and allow the locker 1840 to slide in the Z axis direction. According to one exemplary embodiment, the holder housing 1830 may include a lever protrusion hole 1833 connected to the locker mounting portion 1832 for accommodating the lever 1842 of the locker 1840, so that the lever 1842 is exposed in an upward direction. According to one exemplary embodiment, the holder housing 1830 may include a terminal exposure hole 1834 formed on the lower portion thereof to expose at least one portion of a terminal support piece 1861 of the terminal unit 1860. According to one exemplary embodiment, the holder housing 1830 may include one pair of hinge shafts 1835 protrusively formed at both sides of the holder housing body to be rotatably installed in the one pair of hinge arms 1822 of the holder bracket 1820.

According to one exemplary embodiment, the locker 1840 may include a locker body 1841, the hooking piece 1843 formed to be curved with a specific angle, so that the hooking piece 1843 has tension in a forward direction with respect to the locker body 1841 and is at least partially protruding in an outward direction (e.g., a Y axis direction) with respect to the holder assembly 1800. The locker 1840 may further include the lever 1842 formed on the upper side of the locker body 1841 and protruding to the outside of the holder assembly 1800 (e.g., in a Z axis direction). According to one exemplary embodiment, the locker 1840 may include a spring 1844 (e.g., a compression-type coil spring) disposed against the locker mounting portion 1832 of the holder housing 1830 for pressing the locker 1840 in a Z axis direction. The spring 1844 provides a restoring force so that the hooking piece 1843 of the locker 1840 protrudes to the exterior of the holder assembly 1800 (e.g., a Y axis direction).

According to one exemplary embodiment, the terminal unit 1860 may be provided with a plurality of protruding terminals 1862 on one side of the terminal support piece 1861, and a Flexible Printed Circuit (FPC) 1863 having a specific length extending from the terminal support piece 1861. According to one exemplary embodiment, the FPC 1863 may be electrically connected to the protruding terminal 1862. According to one exemplary embodiment, the FPC 1863 may be electrically connected to a Printed Circuit Board (PCB) disposed inside a housing of the HMD by passing through the holder bracket 1820 and the support bracket 1810.

According to one exemplary embodiment, the holder cover 1850 may include a cover body 1851. According to one exemplary embodiment, the cover body 1851 may include a locker guide portion 1856 for guiding the sliding of the locker 1840 in a Z axis direction and for preventing detachment of the locker 1840 from the locker mounting portion 1832. According to one exemplary embodiment, the cover body 1851 may include a guide slit 1857 formed at both sides of the locker guide portion 1856 to guide the guide rib 1714 formed on the gendered housing 1710 of the aforementioned gendered connector assembly 1700. According to one exemplary embodiment, the lower side of the cover body 1851 may include a terminal piece mounting portion 1854 and an exposure hole 1852 to expose the protruding terminal 1862 in a −Z axis direction of the holder assembly 1800.

According to one exemplary embodiment, the holder assembly 1800 may be assembled by assembling the holder cover 1850 to the holder housing 1830, so that the terminal support piece 1861, mounted to the terminal piece mounting portion 1854, is exposed through the terminal exposure hole 1834 of the holder housing 1830. The holder assembly 1800 is also configured such that the spring 1845 and the locker 1840 are mounted in sequence to the locker mounting portion 1832. According to one exemplary embodiment, the protruding terminal 1862 exposed through the terminal exposure hole 1834 may protrude in an upward direction (a Z axis direction) from the lower side of the holder housing 1830. According to one exemplary embodiment, the locker 1840 may be installed such that the hooking piece 1843 protrudes in the Y axis direction from the holder assembly 1800. In this case, the locker 1840 may be provided with a restoring force to be slid in the Z axis direction by the spring 1845. According to one exemplary embodiment, the hooking piece 1843 of the locker 1840 may retract in the −Y axis direction when there is external pressure. However, when the external pressure is removed, the hooking piece 1843 may protrude again from the holder assembly 1800 (in the Y axis direction) by the restoring force of the spring 1845.

According to one exemplary embodiment, the holder housing 1830 and the holder cover 1850 may be assembled by at least one screw. However, the present disclosure is not limited thereto, and thus the holder housing 1830 and the holder cover 1850 may be assembled by a processes such as ultrasonic welding, taping, or bonding.

Figure 19A:
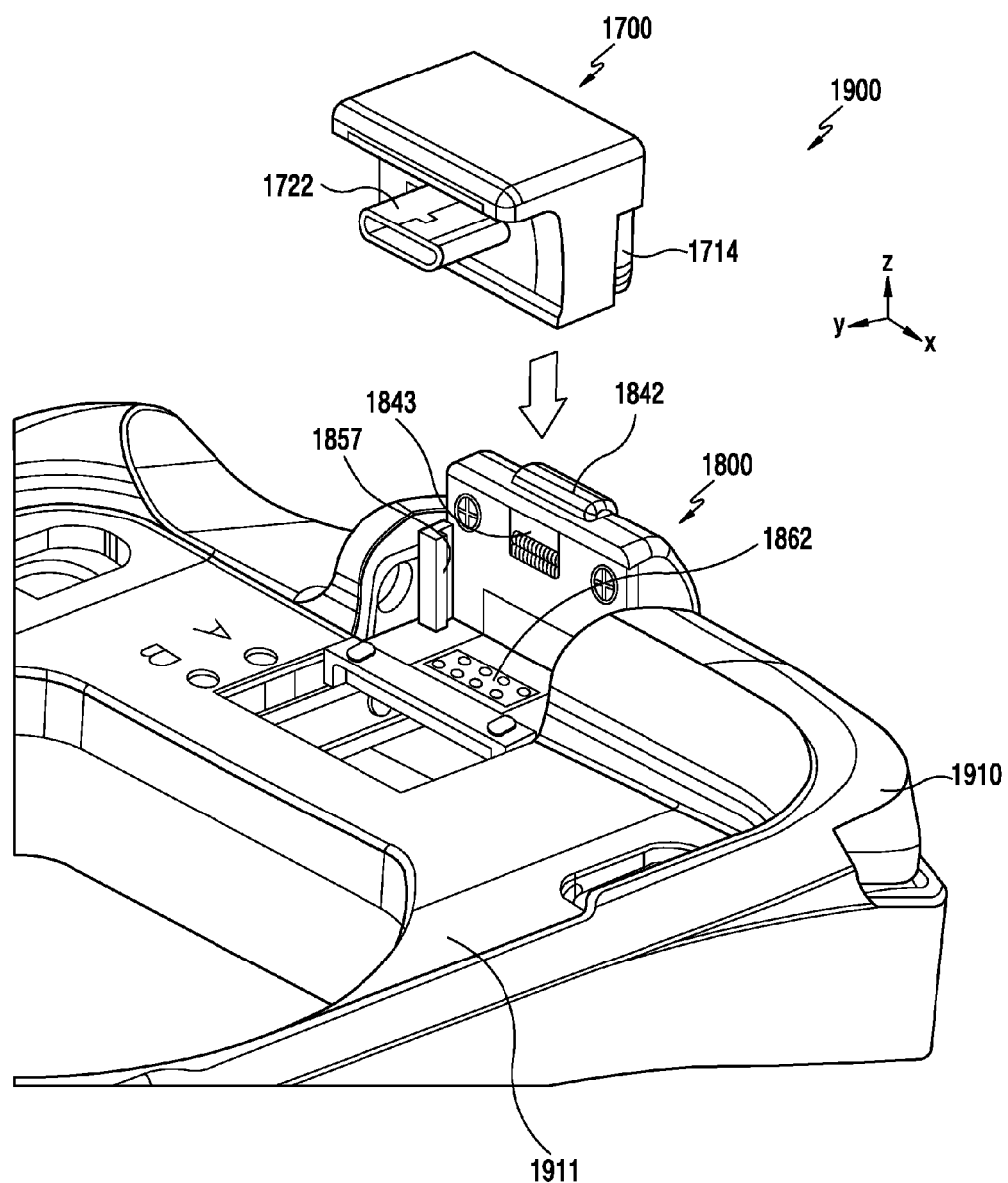
FIG. 19A and FIG. 19B illustrate when a gendered connector assembly is coupled to a holder assembly according to yet another exemplary embodiment of the present disclosure.
Figure 19B:
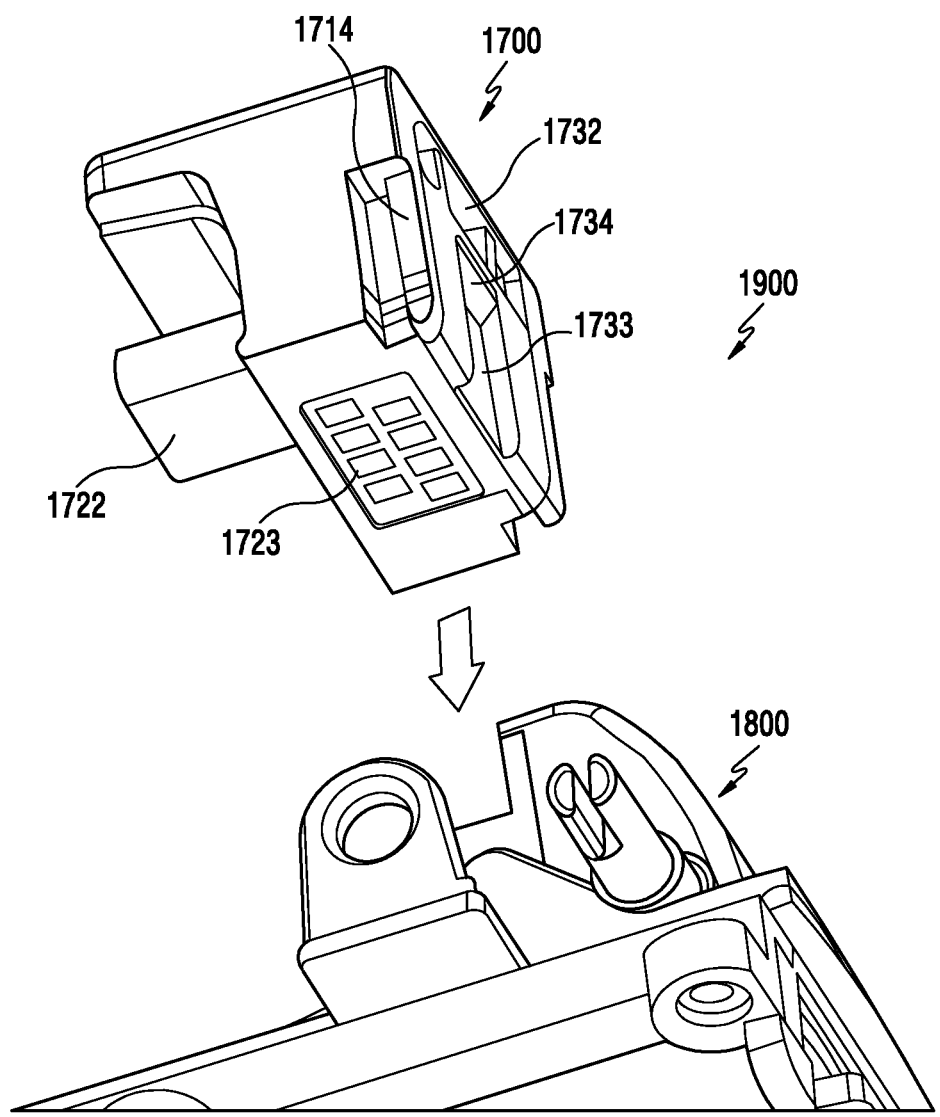
Figure 20:
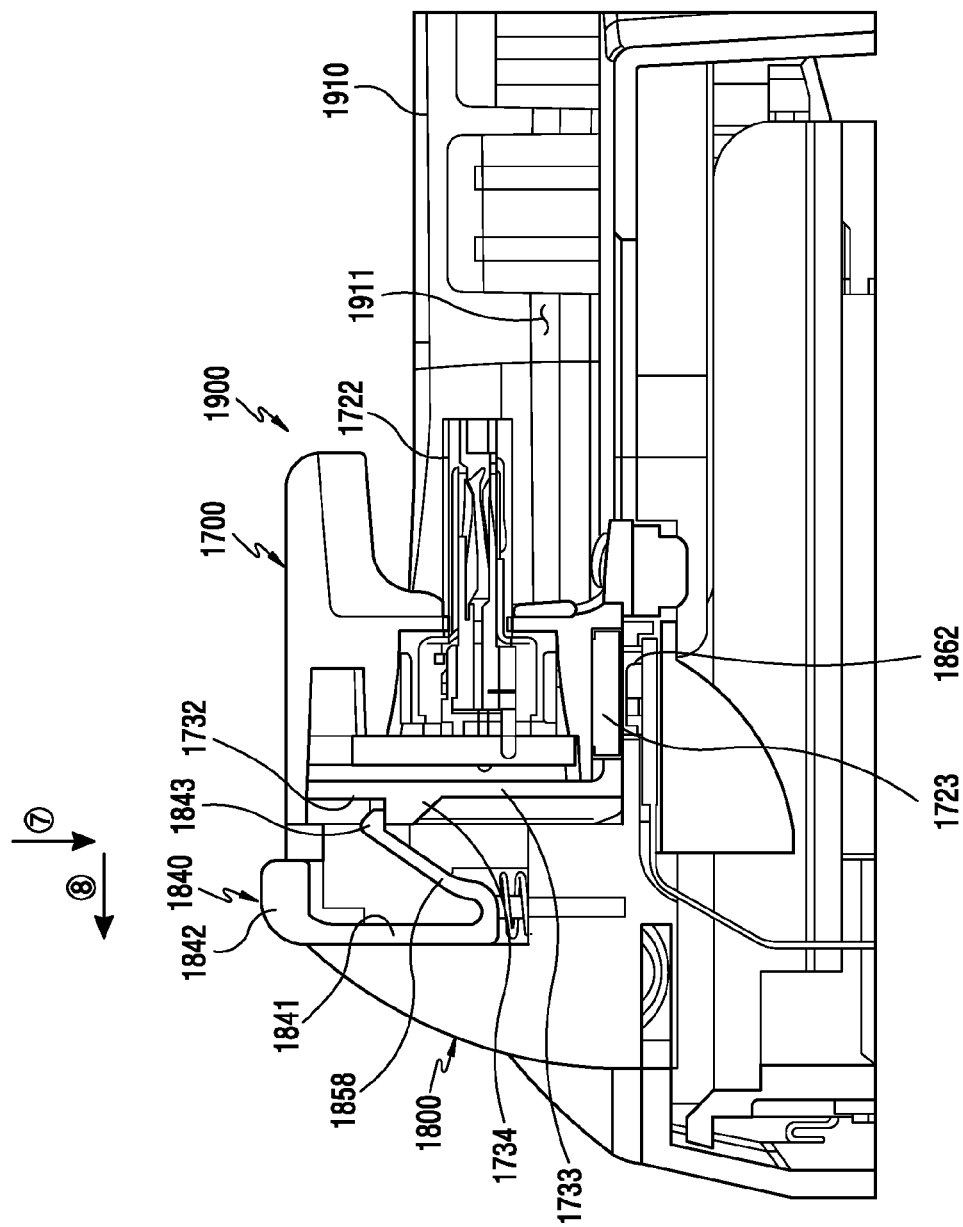
FIG. 20 is a cross-sectional view illustrating when a gendered connector assembly is coupled to a holder assembly according to yet another exemplary embodiment of the present disclosure.

FIG. 19A and FIG. 19B illustrate when a gendered connector assembly is coupled to a holder assembly according to yet another exemplary embodiment of the present disclosure. FIG. 20 is a cross-sectional view illustrating when a gendered connector assembly is coupled to a holder assembly according to yet another exemplary embodiment of the present disclosure.

Referring to FIG. 19A to FIG. 20, an interface connector device 1900 may include the holder assembly 1800 fixed around a device mounting portion 1911 of a housing 1910 of an HMD, and the gendered connector assembly 1700 removably attached to the holder assembly 1800. According to one exemplary embodiment, the holder bracket 1820 of the holder assembly 1800 may be slidably disposed along the Y axis/−Y axis on the support bracket 1010 fixed to the housing 1910. According to one exemplary embodiment, the holder housing 1030 may rotate about the X axis as a rotation axis in the holder bracket 1820.

According to one exemplary embodiment, the gendered connector assembly 1700 including the connector 1722 may be mounted to the holder assembly 1800 in a −Z axis direction (the direction ⑦ of FIG. 20). In this case, one pair of the guide ribs 1714 formed at the rear of the gendered housing 1710 may guide the mounting of the gendered connector assembly 1700 along the −Z axis direction in cooperation with one pair of guide slits 1857 formed on the holder assembly 1800.

According to one exemplary embodiment, when the gendered connector assembly 1700 is mounted to the holder assembly 1800 in the −Z axis direction (e.g., the direction ⑦ of FIG. 20), the hooking piece 1843 protruding from the holder assembly 1800 may be received by the hooking groove 1732 under the guidance of the guide surface 1733 and the inclined surface 1734. In this case, when moving in contact with the inclined surface 1734 of the gendered connector assembly 1700, the inclined surface 1734 may exert a force on the hooking piece 1843 so that the hooking piece 1843 retracts into the holder assembly 1800 in the −Y axis direction (e.g., a direction ⑧ of FIG. 20), at least in part due to the force exerted by the inclined surface 1734 and the shape of the hooking piece 1843. Thereafter, when the hooking piece 1843 is received the hooking groove 1732, the force exerted by the inclined surface 1734 ceases and the hooking piece 1843 may be restored again in the Y axis direction by the restoring force provided by, for example, the spring 1845. Due to the restoring force, the hooking piece 1843 can be persistently received by the hooking groove 1732, thereby preventing the gendered connector assembly 1700 from detaching from the holder assembly 1800.

According to one exemplary embodiment, when the gendered connector assembly 1700 is fully mounted to the holder assembly 1800, the terminal member 1723 exposed at the bottom of the gendered connector assembly 1700 may be naturally exposed to the holder assembly 1800 and may be electrically connected to the protruding terminal 1862.

According to one exemplary embodiment, when the gendered connector assembly 1700 is fully mounted to the holder assembly 1800, and when the lever 1842 is pressed in the −Z axis direction (e.g., the direction ⑦ of FIG. 20), the hooking piece 1843 of the locker 1840 may retract (e.g., in the direction ⑧ of FIG. 20). According to one exemplary embodiment, the gendered connector assembly 1700 may be separated from the holder assembly 1800 in the Z axis direction when pressure is maintained on the lever 1842 in the −Z axis direction. According to one exemplary embodiment, when the hooking piece 1843 is retracted, the protruding terminal 1862 may provide an elastic force to push the gendered connector assembly 1700 in the Z axis direction, thereby inducing a separation of the gendered connector assembly 1700.

The aforementioned various exemplary embodiments may have a mechanical assembly structure between the gendered connector assembly and the holder assembly. However, the present disclosure is not limited thereto, and thus each assembly may be coupled by using a magnetic force of a magnet disposed to a corresponding position.

Figure 21:
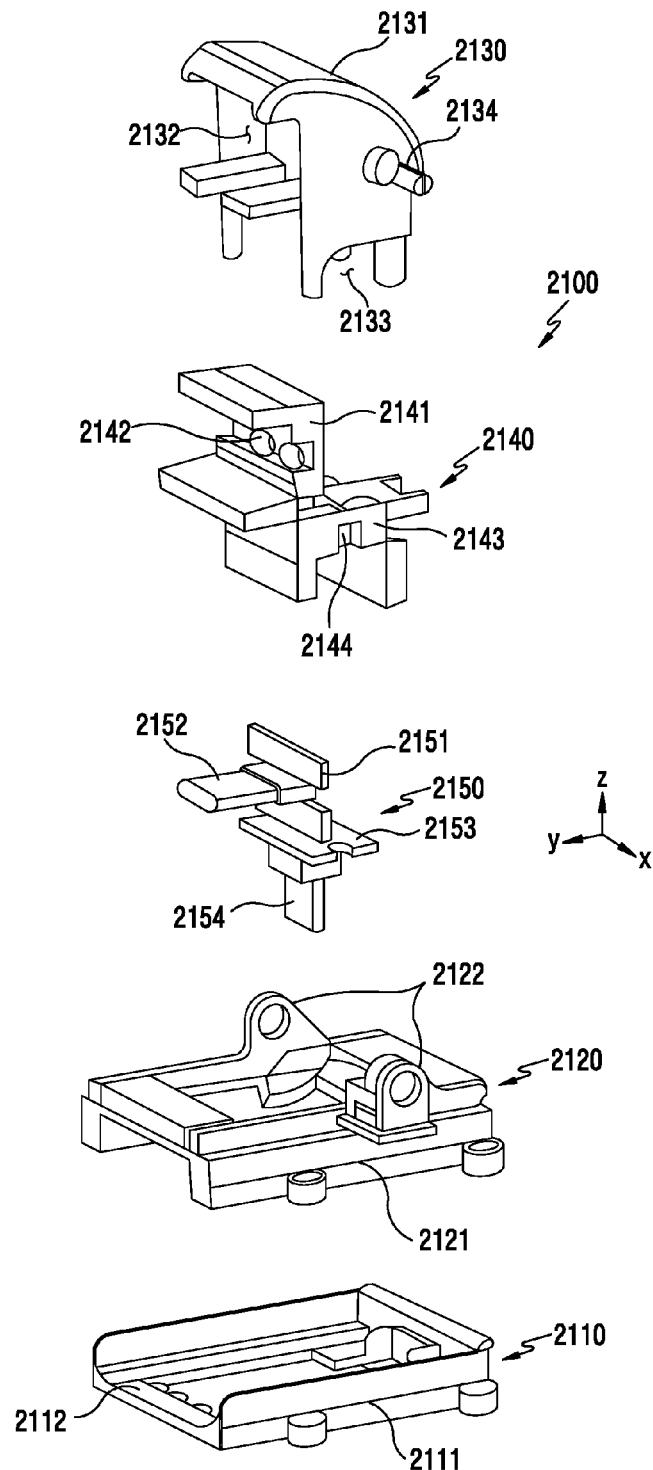
FIG. 21 is an exploded perspective view of a rotatable holder assembly according to one exemplary embodiment of the present disclosure.
Figure 22A:
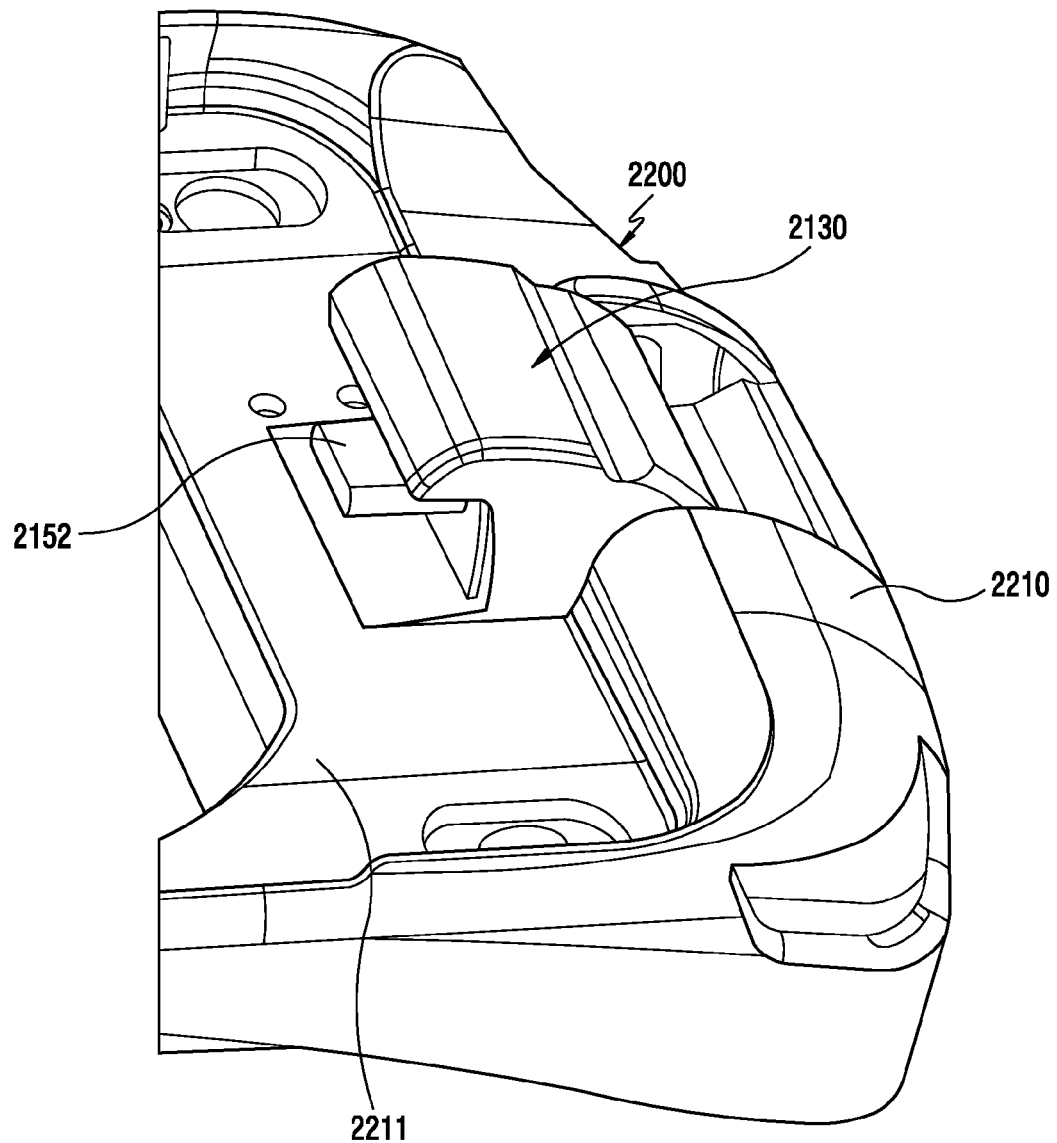
FIG. 22A and FIG. 22B illustrate when a holder assembly operates in a housing of an HMD according to one exemplary embodiment of the present disclosure.
Figure 22B:
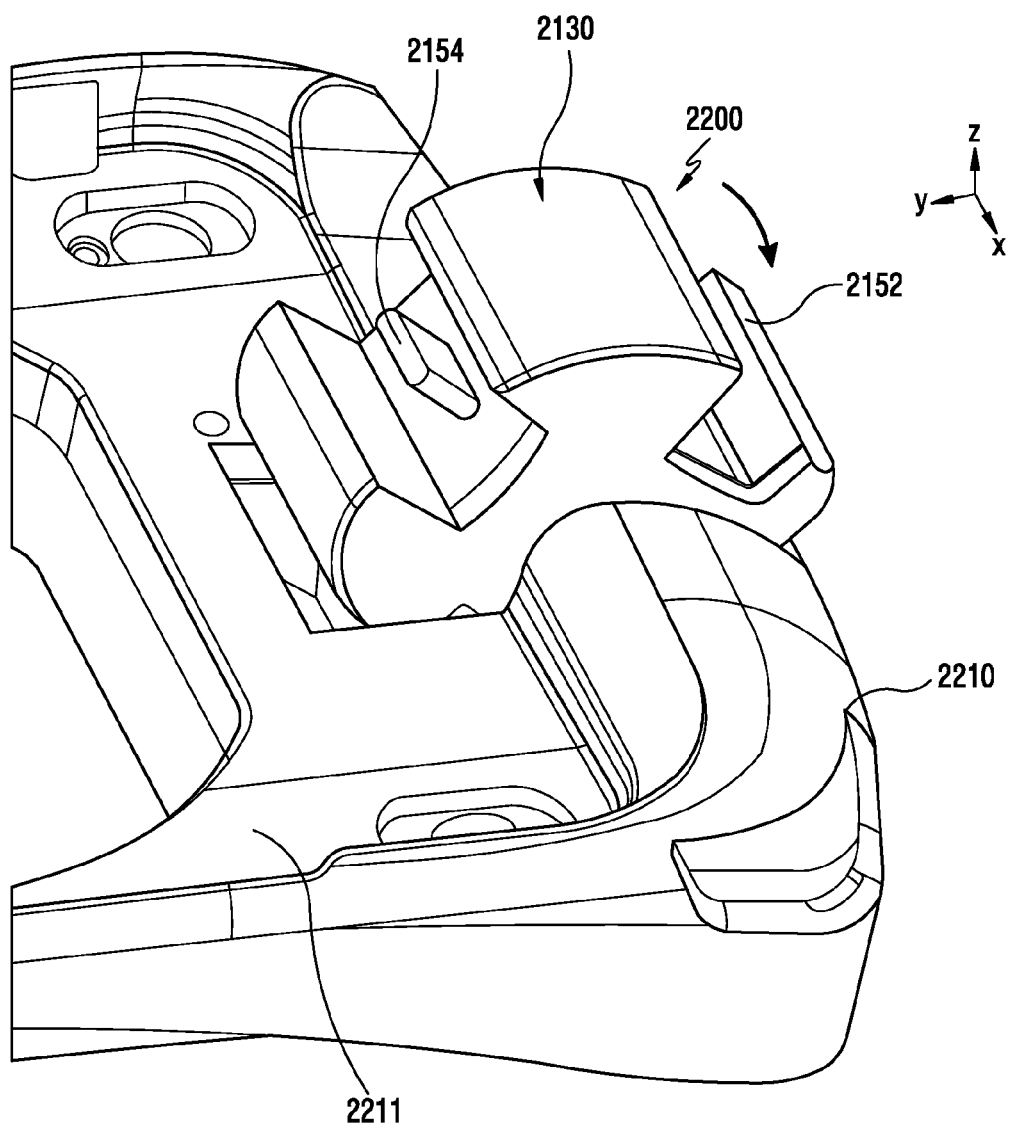
Figure 23:
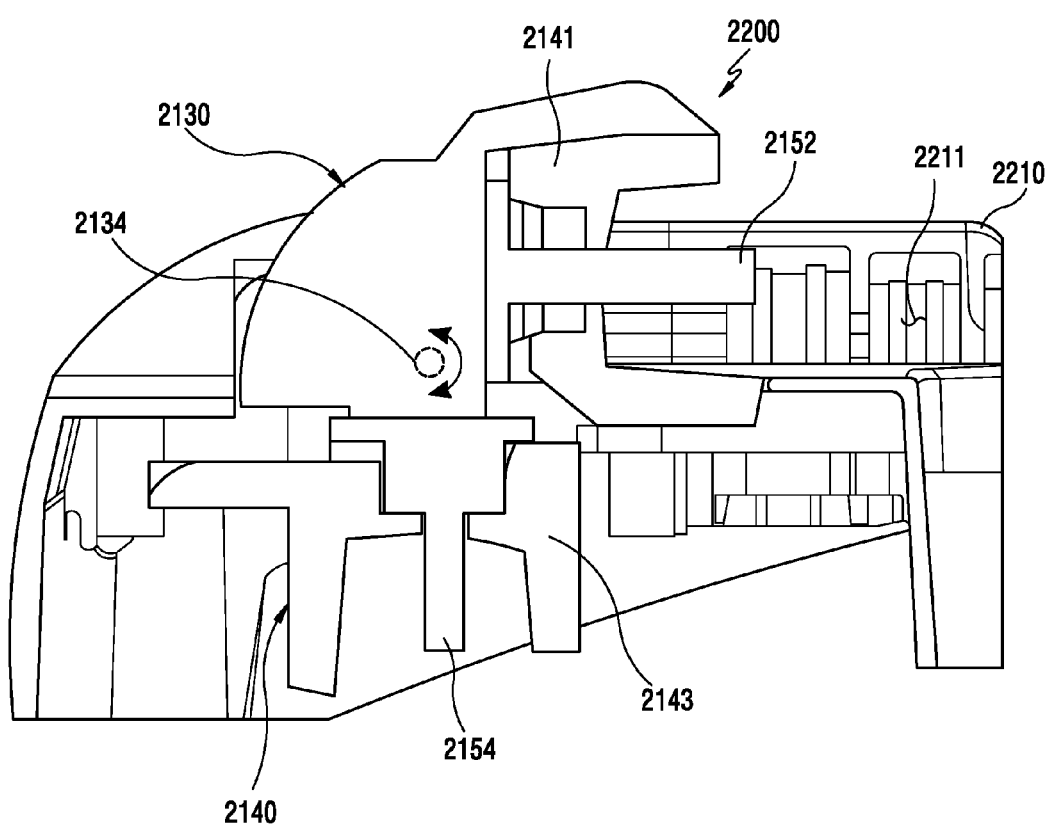
FIG. 23 is a cross-sectional view illustrating when a holder assembly is installed in a housing of an HMD according to one exemplary embodiment of the present disclosure.

FIG. 21 is an exploded perspective view of a rotatable holder assembly according to one exemplary embodiment of the present disclosure. FIG. 22A and FIG. 22B illustrate when a holder assembly operates in a housing of an HMD according to one exemplary embodiment of the present disclosure. FIG. 23 is a cross-sectional view illustrating when a holder assembly is installed in a housing of an HMD according to one exemplary embodiment of the present disclosure.

The aforementioned interface connector devices are illustrated and described with respect to a holder housing fixed to a housing and a plurality of gendered assemblies removably attached to the holder housing.

In an exemplary embodiment of the present disclosure, without an additional gendered assembly, at least one pair of connection profiles may be available because the holder assembly 2100 includes different connectors 2152 and 2154. Each connector may be deployed by selectively rotating the holder assembly 2100.

Referring to FIG. 21 to FIG. 23, an HMD 2200 may include a holder assembly 2100 rotatably disposed to a housing 2210 including a device mounting portion 2211 for accommodating an external electronic device. According to one exemplary embodiment, the holder assembly 2100 may include a support bracket 2110, a holder bracket 2120 slidably fixed at an upper portion of the support bracket 2110, a holder housing 2130 rotatably fixed to the holder bracket 2120 at one or more specific angles, a connector member 2150, and a connector bracket 2140 adapted to accommodate the plurality of connectors 2152 and 2154, and at least the two connectors 2152 and 2154 installed in the connector bracket 2140.

According to one exemplary embodiment, the support bracket 2110 may include a bracket mounting portion 2112 at the upper portion of a support bracket body 2111. According to one exemplary embodiment, as described above, a guide rail may be formed on the bracket mounting portion 2112. According to one exemplary embodiment, the holder bracket 2120 may be guided to slide in a Y axis/−Y axis direction into the upper portion of the support bracket 2110. According to one exemplary embodiment, the support bracket 2110 may be fixed to a housing of an HMD.

According to one exemplary embodiment, the holder bracket 2120 may include a holder bracket body 2121. According to one exemplary embodiment, the lower portion of the holder bracket 2120 may include a slider adapted to be guided by a guide rail of the support bracket 2110. According to one exemplary embodiment, one pair of hinge arms 2122 spaced apart at a specific interval may be formed on the upper portion of the holder bracket body 2121. The one pair of the hinge arms 2122 may be mounted to receive a hinge shaft 2134 protrusively formed at both side of the holder housing 2130. After mounting, the holder housing 2130 may rotate about the hinge arms 2122. According to one exemplary embodiment, a spring (e.g., a torsion spring) may be disposed between the hinge arm 2122 and the hinge shaft 2134, so that the holder housing 2130 rotates while a restoring force for restoring to an original position can be provided. According to one exemplary embodiment, the holder bracket 2120 may be slidably disposed to an upper portion of the support bracket 2110, so that a sliding distance is limited while the restoring force for restoring to the original position can be provided.

According to one exemplary embodiment, the holder housing 2130 may integrally have a first connector accommodating portion 2132 disposed on a front side of a holder housing body 2131 to receive a first support portion 2141 of the connector bracket 2140. The holder housing 2130 also integrally has a second connector accommodating portion 2133 disposed at a specific angle with respect to the first connector accommodating portion 2132 (e.g. 90 degrees from the first connector accommodating portion 2132), the second connector accommodating portion 2133 adapted to receive a second support portion 2143 of the connector bracket 2140. According to one exemplary embodiment, the holder housing 2130 may include one pair of the hinge shafts 2134 protrusively formed at both sides of the holder housing body 2131 and rotatably installed in the one pair of the hinge arms 2122 of the holder bracket 2120.

According to one exemplary embodiment, the connector bracket 2140 may include the first support portion 2141 fixed to the first connector accommodating portion 2132 of the holder housing 2130 and including a first connector protrusion hole 2142 for receiving the first connector 2152. The connector bracket 2140 may also include the second support portion 2143 fixed to a second connector accommodating portion 2133 of the holder housing 2130 and including a second connector protrusion hole 2144 for receiving the second connector 2154. According to one exemplary embodiment, the first support portion 2141 and the second support portion 2143 may be integrally formed.

According to one exemplary embodiment, the connector member 2150 may include a first support piece 2151 for supporting the first connector 2152 and a second support piece 2153 for supporting the second connector 2154. According to one exemplary embodiment, the first support piece 2151 may be fixed to the first support portion 2141 of the connector bracket 2140, and the second support piece 2153 may be fixed to the second support portion 2143 of the connector bracket 2140. According to one exemplary embodiment, the first support piece 2151 and the second support piece 2153 may be configured separately. However, the present disclosure is not limited thereto, and thus the first support piece 2151 and the second support piece 2153 may be integrally formed or may be electrically connected by a separate electrical connection member (e.g., an FPC).

According to one exemplary embodiment, the holder assembly 2100 may be configured such that the connector bracket 2140 on which the connector member 2150 is mounted is assembled to the holder housing 2130, and the holder housing 2130 to which the connector bracket 2140 is assembled is rotatably fixed to the holder bracket 2120 installed in the support bracket 2110. According to one exemplary embodiment, the first support piece 2151 of the connector member 2150 is mounted to the first support portion 2141 of the connector bracket 2140 in such a manner that the first connector 2152 protrudes from the first connector protrusion hole 2142. According to one exemplary embodiment, the second support piece 2153 of the connector member 2150 may be mounted to the second support portion 2143 of the connector bracket 2140 in such a manner that the second connector 2154 protrudes from the second connector protrusion hole 2144.

According to one exemplary embodiment, the holder assembly 2100 may be rotatable about the hinge shaft 2134 of the holder housing 2130 as a rotation axis (e.g., an X axis) around the device mounting portion 2211 of the housing 2210 of the HMD. According to one exemplary embodiment, the holder assembly 2100 may be fixed at a position in which the first connector 2152 protrudes outwardly in a direction of the device mounting portion 2211. According to one exemplary embodiment, the holder assembly 2100 may rotate in an arrow direction of FIG. 22B caused by a specific external pressure (e.g. a pressing input from a user), and a position thereof may be fixed such that the second connector 2154 located inside the housing 2210 protrudes outwardly in a direction of the device mounting portion 2211. According to one exemplary embodiment, the first connector 2152 may have a type-B USB connection profile and the second connector 2154 may have a C-type USB connection profile.

According to one exemplary embodiment, the holder housing 2130 and the connector bracket 2140 may be assembled by at least one screw. However, the present disclosure is not limited thereto, and thus the holder housing 2130 and the connector bracket 2140 may be assembled by processes such as ultrasonic welding, taping, or bonding.

According to one exemplary embodiment, the holder assembly 2100 may include a rotational position retainer, and the rotational location of the holder assembly 2100 may be fixed by using the rotational position retainer. According to one exemplary embodiment, the rotational position retainer may include a protrusion and a recess or the like formed between the holder housing 2130 and the holder bracket 2140. According to one exemplary embodiment, the rotational position retainer may be a rotation restricting stopper applied within a rotational radius of the holder housing 2130 to fix a rotation position of the holder housing 2130.

Figure 24A:
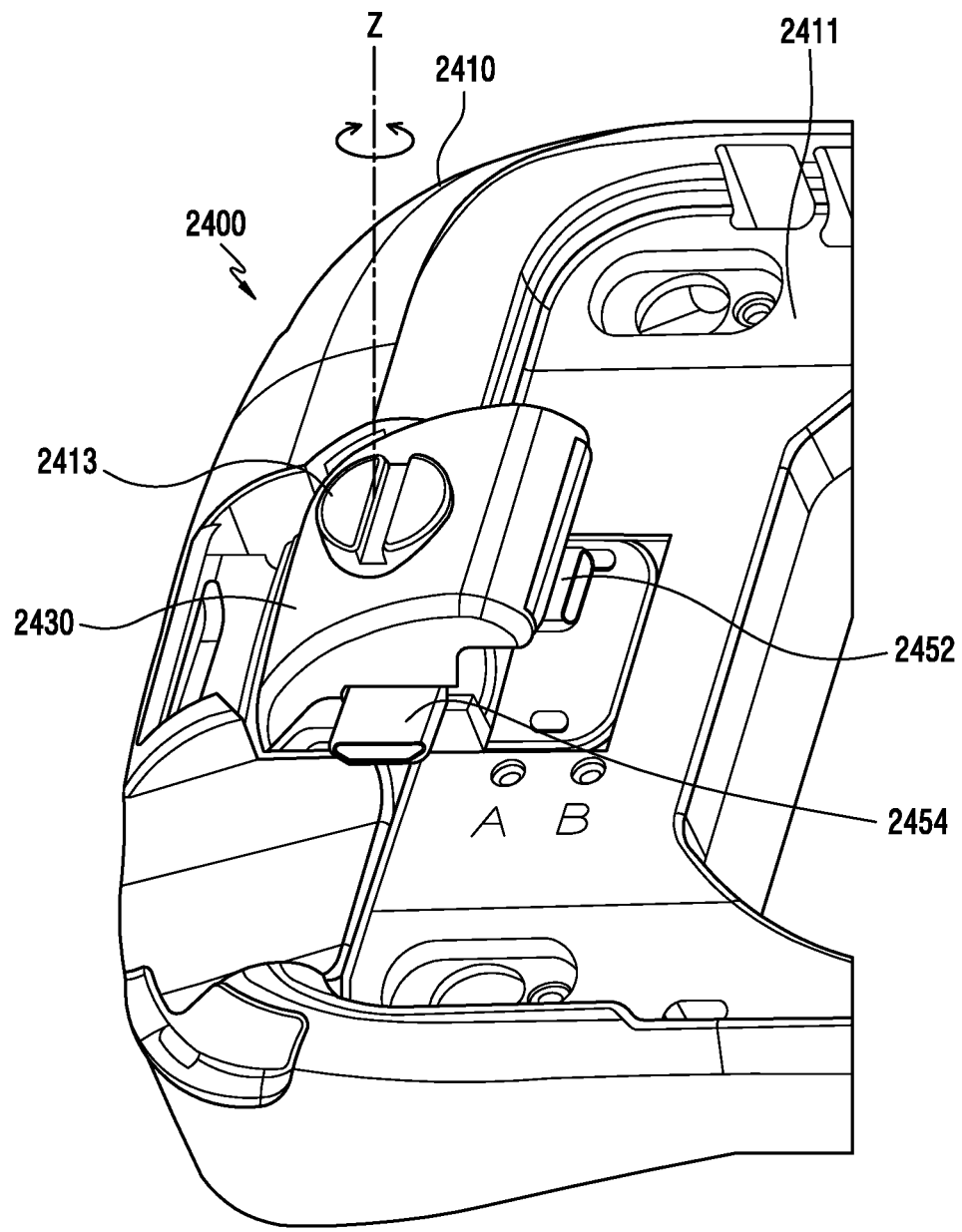
FIG. 24A and FIG. 24B are cross-sectional views illustrating when a holder assembly is installed in a housing of an HMD according to one exemplary embodiment of the present disclosure.
Figure 24B:
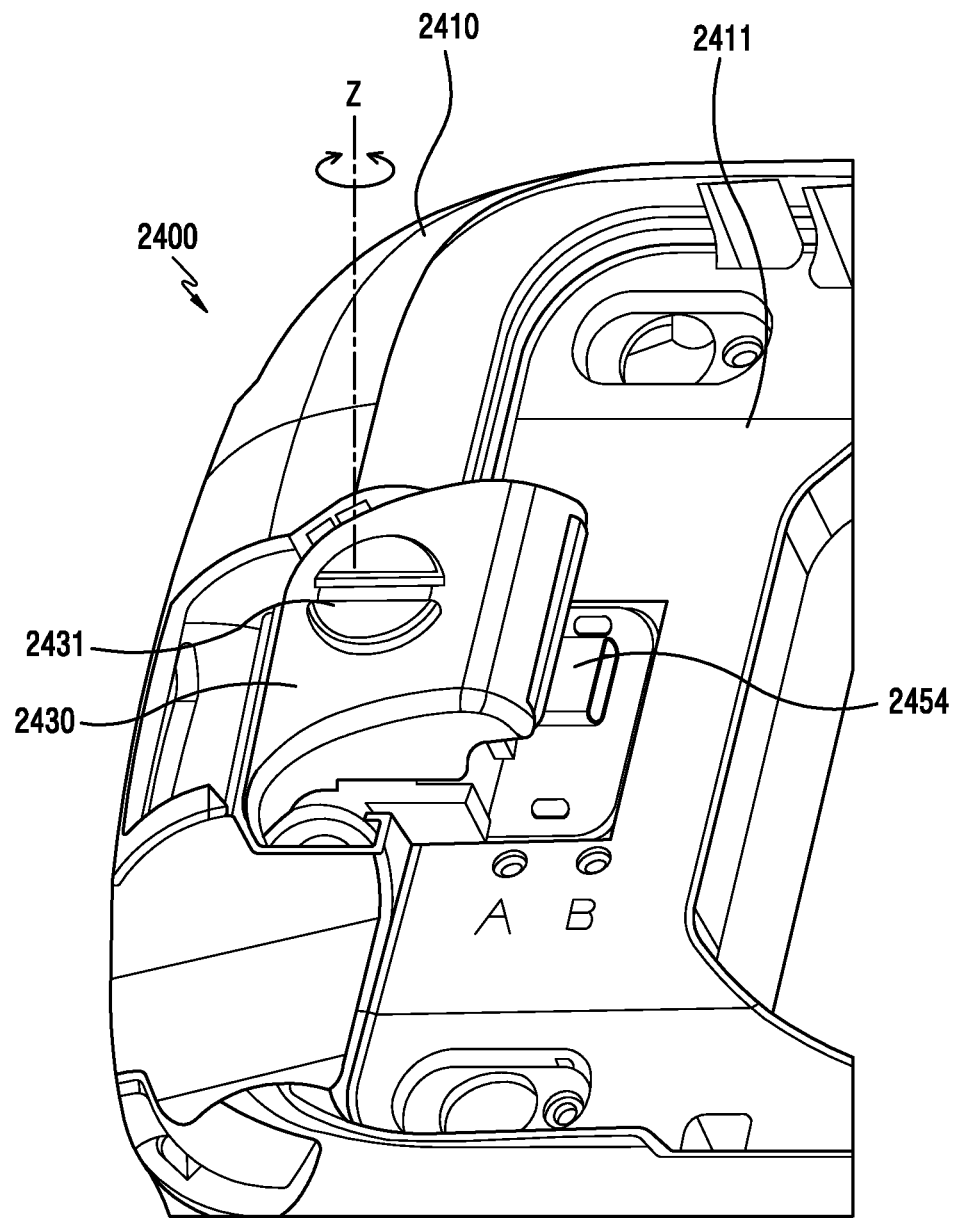

FIG. 24A and FIG. 24B are cross-sectional views illustrating when a holder assembly is installed in a housing of an HMD according to one exemplary embodiment of the present disclosure.

Referring to FIG. 24A and FIG. 24B, an HMD 2400 may include a holder assembly 2430 rotatably disposed in a housing 2410 including a device mounting portion 2411 for accommodating an external electronic device.

According to one exemplary embodiment, the holder assembly 2430 may have one pair of connectors 2452 and 2454 having different connection profiles and disposed at different positions. According to one exemplary embodiment, although not shown, one pair of the connectors 2452 and 2454 may be fixed at different positions on a bracket (not shown). According to one exemplary embodiment, the bracket may be mounted rotatably about the Z axis as a rotation axis. According to one exemplary embodiment, a rotary knob 2413 may be fixed to a top portion of the bracket, and at least one portion of the rotary knob 2431 may be exposed to the outside of the holder assembly 2430, to allow for user manipulation. According to one exemplary embodiment, the connectors 2452 and 2454 having different connection profiles may selectively protrude in a direction of the device mounting portion 2411 from the holder assembly 2430 due to the rotation of the rotary knob 2431. According to one exemplary embodiment, one pair of the connectors 2452 and 2454 may include the first connector 2452 and the second connector 2454 having different connection profiles from the first connector 2452. According to one exemplary embodiment, the first connector 2452 may have a type-B USB connection profile, and the second connector 2454 may have a C-type USB connection profile. However, the present disclosure is not limited thereto, and thus connectors having two or more different connection profiles may also be disposed to the bracket According to various exemplary embodiment, FIG. 24A illustrates a state where the first connector 2452 is exposed in the direction of the device mount portion 2411. According to one exemplary embodiment, when the rotary knob 2431 rotates clockwise or counterclockwise by a specific angle (e.g., 90 degrees), as shown in the state of FIG. 24B, the second connector 2454 may be exposed in the direction of the device mounting portion 2411.

According to one exemplary embodiment, a user may select and use a connector corresponding to a connection profile of a connector port of an external electronic device electrically connected to the HMD 2400 by performing only an operation of rotating the knob 2431.

According to one exemplary embodiment, an electronic device including connector members corresponding to various connection profiles of an external electronic device may be provided to improve convenience in use.

According to one exemplary embodiment, there may be provided a head mount device including a housing including a device mounting portion to mount an external electronic device on an upper side of the head mount device, a holder assembly rotatably installed at a periphery of the device mounting portion and comprising a protruding terminal, and at least two gendered connector assemblies each removably attachable to the holder assembly. The at least two gendered connector assemblies each comprising an exposure terminal adapted to be electrically connected to the protruding terminal and a locker to fix each gendered connector assembly to the holder assembly, the each gendered connector assembly has a connector corresponding to a different connection profile, and one gendered connector assembly among the at least two gendered connector assemblies is removably attached to the holder assembly based on the connector of the one gendered connector assembly corresponding to a connector port of the external electronic device mounted to the device mounting portion.

According to one exemplary embodiment, the head mount device may further include at least one guide rib formed on each gendered connector assembly and at least one guide slit formed on an area of the holder assembly corresponding to the at least one guide rib. When the one gendered connector assembly is removably attached to the holder assembly, the at least one guide rib is guided to be inserted into the at least one guide slit.

According to one exemplary embodiment, the each gendered connector assembly may further include a gendered housing. The locker may include a locker body received in the gendered housing, a hooking piece extended from the locker body and adapted to protrude from the gendered housing, and a lever connected to the hooking piece. When a force is applied to the lever causing a movement of the lever, the movement of the lever in turn causes a protrusion or a retraction of the hooking piece.

According to one exemplary embodiment, the holder assembly may include a holder housing. The holder housing may include a hooking groove adapted to receive the hooking piece of the locker.

According to one exemplary embodiment, the locker may include a pair of tension ribs, the pair of tension ribs includes two hooking protrusions protruding from a left side and a right side of the locker body, respectively. The gendered housing may further include a first and a second pair hooking grooves, the first and the second pair of hooking grooves each adapted to receive the two hooking protrusions, and the first pair of hooking grooves is located a predetermined distance away from the second pair of hooking grooves. Based on the force applied to the lever, when the two hooking protrusions are received in the first pair of hooking grooves, the hooking piece is protruded to lock a removable attachment of the one gendered connector assembly to the holder assembly, and when the two hooking protrusions are received in the second pair of hooking grooves, the hooking piece is retracted to release the one gendered connector assembly from the holder assembly.

According to one exemplary embodiment, the gendered housing may include an elastic member disposed between the locker body and the gendered housing.

According to one exemplary embodiment, a force from the elastic member may maintain the protrusion of the hooking piece.

According to one exemplary embodiment, during a mounting of the one gendered connector assembly to the holder assembly, the hooking piece is recessed into the gendered housing by a force exerted by a surface of the holder assembly.

According to one exemplary embodiment, the one gendered connector assembly may be mounted to the holder assembly in a first direction. The protruding terminal may be facing a second direction orthogonal to the first direction. And the exposure terminal may be facing a third direction opposite the second direction.

According to one exemplary embodiment, the exposure terminal may be disposed in a mounting surface of the each gendered connector assembly, and a lower end of the mounting surface may include a tapered inclined surface.

According to one exemplary embodiment, the one gendered connector assembly may be mounted to the holder assembly in a first direction. The protruding terminal may be facing a second direction opposite the first direction. And the exposure terminal may be facing the first direction.

According to one exemplary embodiment, the one gendered connector assembly may be detached from the holder assembly based at least in part on an elastic repulsive force of the protruding terminal.

According to one exemplary embodiment, the connection profile may include a B-type USB or a C-type USB.

According to one exemplary embodiment, there may be provided a head mount device including a housing including a device mounting portion to mount an external electronic device on an upper side of the head mount device, a holder assembly rotatably installed at a periphery of the device mounting portion, and including a protruding terminal and a locker, and at least two gendered connector assemblies each removably attachable to the holder assembly. The at least two gendered connector assemblies each comprising an exposure terminal adapted to be electrically connected to the protruding terminal, wherein the locker is adapted to fix each gendered connector assembly to the hold assembly, the each gendered connector assembly has a connector corresponding to a different connection profile, and one gendered connector assembly among the at least two gendered connector assemblies is removably attached to the holder assembly based on the connector of the one gendered connector assembly corresponding to a connector port of the external electronic device mounted to the device mounting portion.

According to one exemplary embodiment, the holder assembly may include a holder housing and a holder cover. The locker may include a locker body received in the holder housing, a hooking piece extended from the locker body and adapted to protrude from the holder housing to be received by a hooking groove formed at a corresponding position of the one gendered connector assembly, and a lever connected to the hooking piece, wherein when a force is applied to the lever causing a movement of the lever, the movement of the lever in turn causes a protrusion or a retraction of the hooking piece.

According to one exemplary embodiment, the one gendered connector assembly may be mounted to the holder assembly in a first direction. The protruding terminal may be facing a second direction opposite the first direction. And the exposure terminal may be facing the first direction.

According to one exemplary embodiment, the exposure terminal may be disposed in a mounting surface of the each gendered connector assembly, and the mounting surface includes a tapered inclined surface.

According to one exemplary embodiment, the one gendered connector assembly may be mounted to the holder assembly in a first direction. The protruding terminal may be facing a second direction orthogonal to the first direction. And the exposure terminal may be facing a third direction opposite the second direction.

According to one exemplary embodiment, the one gendered connector assembly may be detached from the holder assembly based at least in part on an elastic repulsive force of the protruding terminal.

According to one exemplary embodiment, there may be provided a head mount device including a housing including a device mounting portion to mount an external electronic device on an upper side of the head mount device, a holder assembly rotatably installed at a periphery of the device mounting portion and comprising a protruding terminal facing a first direction, and at least two gendered connector assemblies each removably attachable to the holder assembly in a second direction orthogonal to the first direction. The at least two gendered connector assemblies each includes an exposure terminal adapted to be electrically connected to the protruding terminal and disposed in a third direction facing the first direction, and a locker to fix each gendered connector assembly to the holder assembly. The each gendered connector assembly has a connector corresponding to a different connection profile, the each gendered connector assembly further includes a gendered housing. The locker includes a locker body received in the gendered housing, a hooking piece extended from the locker body and adapted to protrude from the gendered assembly, and a lever connected to the hooking piece, wherein when a force is applied to the lever causing a movement of the lever, the movement of the lever in turn causes a protrusion or a retraction of the hooking piece. The exposure terminal is disposed in a mounting surface of the each gendered connector assembly, and the mounting surface includes a tapered inclined surface, and one gendered connector assembly among the at least two gendered connector assemblies is removably attached to the holder assembly based on the connector of the one gendered connector assembly corresponding to a connector port of the external electronic device mounted to the device mounting portion.

According to one exemplary embodiment, there may be provided a head mount device including a housing include a device mounting portion to mount an external electronic device on an upper side of the head mount device and a holder assembly rotatably installed at a periphery of the device mounting portion and comprising at least two protruding connectors. Each protruding connector corresponding to a different connection profile and, by a rotation of the holder assembly, one protruding connector among the at least two protruding connectors is selected to be electrically connected to a connector port of the external electronic device mounted to the device mounting portion.

A term "module" used in the present disclosure may includes a unit consisting of hardware, software, or firmware, and may be interchangeably used with a term such as a unit, a logic, a logical block, a component, a circuit, and the like. The "module" may be an integrally constructed component or a minimum unit or one part thereof for performing one or more functions. The "module" may be mechanically or electrically implemented, and may include, for example, an Application-Specific Integrated Circuit (ASIC) chip, a Field-Programmable Gate Arrays (FPGAs), or a programmable-logic device, which is known or to be developed to perform certain operations. At least one part of an apparatus (e.g., modules or functions thereof) or method (e.g., operations) according to various exemplary embodiments may be implemented with an instruction stored in a computer-readable storage media (e.g., the memory). If the instruction is executed by one or more processors (e.g., the processor 310), the one or more processors may perform a function corresponding to the instruction. The computer-readable storage media may include a hard disk, a floppy disk, magnetic media (e.g., a magnetic tape), optical media (e.g., a Compact Disc-ROM (CD-ROM), a Digital Versatile Disc (DVD), magnetic-optic media (e.g., a floptical disk)), an internal memory, or the like. The instruction may include a code created by a compiler or a code executable by an interpreter. The module or programming module according to various exemplary embodiments may further include at least one or more constitutional elements among the aforementioned constitutional elements, or may omit some of them, or may further include additional other constitutional elements. According to various exemplary embodiments, operations performed by a module, programming module, or other constitutional elements may be executed in a sequential, parallel, repetitive, or heuristic manner. At least some of the operations may be executed in a different order or may be omitted, or other operations may be added.

While various exemplary embodiments of the present disclosure have been shown and described with reference to certain preferred embodiments thereof, it will be understood by those skilled in the art that various changes in form and details may be made therein without departing from the spirit and scope of the embodiments of the present disclosure as defined by the appended claims. Therefore, the scope of the various exemplary embodiments of the present disclosure is defined not by the detailed description of the various exemplary embodiments of the present disclosure but by the appended claims, and all differences within the scope will be construed as being included in the various exemplary embodiments of the present disclosure.

What is claimed is:

1. A head mount device comprising:
    a housing comprising a device mounting portion to mount an external electronic device on an upper side of the head mount device;
    a holder assembly rotatably installed at a periphery of the device mounting portion and comprising a protruding terminal; and
    at least two gendered connector assemblies each removably attachable to the holder assembly, the at least two gendered connector assemblies each comprising a gendered housing, an exposure terminal adapted to be electrically connected to the protruding terminal and a locker to fix each gendered connector assembly to the holder assembly,
    wherein the each gendered connector assembly has a connector corresponding to a different connection profile,
    wherein one gendered connector assembly among the at least two gendered connector assemblies is removably attached to the holder assembly based on the connector of the one gendered connector assembly corresponding to a connector port of the external electronic device mounted to the device mounting portion,
    wherein the locker comprises:
        a locker body mounted in the gendered housing,
        a pair of tension ribs, the pair of tension ribs includes two hooking protrusions protruding from a left side and a right side of the locker body, respectively, and
    wherein the gendered housing includes a first and a second pair hooking grooves, the first and the second pair of hooking grooves each adapted to receive the two hooking protrusions, and the first pair of hooking grooves is located a predetermined distance away from the second pair of hooking grooves.

2. The head mount device of claim 1, further comprising:
at least one guide rib formed on each gendered connector assembly; and
at least one guide slit formed on an area of the holder assembly corresponding to the at least one guide rib,
wherein when the one gendered connector assembly is removably attached to the holder assembly, the at least one guide rib is guided to be inserted into the at least one guide slit.

3. The head mount device of claim 1, wherein the locker further comprises:
a hooking piece extended from the locker body and adapted to protrude from the gendered housing; and
a lever connected to the hooking piece, wherein when a force is applied to the lever causing a movement of the lever, the movement of the lever in turn causes a protrusion or a retraction of the hooking piece.

4. The head mount device of claim 3,
wherein the holder assembly includes a holder housing, and
wherein the holder housing includes a hooking groove adapted to receive the hooking piece of the locker.

5. The head mount device of claim 3,
wherein based on the force applied to the lever:
when the two hooking protrusions are received in the first pair of hooking grooves, the hooking piece is protruded to lock a removable attachment of the one gendered connector assembly to the holder assembly, and
when the two hooking protrusions are received in the second pair of hooking grooves, the hooking piece is retracted to release the one gendered connector assembly from the holder assembly.

6. The head mount device of claim 3, wherein during a mounting of the one gendered connector assembly to the holder assembly, the hooking piece is recessed into the gendered housing by a force exerted by a surface of the holder assembly.

7. The head mount device of claim 1,
wherein the one gendered connector assembly is mounted to the holder assembly in a first direction,
wherein the protruding terminal is facing a second direction orthogonal to the first direction, and
wherein the exposure terminal is facing a third direction opposite the second direction.

8. The head mount device of claim 1,
wherein the exposure terminal is disposed in a mounting surface of the each gendered connector assembly, and
wherein a lower end of the mounting surface includes a tapered inclined surface.

9. The head mount device of claim 1, wherein the one gendered connector assembly is detached from the holder assembly based at least in part on an elastic repulsive force of the protruding terminal.

10. The head mount device of claim 1, wherein the connection profile comprises a B-type USB or a C-type USB.

* * * * *